(12) United States Patent
Tzoufras et al.

(10) Patent No.: US 10,692,556 B2
(45) Date of Patent: Jun. 23, 2020

(54) DEFECT INJECTION STRUCTURE AND MECHANISM FOR MAGNETIC MEMORY

(71) Applicant: SPIN MEMORY, INC., Fremont, CA (US)

(72) Inventors: Michail Tzoufras, Sunnyvale, CA (US); Marcin Gajek, Berkeley, CA (US)

(73) Assignee: SPIN MEMORY, INC., Fremont, CA (US)

(*) Notice: Subject to any disclaimer, the term of this patent is extended or adjusted under 35 U.S.C. 154(b) by 0 days.

(21) Appl. No.: 16/147,257

(22) Filed: Sep. 28, 2018

(65) Prior Publication Data
US 2020/0105325 A1 Apr. 2, 2020

(51) Int. Cl.
*G11C 11/00* (2006.01)
*G11C 11/16* (2006.01)
(Continued)

(52) U.S. Cl.
CPC ........ *G11C 11/161* (2013.01); *G11C 11/1673* (2013.01); *G11C 11/18* (2013.01); *G11C 19/0841* (2013.01); *H01L 27/228* (2013.01); *H01L 43/04* (2013.01); *H01L 43/06* (2013.01); *H01F 10/329* (2013.01); *H01F 10/3254* (2013.01); *H01F 10/3286* (2013.01); *H01L 43/10* (2013.01)

(58) Field of Classification Search
CPC ... G11C 11/161; G11C 11/1673; G11C 11/18; G11C 19/0841; H01L 27/228; H01L 42/04; H01L 43/06; H01F 10/3254
See application file for complete search history.

(56) References Cited

U.S. PATENT DOCUMENTS 4,910,709 A 3/1990 Dhong et al.
5,308,782 A 5/1994 Mazure et al.
(Continued)

OTHER PUBLICATIONS

Beleggia et al., "Phase Diagram for Magnetic Nano-Rings, May 27, 2005, Journal of Magnetism and Magnetic Materials," 16 pgs.
(Continued)

*Primary Examiner* — Gene N Auduong
(74) *Attorney, Agent, or Firm* — Morgan, Lewis & Bockius LLP

(57) ABSTRACT

The various implementations described herein include magnetic memory devices and systems, and methods for injecting defects into the devices and systems. In one aspect, a magnetic memory device comprises a non-magnetic cylindrical core, a first portion, and a second portion. The core is configured to receive a current. The first portion surrounds the core and is configured to introduce magnetic instabilities into the second portion. The second portion is adjacent to and arranged in a stack with respect to the first portion. The second portion also surrounds the core and is configured to store information based on a respective position of the magnetic instabilities. The second portion comprises a first plurality of magnetic layers and a first plurality of non-magnetic layers. Respective magnetic layers of the first plurality of magnetic layers are separated by respective non-magnetic layers of the plurality of non-magnetic layers.

20 Claims, 51 Drawing Sheets
(9 of 51 Drawing Sheet(s) Filed in Color)

(51) Int. Cl.
  *H01L 43/04* (2006.01)
  *H01L 43/06* (2006.01)
  *H01L 27/22* (2006.01)
  *G11C 11/18* (2006.01)
  *G11C 19/08* (2006.01)
  *H01F 10/32* (2006.01)
  *H01L 43/10* (2006.01)

(56) References Cited

U.S. PATENT DOCUMENTS

| | | |
|---|---|---|
| 5,656,842 A | 8/1997 | Iwamatsu et al. |
| 5,717,373 A | 2/1998 | Vachris |
| 6,621,730 B1 | 9/2003 | Lage |
| 6,829,161 B2 | 12/2004 | Huai et al. |
| 6,909,631 B2 | 6/2005 | Durlam et al. |
| 7,067,866 B2 | 6/2006 | Shi |
| 7,166,881 B2 | 1/2007 | Lin et al. |
| 7,224,601 B2 | 5/2007 | Panchula |
| 7,248,498 B2 | 7/2007 | Nazarian |
| 7,577,019 B2 | 8/2009 | Hung et al. |
| 7,800,938 B2 | 9/2010 | Rivkin et al. |
| 7,826,260 B2 | 11/2010 | Zhu et al. |
| 7,872,905 B2 | 1/2011 | Florez Marino et al. |
| 7,881,099 B2 | 2/2011 | Lim |
| 7,936,597 B2 | 5/2011 | Clinton et al. |
| 8,008,706 B2 | 8/2011 | Choi et al. |
| 8,077,509 B2 | 12/2011 | Yanagi et al. |
| 8,107,280 B2 | 1/2012 | Yoon et al. |
| 8,179,711 B2 | 5/2012 | Kim et al. |
| 8,194,361 B2 | 6/2012 | Kudo et al. |
| 8,199,553 B2 | 6/2012 | Chen et al. |
| 8,203,389 B1 | 6/2012 | Zhou et al. |
| 8,345,474 B2 | 1/2013 | Oh et al. |
| 8,353,568 B2 | 1/2013 | Lee |
| 8,416,539 B2 | 4/2013 | Carey et al. |
| 8,421,440 B2 | 4/2013 | Oksanen et al. |
| 8,508,973 B2 | 8/2013 | Jin et al. |
| 8,582,240 B1 | 11/2013 | Chen et al. |
| 8,587,993 B2 | 11/2013 | Lee et al. |
| 8,625,337 B2 | 1/2014 | Wu et al. |
| 8,633,720 B2 | 1/2014 | Tudosa et al. |
| 8,724,380 B1 | 5/2014 | Zhou et al. |
| 8,817,546 B2 | 8/2014 | Wang |
| 9,110,746 B2 | 8/2015 | Zhu et al. |
| 9,142,277 B2 | 9/2015 | Kim et al. |
| 9,166,147 B2 | 10/2015 | Carman et al. |
| 9,208,878 B2 | 12/2015 | Iyer et al. |
| 9,230,571 B1 | 1/2016 | Chen et al. |
| 9,236,416 B2 | 1/2016 | Shukh |
| 9,240,799 B1 | 1/2016 | Wang et al. |
| 9,337,415 B1 | 5/2016 | Oh et al. |
| 9,362,336 B2 | 6/2016 | Lu |
| 9,443,905 B1 | 9/2016 | Bandic et al. |
| 9,444,036 B1 | 9/2016 | Franca-Neto |
| 9,460,769 B2 | 10/2016 | Nozaki et al. |
| 9,461,094 B2 | 10/2016 | Li et al. |
| 9,502,133 B2 | 11/2016 | Ueda et al. |
| 9,503,097 B2 | 11/2016 | Lee et al. |
| 9,525,126 B1 | 12/2016 | Lin |
| 9,543,505 B2 | 1/2017 | Park et al. |
| 9,595,917 B2 | 3/2017 | Kan et al. |
| 9,608,043 B2 | 3/2017 | Shimabukuro et al. |
| 9,634,237 B2 | 4/2017 | Lee et al. |
| 9,637,272 B2 | 5/2017 | Albaum |
| 9,660,183 B2 | 5/2017 | Wang et al. |
| 9,678,178 B2 | 6/2017 | Bai et al. |
| 9,734,882 B2 | 8/2017 | Toh et al. |
| 9,741,926 B1 | 8/2017 | Pinarbasi et al. |
| 9,766,705 B2 | 9/2017 | Chan et al. |
| 9,773,913 B1 | 9/2017 | Balakrishnan et al. |
| 9,799,383 B2 | 10/2017 | Hosotani et al. |
| 9,852,800 B2 | 12/2017 | Lang et al. |
| 9,853,206 B2 | 12/2017 | Pinarbasi et al. |
| 9,881,970 B2 | 1/2018 | Chung |
| 10,026,892 B2 | 7/2018 | Pinarbasi et al. |
| 10,109,367 B2 | 10/2018 | Raberg |
| 10,199,083 B1 | 2/2019 | Bozdag et al. |
| 10,236,047 B1 | 3/2019 | Ryan et al. |
| 10,236,048 B1 | 3/2019 | Tzoufras et al. |
| 10,255,962 B1 | 4/2019 | El Baraji et al. |
| 10,326,073 B1 * | 6/2019 | Tzoufras ............... H01L 43/14 |
| 10,347,308 B1 | 7/2019 | Bozdag et al. |
| 2003/0183889 A1 | 10/2003 | Kajiyama |
| 2004/0026307 A1 | 2/2004 | Tamura |
| 2004/0047204 A1 | 3/2004 | Hung et al. |
| 2005/0073878 A1 | 4/2005 | Lin et al. |
| 2005/0184348 A1 | 8/2005 | Youn et al. |
| 2005/0232006 A1 | 10/2005 | Iwata |
| 2006/0152969 A1 | 7/2006 | Trouilloud |
| 2007/0047294 A1 | 3/2007 | Panchula |
| 2007/0201265 A1 | 8/2007 | Ranjan et al. |
| 2007/0210338 A1 | 9/2007 | Orlowski |
| 2009/0032849 A1 | 2/2009 | Higashino |
| 2010/0003767 A1 | 1/2010 | Cho |
| 2010/0052029 A1 | 3/2010 | Huang |
| 2010/0102290 A1 | 4/2010 | Lu et al. |
| 2010/0187601 A1 | 7/2010 | Masuoka et al. |
| 2011/0062515 A1 | 3/2011 | Masuoka et al. |
| 2011/0089496 A1 | 4/2011 | Masuoka et al. |
| 2012/0155164 A1 | 6/2012 | Shukh |
| 2012/0217468 A1 | 8/2012 | Tekleab et al. |
| 2012/0313742 A1 | 12/2012 | Kurs et al. |
| 2013/0200467 A1 | 8/2013 | Edge et al. |
| 2013/0258763 A1 | 10/2013 | Ranjan et al. |
| 2014/0008606 A1 | 1/2014 | Hussain et al. |
| 2014/0050019 A1 | 2/2014 | Lee et al. |
| 2014/0103470 A1 | 4/2014 | Shukh |
| 2014/0151830 A1 | 6/2014 | Apalkov et al. |
| 2014/0151831 A1 | 6/2014 | Chen et al. |
| 2014/0170821 A1 | 6/2014 | Nyhus et al. |
| 2014/0175577 A1 | 6/2014 | Apalkov et al. |
| 2014/0264513 A1 | 9/2014 | De Brosse et al. |
| 2014/0264552 A1 | 9/2014 | Prabhakar et al. |
| 2015/0021675 A1 | 1/2015 | Min |
| 2015/0138873 A1 | 5/2015 | Lu et al. |
| 2015/0279904 A1 | 10/2015 | Pinarbasi et al. |
| 2015/0333254 A1 | 11/2015 | Liu et al. |
| 2016/0079361 A1 | 3/2016 | Ching et al. |
| 2016/0225818 A1 | 8/2016 | Toh et al. |
| 2016/0240533 A1 | 8/2016 | Oxland |
| 2016/0240542 A1 | 8/2016 | Kwon |
| 2016/0274198 A1 | 9/2016 | Naik et al. |
| 2016/0315249 A1 | 10/2016 | Kardasz et al. |
| 2016/0372656 A1 | 12/2016 | Pinarbasi et al. |
| 2017/0005106 A1 | 1/2017 | Zhang |
| 2017/0178705 A1 | 6/2017 | Buhrman et al. |
| 2017/0317070 A1 | 11/2017 | Salcedo et al. |
| 2018/0075895 A1 | 3/2018 | Kishi et al. |
| 2018/0096896 A1 | 4/2018 | Zhu |
| 2018/0248110 A1 | 8/2018 | Kardasz et al. |
| 2018/0269210 A1 | 9/2018 | Tezuka et al. |
| 2018/0308534 A1 | 10/2018 | Gaudin et al. |
| 2019/0036013 A1 | 1/2019 | Mo et al. |
| 2019/0096957 A1 * | 3/2019 | Uchida .................. G01R 33/09 |
| 2019/0206465 A1 | 7/2019 | Bozdag et al. |
| 2019/0207094 A1 * | 7/2019 | Gajek ................... H01L 27/228 |
| 2019/0207102 A1 * | 7/2019 | Gajek ................... H01L 27/228 |
| 2019/0214431 A1 * | 7/2019 | Sharma ................. H01L 27/228 |
| 2019/0273202 A1 | 9/2019 | Nikitin et al. |
| 2019/0296223 A1 | 9/2019 | Araki |
| 2019/0311956 A1 * | 10/2019 | Sharma ............... H01L 29/0676 |

OTHER PUBLICATIONS

Bhatti et al., "Spintronics based random access memory: a review," Materials Today, vol. 20, No. 9, 530-548, Nov. 2017, from http://dx.doi.org/10.1016/j.mattod.2017.07.007, 19 pgs.

Chen et al., "On-Chip Caches Built on Multilevel Spin-Transfer Torque Ram Cells and Its Optimizations," ACMJournal on Emerging Technologies in Computing Systems, vol. 9, No. 2, Article 16, May 2013, 22 pgs.

Chen et al., "Processor Caches Built Using Multi-Level Spin-Transfer Torque RAM Cells," 6/11 ©2011 IEEE, 6 pgs.

(56) References Cited

OTHER PUBLICATIONS

Dyakonov, M. I., "Spin Hall Effect," arXiv:1210.3200v1 (2010), from https://arxiv.org/ftp/arxiv/papers/1210/1210.3200.pdf, 12 pgs.
Eitan et al., "NROM: A Novel Localized Trapping, 2-Bit Nonvolatile Memory Cell," IEEE Electron Device Letters, vol. 21, No. 11, Nov. 2000, 3 pgs.
Fernandez-Pacheco et al., "Three-dimensional nanomagnetism," Nat. Comm. 8, 15756 (2017).
Jiang et al., "Constructing Large and Fast Multi-Level Cell STT-RAM based Cache for Embedded Processors," DAC 20125, Jun. 3-7, 2012, San Francisco, California, 6 pgs.
Laczkowski et al., "Large enhancement of the spin Hall effect in Au by side-jump scattering on Ta impurities," Phys. Rev. B 96, 140405(R) (2017).
Lavrijsen et al., "Magnetic ratchet for three-dimensional spintronic memory and logic," Nature 493, pp. 647-650 (2013).
Lavrijsen et al., "Multi-bit operations in vertical spintronic shift registers," Nanotechnology 25, 105201 (2014).
Lavrijsen et al., "Tuning the interlayer exchange coupling between single perpendicularly magnetized CoFeB layers," Appl. Phys. Lett. 100, 052411 (2012).
Lee et al., "Domain Imaging During Soliton Propagation in a 3D Magentic Ratchet," Spin 3(4), 1340013 (2013).
Lee et al., "Soliton propagation in micron-sized magnetic ratchet elements," Appl. Phys. Lett. 104, 232404 (2014).
Li Gao, "Spin Polarized Current Phenomena in Magnetic Tunnel Junctions," Ph.D. Dissertation, Stanford University, Sep. 2009, 126 pgs.
Li et al., A New Self-reference Sensing Scheme for TLC MRAM, 9/15 ©2015 IEEE, 4 pgs.
Mansell et al., "A magnetic shift register with out-of-plane magnetized layers," Nanotechnology 28, 385201 (2017).
Mansell et al., "A robust soliton ratchet using combined antiferromagnetic and ferromagnetic interlayer couplings," Appl. Phys. Lett. 106, 092404 (2015).
Parkin, "Systematic Variation of the Strength and Oscillation Period of Indirect Magnetic Exchange Coupling through the 3d, 4d, and 5d Transition Metals," Phys. Rev. Lett. 67(25), pp. 3598-3601 (1991).
Petit et al., "Systematic layer-by-layer characterization of multilayers for three-dimensional data storage and logic," Nanotechnology 27, 155203 (2016).
Sbiaa et al., "Materials with perpendicular magnetic anisotropy for magnetic random access memory," Phys. Status Solidi RRL 5, No. 12, 413-419 (2011) / DOI: 10.1002/pssr.201105420, 7 pgs.
Van den Brink et al., "Spin-Hall-assisted magnetic random access memory," Applied Physics Letters, 104, 012403 (2014), 4 pgs.
Vincent et al., "Spin-Transfer Torque Magnetic Memory as a Stochastic Memristive Synapse for Neuromorphic Systems," IEEE Transactions on Biomedical Circuits and Systems, vol. 9, No. 2, Apr. 2015, 9 pgs.
Wang et al., "Spintronic materials and devices based on antiferromagnetic metals," Progress in Natural Science: Materials International, Oct. 23, 2016, 27 (2017) 208-216, 9 pgs.
Yuen et al., "A 2-Bit MONOS Nonvolatile Memory Cell Based on Asymmetric Double Gate MOSFET Structure," IEEE Electron Device Letters, vol. 24, No. 8, Aug. 2003, 3 pgs.
Zhang et al., "MLC STT-RAM Design Considering Probabilistic and Asymmetric MTJ Switching," 3/13 ©2013 IEEE, 4 pgs.
Zhang et al., Multi-level Cell STT-RAM: Is it Realistic or Just a Dream?, IEEE/ACM International Conference on Computer-Aided Design, Nov. 5-8, 2012, San Jose, California, 8 pgs.
Tzoufras, Office Action dated Sep. 27, 2018, U.S. Appl. No. 15/859,157, 14 pgs.
Tzoufras, Office Action dated Nov. 9, 2018, U.S. Appl. No. 15/858,808, 8 pgs.
Bozdag, Office Action dated Jul. 18, 2018, U.S. Appl. No. 15/859,259, 15pgs.
Bozdag, Final Office Action dated Dec. 3, 2018, U.S. Appl. No. 15/859,259, 14 pgs.
Bozdag, Notice of allowance dated Feb. 13, 2019, U.S. Appl. No. 15/859,259, 9 pgs.
Bozdag, Office Action, U.S. Appl. No. 15/859,256, dated Jan. 22, 2019, 12 pgs.
Bozdag, Notice of Allowance, U.S. Appl. No. 15/859,256, dated Apr. 24, 2019, 9 pgs.
Bozdag, Office Action, U.S. Appl. No. 15/859,250, dated Feb. 1, 2019, 12 pgs.
Bozdag, Notice of Allowance, U.S. Appl. No. 15/859,250, dated Apr. 25, 2019, 9 pgs.
Kim, Office Action dated Sep. 17, 2018, U.S. Appl. No. 15/865,125, 10 pgs.
Kim, Notice of Allowance dated Jan. 25, 2019, U.S. Appl. No. 15/865,125, 5 pgs.
Kim, Office Action dated Nov. 28, 2018, U.S. Appl. No. 15/865,144, 9 pgs.
Sharma, Notice of Allowance dated Sep. 13, 2018, U.S. Appl. No. 15/865,138, 17 pgs.
Sharma, Notice of Allowance dated Sep. 25, 2018, U.S. Appl. No. 15/865,140, 10pgs.
Sharma, Notice of Allowance dated Sep. 26, 2018, U.S. Appl. No. 15/865,132, 11 pgs.
Sharma, Notice of Allowance dated Sep. 24, 2018, U.S. Appl. No. 15/865,123, 11 pgs.

* cited by examiner (Parallel Configuration)

(Anti-Parallel Configuration)

Soliton Ratchet 2: A SAF Multi-layer with Defects

Soliton Ratchet 2: A SAF Multi-layer with Defects

First Ground State  Second Ground State

Example:
$J_{FM}$ = 300 Oe
$J_{AF1}$ = 500 Oe nm
$J_{AF2}$ = 200 Oe nm
$H_C$ = 900 Oe

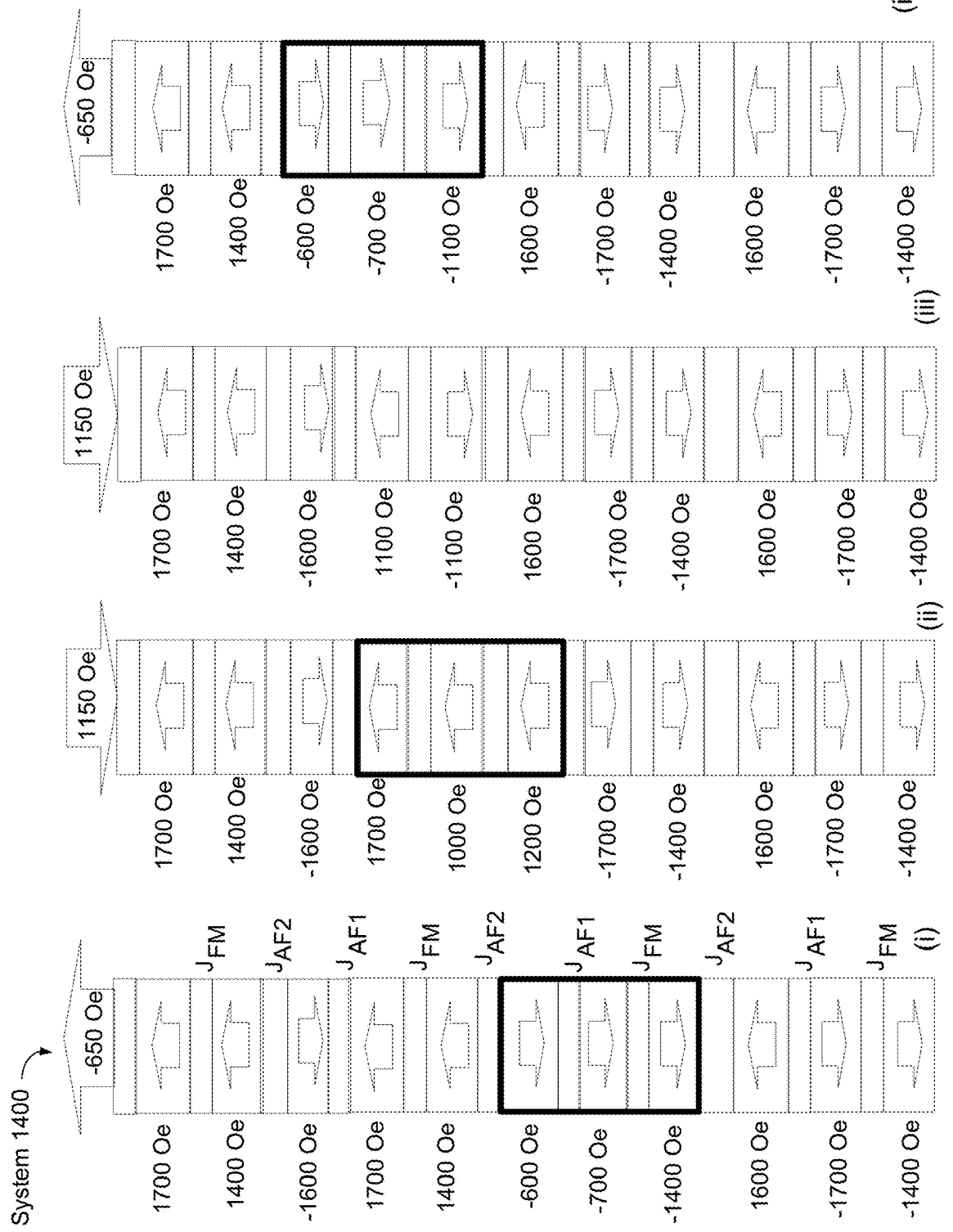

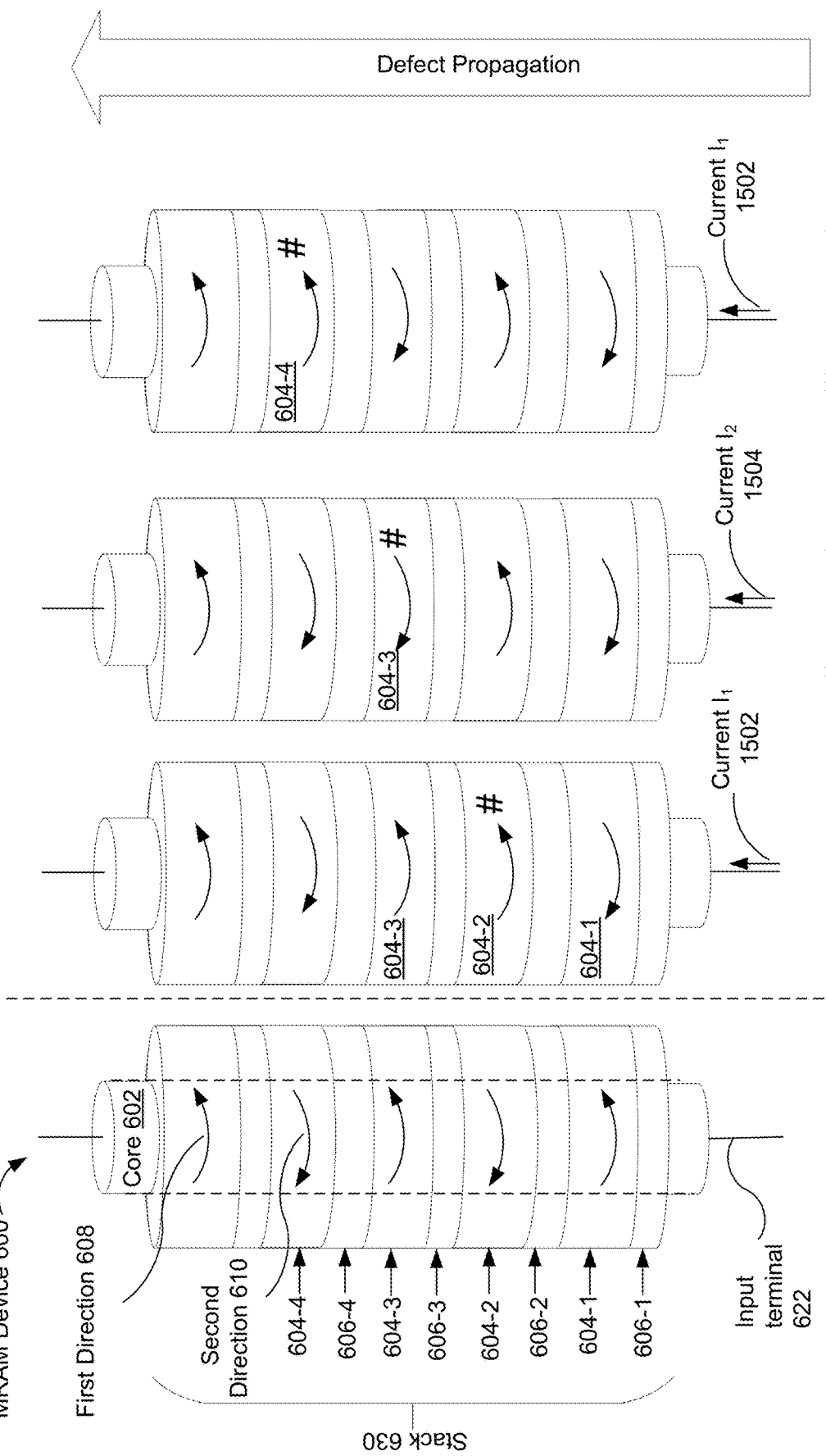

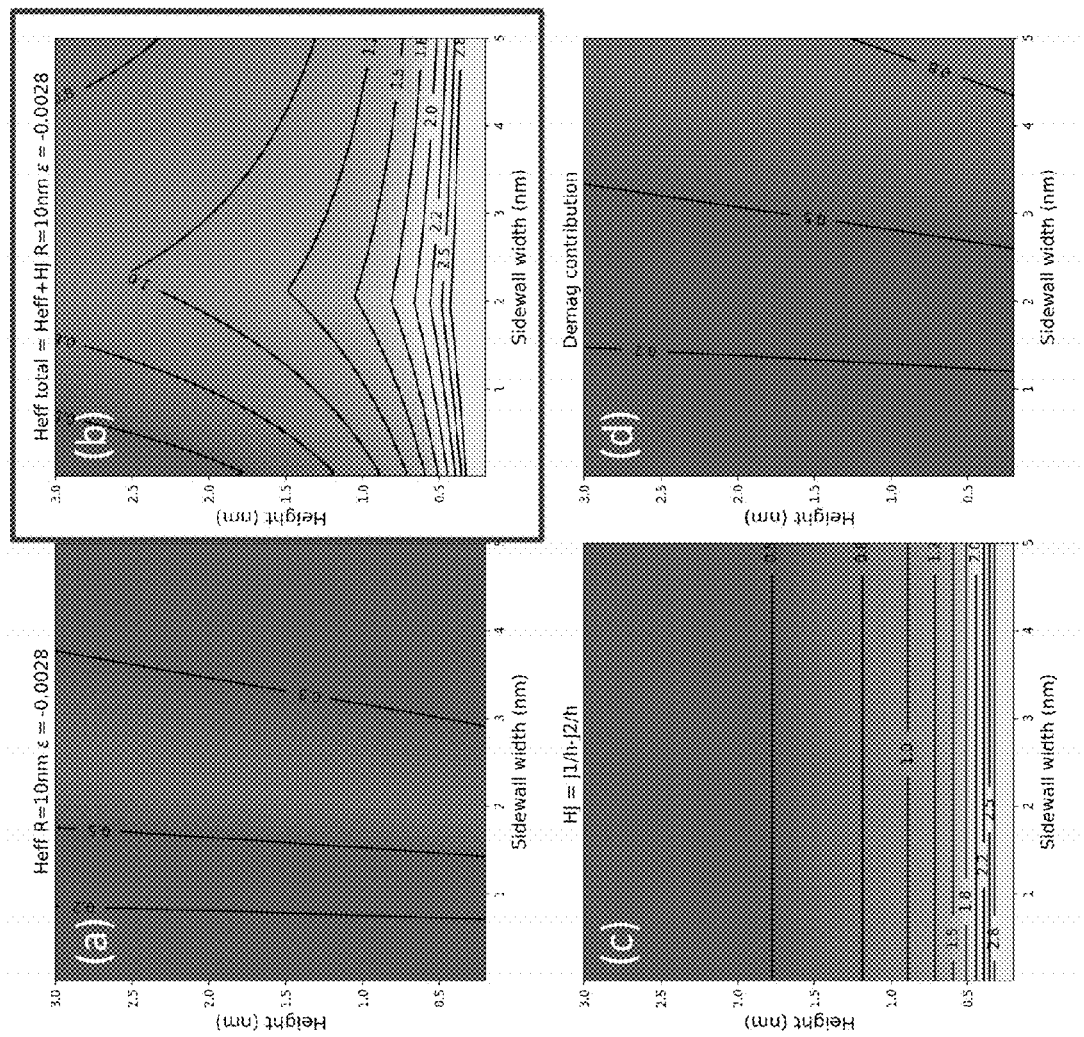
Figure 19. Corresponding Effective Fields (in Tesla) for a 20nm-wide MRAM device / ratchet structure. (a) Effective field without coupling. (b) effective field including the coupling (c) effective field corresponding to the coupling alone. (d) estimate of the demagnetization field used in the calculation of the switching currents.

References on values on RKKY coupling and Spin Hall Effect (SHE) angle and resistivity

References on values on RKKY coupling and SHE angle and resistivity

Table 2.2. Comparison between the oscillation periods predicted by the RKKY theory [2.87] for noble metals and those observed experimentally

| Theory | | Experiment | | | |
|---|---|---|---|---|---|
| Spacer | Period(s) | System | Period(s) | | Ref |
| Cu(111) | $\Lambda \approx 4.5$ ML | Co/Cu/Co | $\Lambda \approx 6$ ML | | [2.73] |
| | | Co/Cu/Co | $\Lambda \approx 5$ ML | | [2.70] |
| | | Fe/Cu/Fe | $\Lambda \approx 6$ ML | | [2.55] |
| Cu(001) | $\{\Lambda_1 = 2.6$ ML, $\Lambda_2 = 5.9$ ML$\}$ | Co/Cu/Co | $\Lambda \approx 6$ ML | | [2.69] |
| | | Fe/Cu/Fe | $\Lambda \approx 2.5$ ML | | [2.68] |
| | | Co/Cu/Co | $\{\Lambda_1 = 2.6$ ML, $\Lambda_2 = 8$ ML$\}$ | | [2.77] |
| Au(001) | $\{\Lambda_1 = 2.6$ ML, $\Lambda_2 = 8.6$ ML$\}$ | Fe/Au/Fe | $\{\Lambda_1 = 2$ ML, $\Lambda_2 = 7-8$ ML$\}$ | | [2.76] |
| Ag(001) | $\{\Lambda_1 = 2.4$ ML, $\Lambda_2 = 5.6$ ML$\}$ | Fe/Ag/Fe | $\{\Lambda_1 = 2.4$ ML, $\Lambda_2 = 6$ ML$\}$ | | |
| bcc Cu(001)* | $\{\Lambda_1 = 2.2$ ML, $\Lambda_2 = 2.6$ ML$\}$ | Fe/Cu/Fe | $\Lambda \approx 2$ ML | | [2.77] |

* ASW calculation of the bulk Fermi surface of bcc Cu, from [2.77]

| Sample | Maximum strength $-J_1$ in mJ/m² (at spacer thickness in nm) | Periods in ML and (nm) |
|---|---|---|
| Co/Cu/Co (100) | 0.4 (1.2) | 2.6 (0.47); 8 (1.45) |
| Co/Cu/Co (110) | 0.7 (0.85) | 9.8 (1.25) |
| Co/Cu/Co (111) | 1.1 (0.85) | 5.5 (1.15) |
| Fe/Au/Fe (100) | 0.85 (0.82) | 2.5 (0.51); 8.6 (1.75) |
| Fe/Cr/Fe (100) | >1.5 (1.3) | 2.1 (0.3); 12 (1.73) |
| Fe/Mn/Fe (100) | 0.14 (1.32) | 2 (0.33) |
| Co/Ru(0001) | 6 (0.6) | 5.1 (1.1) |
| Co/Rh/Co (111) | 34 (0.48) | 2.7 (0.6) |

Figure 21 (PRIOR ART)

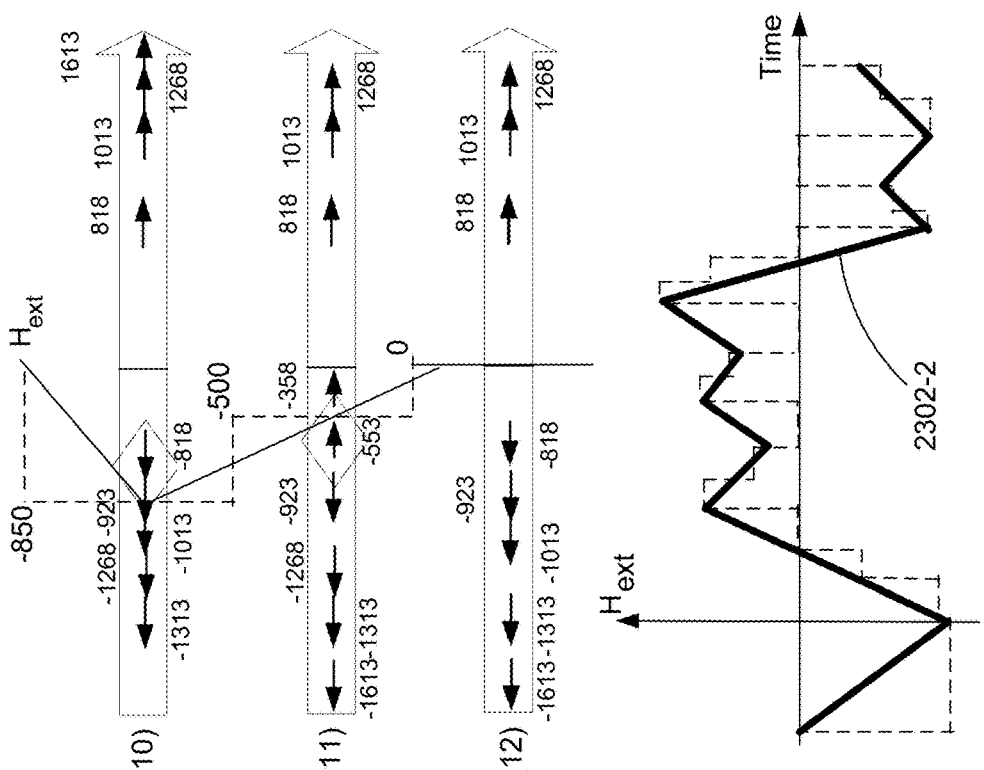
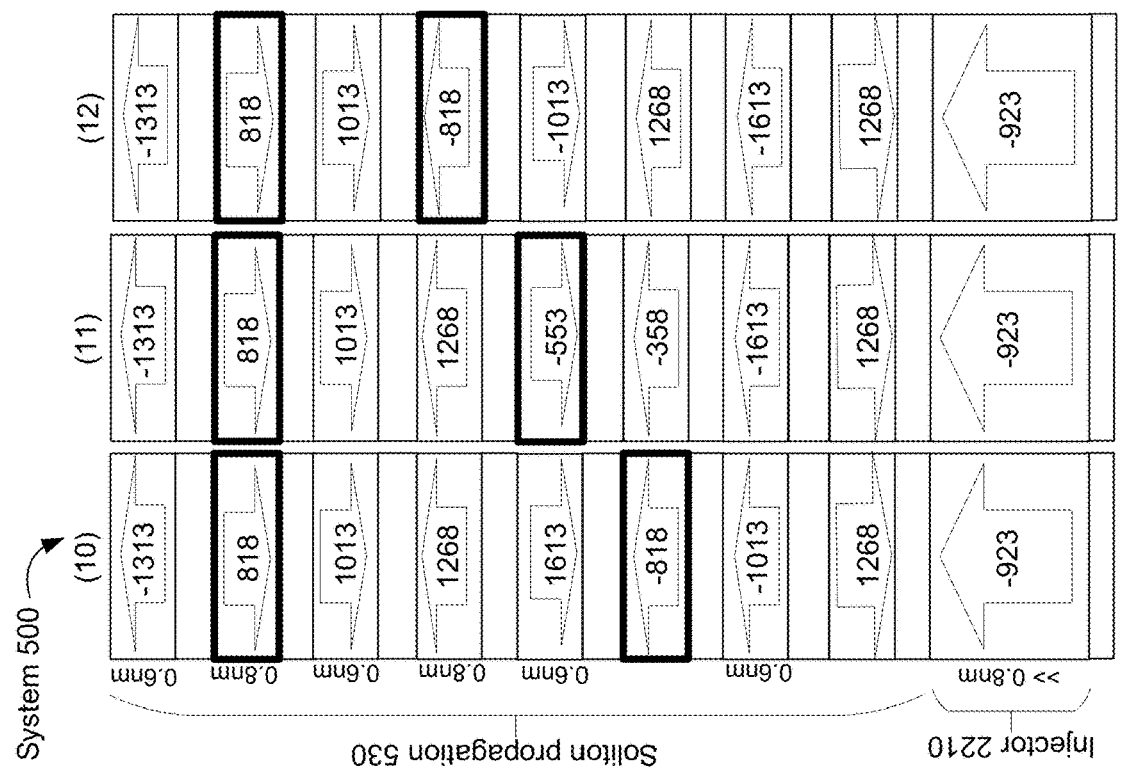
Figure 23B

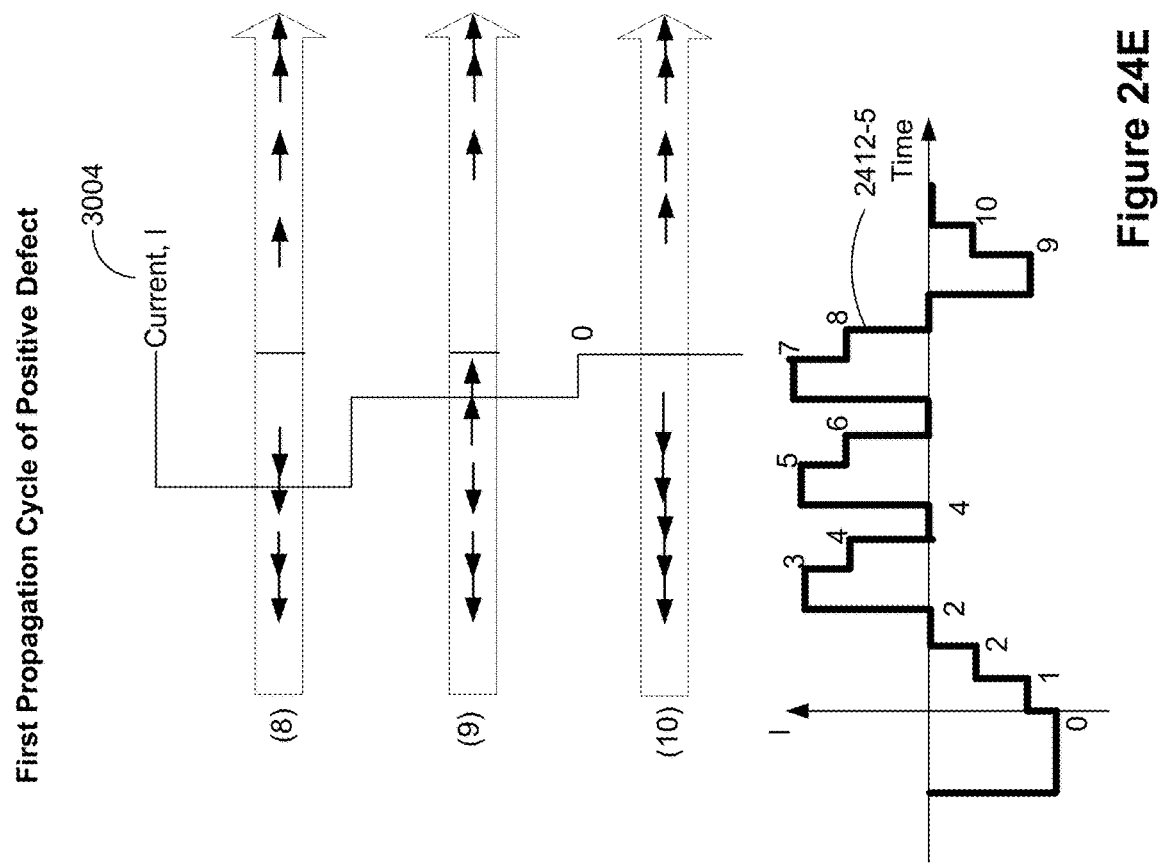
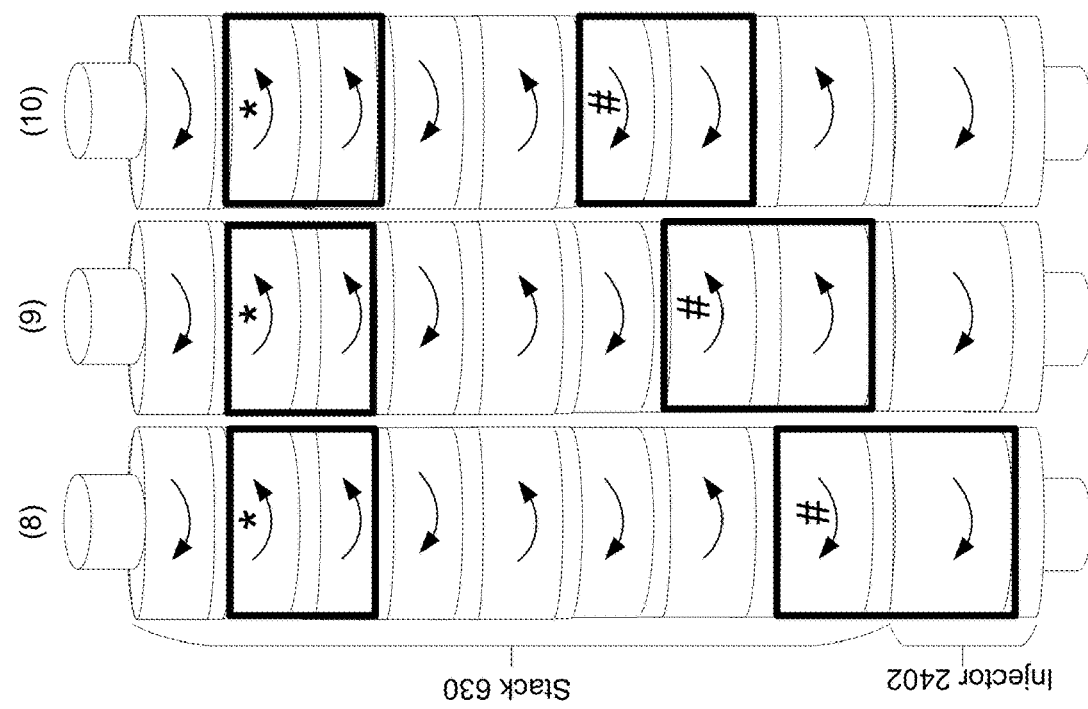
Figure 24E

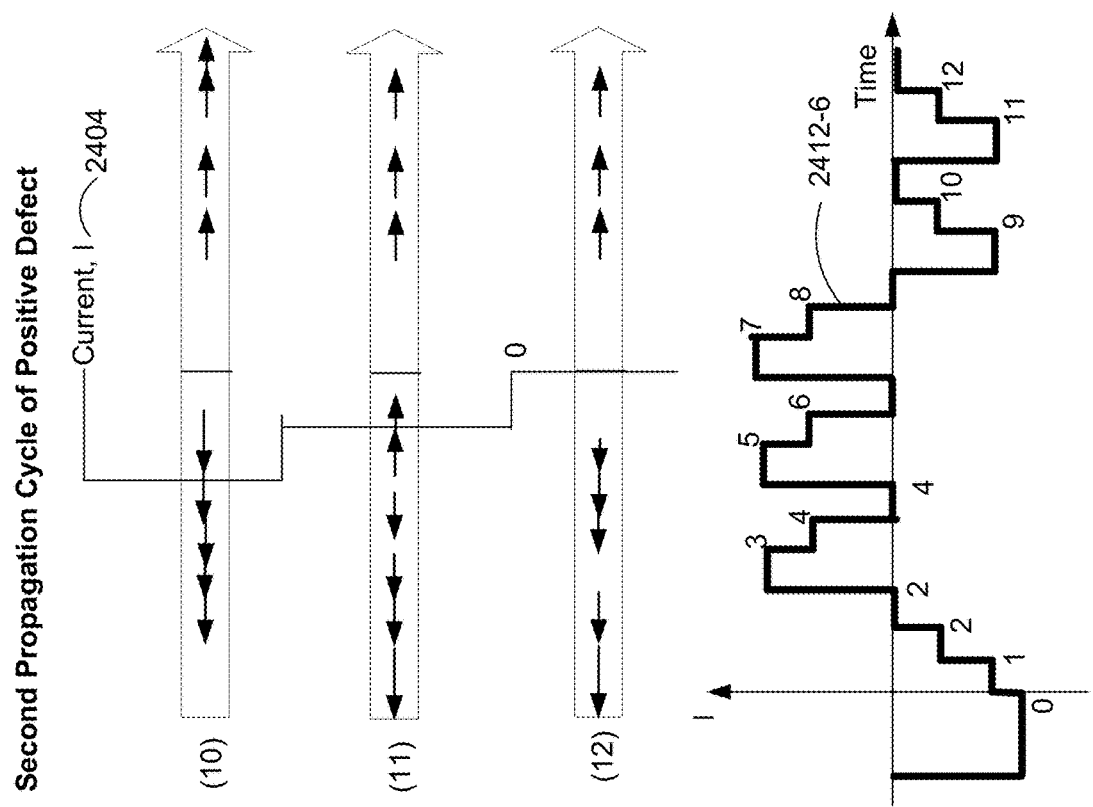
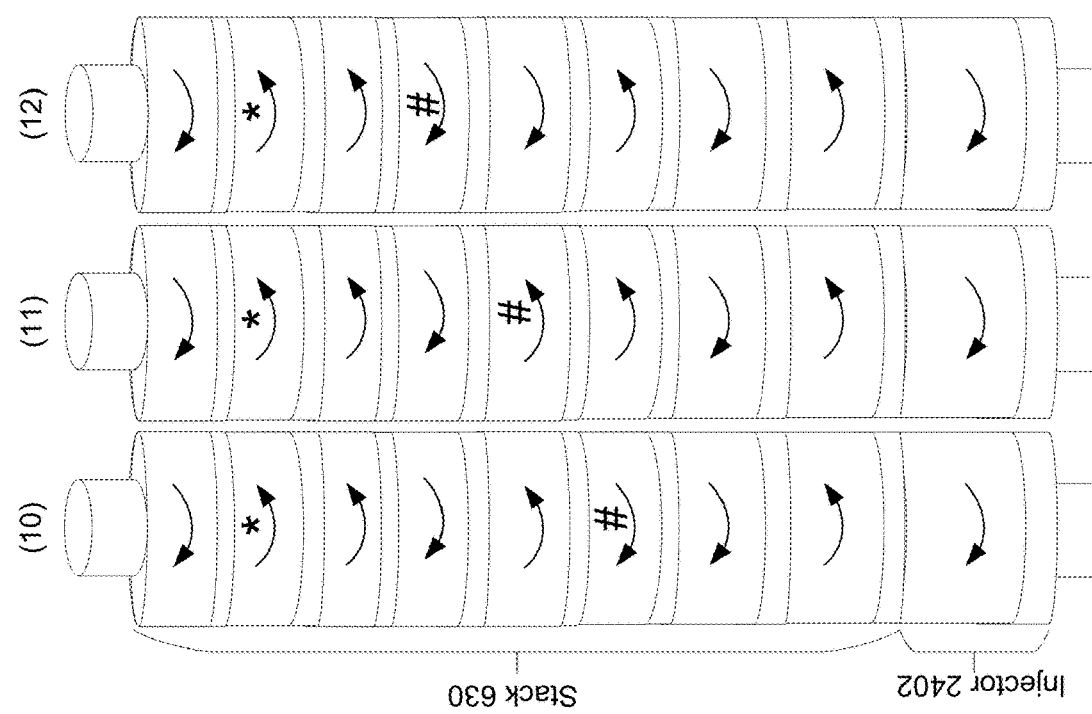
Figure 24F

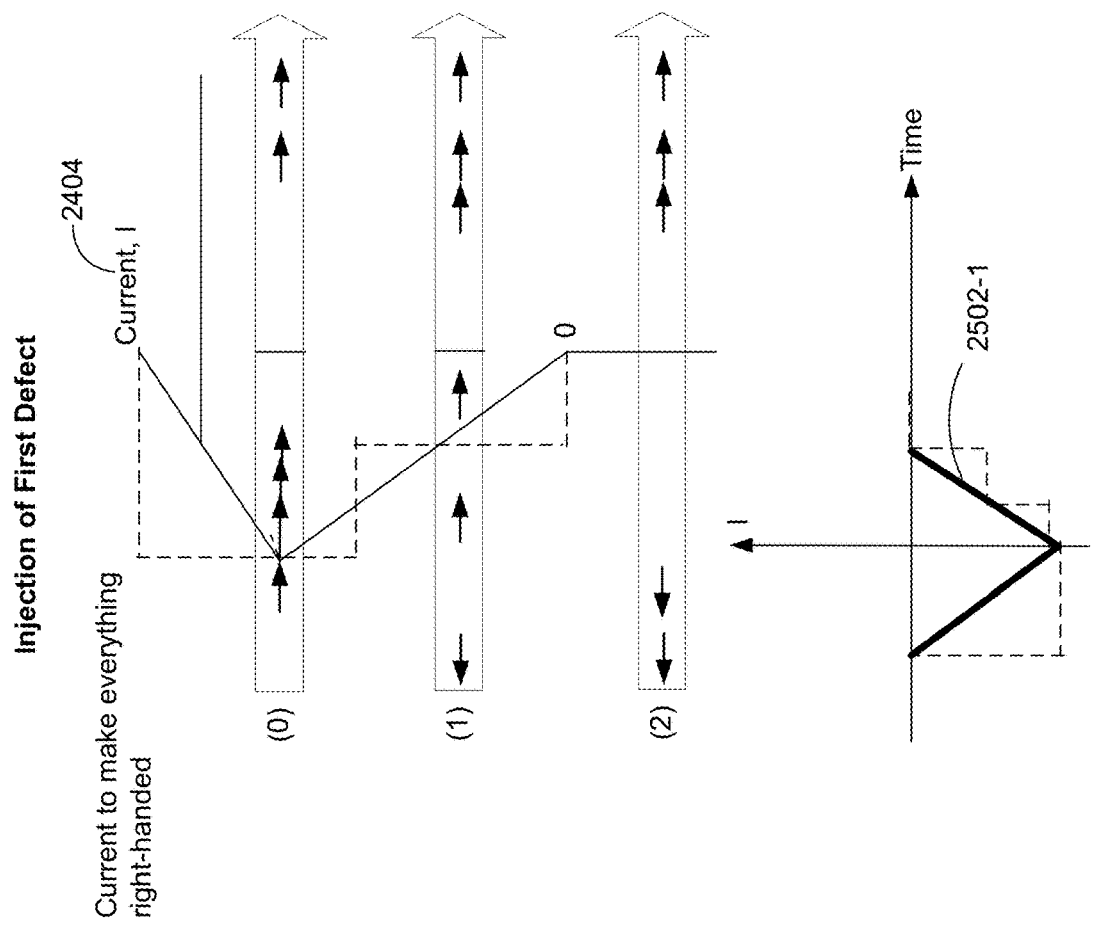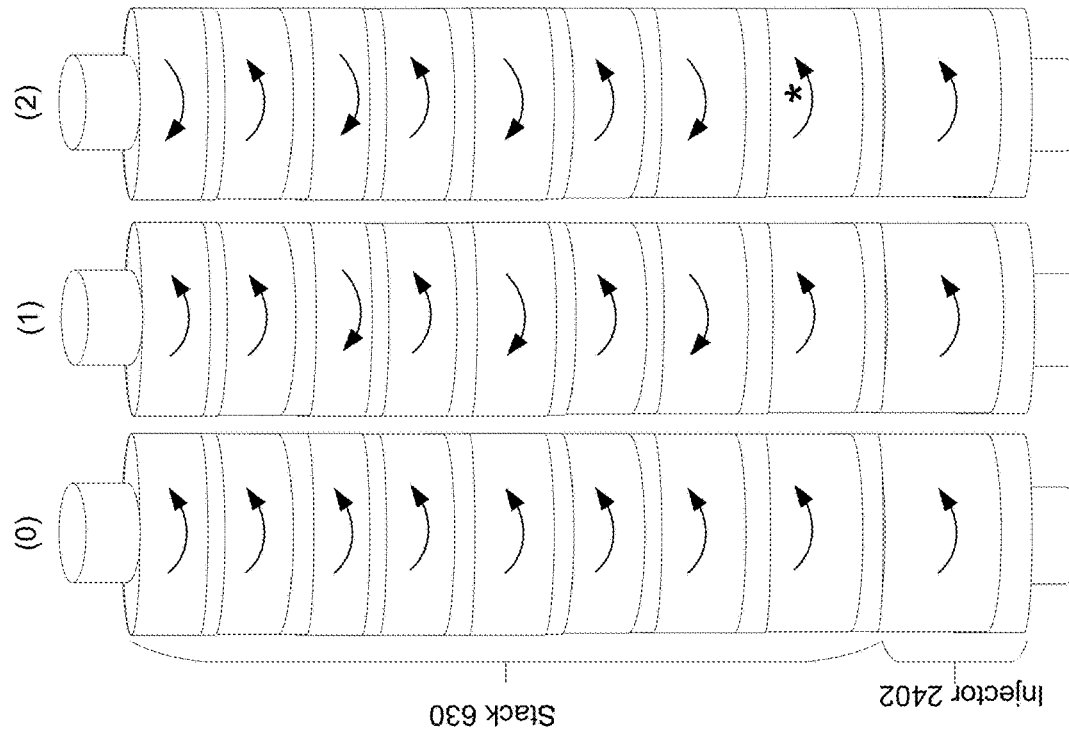
Figure 25A

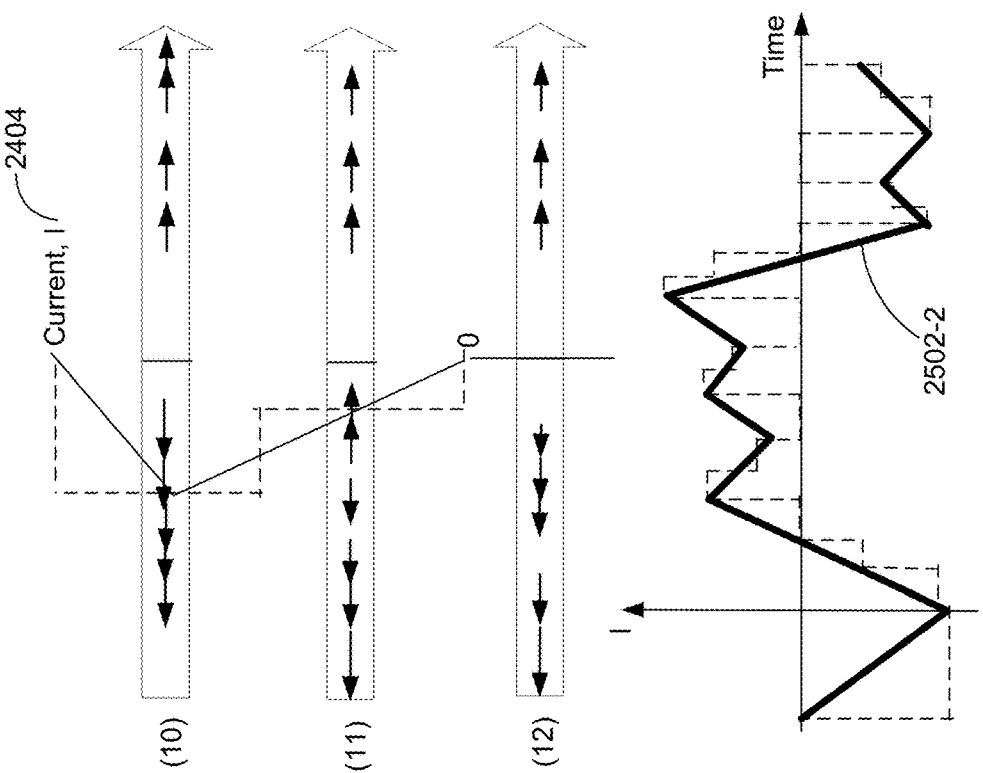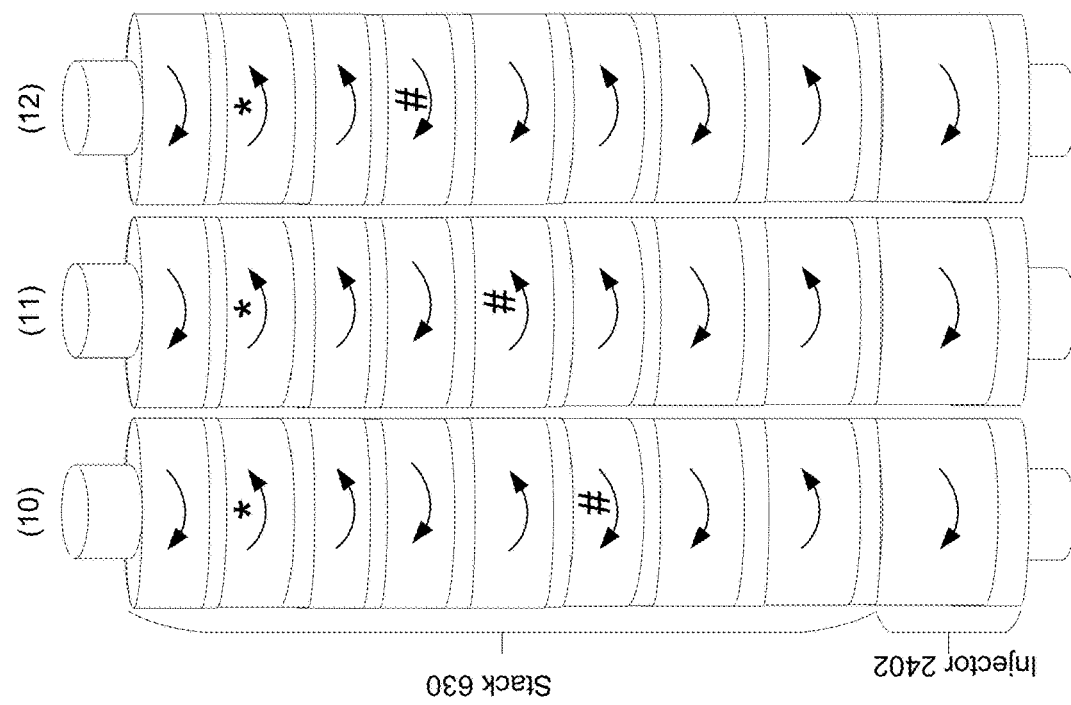
Figure 25B

DEFECT INJECTION STRUCTURE AND MECHANISM FOR MAGNETIC MEMORY

RELATED APPLICATIONS

This application is related to U.S. Utility patent application Ser. No. 16/147,283, entitled "Defect Propagation Structure and Mechanism for Magnetic Memory," filed Sep. 28, 2018, which is incorporated by reference herein in its entirety.

TECHNICAL FIELD

This relates generally to the field of memory applications, including but not limited to magnetic memory.

BACKGROUND

Magnetoresistive random access memory (MRAM) is a non-volatile memory technology that stores data through magnetic storage elements. MRAM devices store information by changing the orientation of the magnetization of a storage layer. For example, based on whether the storage layer is in a parallel or anti-parallel alignment relative to a reference layer, either a "1" or a "0" can be stored in each MRAM cell.

The field of memory applications is becoming more challenging as the performance requirements for memory-based devices increase. Because of many useful properties of MRAM (e.g., retention of data, resistance to errors, and life span of memory cells), memory systems based on MRAM have superior performance over conventional memory systems.

SUMMARY

There is a need for systems and/or devices with more efficient, accurate, and effective methods for fabricating and/or operating memory systems. Such systems, devices, and methods optionally complement or replace conventional systems, devices, and methods for fabricating and/or operating memory systems.

The present disclosure describes various implementations of MRAM systems and devices. As discussed in greater detail below, MRAM stores data through magnetic storage elements. These elements typically include two ferromagnetic films or layers that can hold a remanent magnetization and are separated by a non-magnetic material. In general, one of the layers has its magnetization pinned (e.g., a "reference layer"), meaning that this layer possesses a large thermal stability and requires a large magnetic field or spin-polarized current to change the orientation of its magnetization. The second layer is typically referred to as the storage, or free, layer and its magnetization direction can be changed by a smaller magnetic field or spin-polarized current relative to the reference layer.

Due to the spin-polarized electron tunneling effect, the electrical resistance of the cell changes due to the relative orientation of the magnetization of the two layers. A memory cell's resistance will be different for the parallel and anti-parallel states and thus the cell's resistance can be used to distinguish between a "1" and a "0". One important feature of MRAM devices is that they are non-volatile memory devices, since they maintain the information even when the power is off. In particular, the layers can be a few nanometers in lateral size and the magnetization direction can still be stable over time and with respect to thermal fluctuations.

The present disclosure also describes various implementations of three-dimensional (3D) MRAM systems and devices that generate and move data within the device (e.g., along a length of the device), analogous to a shift register (e.g., ratchets). In these 3D MRAM systems and devices, the data is stored in the form of magnetic bits within the magnetic layers of the systems and devices. The non-volatility of the magnetic layers makes them ideal candidates for implementing logic operations. Furthermore, because the MRAM devices are situated above the two-dimensional wafer space, the effective areal density of the device can be multiplied by increasing the number of magnetic layers in the device.

In accordance with some implementations, the 3D MRAM systems and devices are cylindrically shaped with an electrically conductive (and non-magnetic) cylindrical core and annular magnetic layers as storage elements. These magnetic layers are annularly shaped and include ferromagnetic materials (e.g., films) that can hold a remanent magnetization. A typically configuration includes two or more magnetic layers, with every two adjacent magnetic layers separated by a non-magnetic layer (e.g., material). In accordance with some implementations, a variant that utilizes Spin Hall Effect may be used to switch layers in the vortex magnetization configuration. Data can also be injected and propagated synchronously across several of the magnetic multilayers.

The present disclosure also describes various implementations of a readout component that reads out the state of the magnetic shift register (e.g., ratchet). In some implementations, the readout component comprises a concentric (e.g., annular, ring-shaped) magnetic tunnel junction (MTJ), for example a concentric inner magnetic metal/insulator/outer magnetic metal structure in which the outer magnetic metal comprises a ferromagnetic (e.g., Fe) layer which is relatively thick compared to the respective magnetic layers in the ratchet. The outer ferromagnetic layer has a vortex magnetic ground state with a fixed magnetization direction. In some implementations, the insulator portion comprises a dielectric such as MgO. In some implementations, the readout component would essentially wrap round the top part of the ratchet potentially encompassing several of its active layers. By passing current radially through the device, the tunneling current would depend on the relative alignment of the magnetization of the layers in the ratchet and the magnetization in the outer layer of the device, thereby enabling a readout of the magnetic state of the underlying layers in the ratchet.

In one aspect, some implementations include a magnetic memory device comprising (i) a non-magnetic cylindrical core configured to receive a current, (ii) a plurality of magnetic layers surrounding the cylindrical core, and (iii) a plurality of non-magnetic layers also surrounding the cylindrical core. Each of the plurality of non-magnetic layers and each of the plurality of magnetic layers shares a common surface with the core. The plurality of magnetic layers and the plurality of non-magnetic layers are arranged in a stack coaxial with the cylindrical core (e.g., the layers are coaxial and concentric with respect to the core), and respective magnetic layers of the plurality of magnetic layers are separated by respective non-magnetic layers of the plurality of non-magnetic layers. In other words, respective non-magnetic layers are interspersed between the plurality of magnetic layers such that a respective non-magnetic layer is sandwiched between two magnetic layers (e.g., respective magnetic layers alternate with respective non-magnetic layers in the stack). In some implementations each and every one of the layers is cylindrical (e.g., annular) in shape. The magnetic memory device also comprises (iv) an input terminal coupled to a first end of the cylindrical core and a (v) current source, coupled to the input terminal, that is configured to supply current imparting a Spin Hall Effect (SHE) around the circumference (e.g., perimeter, a surface of the cylindrical core and/or a surface of the cylindrical core that is coaxial with the cylindrical core) of the cylindrical core. The SHE contributes to a magnetization of the plurality of magnetic layers. In some implementations, each of the plurality of magnetic layers has a respective magnetization, and the SHE imparted around the circumference of the core contributes to a magnetization of each of the plurality of magnetic layers.

In another aspect, some implementations include a method of propagating information in a magnetic memory (e.g., information stored in the form of magnetic bits). The method is performed at a magnetic memory device that includes a cylindrical core, a plurality of magnetic layers surrounding the cylindrical core, and a plurality of non-magnetic layers also surrounding the cylindrical core (e.g., each of the plurality of non-magnetic layers and each of the plurality of magnetic layers shares a common surface with the core) and arranged in a stack coaxial with the cylindrical core, wherein respective magnetic layers of the plurality of magnetic layers are separated by respective non-magnetic layers of the plurality of non-magnetic layers, and the plurality of magnetic layers is arranged in an antiferromagnetic configuration except for a first pair of adjacent magnetic layers of the plurality of magnetic layers having magnetization in a first direction. The method includes supplying a sequence of currents to an input terminal at a first end of the cylindrical core, the sequence of currents including a first current and a second current, wherein (i) the first current causes a first member in the first pair of adjacent magnetic layers to switch from the first direction to a second direction opposite to the first direction, thereby resulting in a second pair of adjacent magnetic layers of the plurality of magnetic layers having magnetization in the second direction, the second pair includes the first member of the first pair; and (ii) the second current causes a first member in the second pair of adjacent magnetic layers to switch from the second direction to the first direction, thereby resulting in a third pair of adjacent magnetic layers of the plurality of magnetic layers having magnetization in the first direction. The third pair includes the first member of the second pair, and wherein the first member of the first pair is distinct from the first member of the second pair. In some implementations, each and every one of the layers is cylindrical (e.g., annular). The layers are coaxial and concentric with respect to the core. In some implementations, the stack comprising the plurality of magnetic layers and the plurality of non-magnetic layers is known as a propagation layer (or a propagation stack/structure/portion) of the magnetic memory device. In some implementations, the first pair of adjacent magnetic layers is also known (e.g., referred to) as a magnetic instability and/or a defect in the device. In some implementations, the first current and the second current are part of a current pulse having a leading edge and a trailing edge. The first current corresponds to the peak of the leading edge and the second current corresponds to a predefined value at the trailing edge.

In yet another aspect, some implementations include a magnetic memory device comprising (i) a non-magnetic core configured to receive a current (e.g., and electrically conductive) cylindrical; (ii) a first portion surrounding the cylindrical core, the first portion configured to introduce (e.g., inject) one or more magnetic instabilities into a second portion that is adjacent (e.g., contiguous, having a common surface) to the first portion and arranged in a stack with respect to the first portion; and (iii) the second portion also surrounding the cylindrical core and configured to store information based on a respective position of the one or more defects, wherein: the second portion comprises a first plurality of magnetic layers and a first plurality of non-magnetic layers; and respective magnetic layers of the first plurality of magnetic layers are separated by respective non-magnetic layers of the plurality of non-magnetic layers. In some implementations, the first portion is also known as the injector layer and the second portion is also known as the propagation layer (or a propagation stack/structure/portion). Each of the one or more magnetic instabilities is associated with two adjacent magnetic layers having a same magnetization direction (or the same magnetization polarity). The second portion is an antiferromagnetically configured structure except for the one or more magnetic instabilities. In some implementations, each of the magnetic stabilities is referred to as a defect. In some implementations, the magnetization direction is a vortex magnetization direction. In the magnetic memory device, information is stored in the form of magnetic bits. Magnetic bits can take a '0' or '1' state depending on the magnetization direction of adjacent magnetic layers. In some implementations, the second portion (e.g., the propagation layer) is also referred to as a ratchet structure as it allows the magnetic instability (e.g., defect) to propagate in only one direction (e.g., unidirectional).

In yet another aspect, some implementations include a method of operating a magnetic memory performed at a magnetic memory device that comprises a cylindrical core; a first portion surrounding the cylindrical core, the first portion including a first magnetic layer having a first magnetization in a first direction; and a second portion adjacent to the first portion and arranged in a stack with respect to the first portion (e.g., the second portion is coaxial with the cylindrical core), wherein: the second portion includes a plurality of magnetic layers and a plurality of non-magnetic layers; the plurality of magnetic layers includes a second magnetic layer that is separated from the first magnetic layer by a non-magnetic layer; the plurality of magnetic layers includes a first subset having the first magnetization in the first direction and a second subset having a second magnetization in a second direction opposite to the first direction; and respective magnetic layers of the plurality of magnetic layers are separated by respective non-magnetic layers of the plurality of non-magnetic layers. The method includes: supplying a sequence of currents coupled to an input terminal at a first end of the cylindrical core, the sequence of currents including a first current and a second current after the first current. The first current causes switching (e.g., a change) of magnetization direction of the second subset from the second magnetization in the second direction to the first magnetization in the first direction. The second current causes switching of magnetization direction of respective layers of the plurality of magnetic layers such that the second portion has an antiferromagnetic configuration with the second magnetic layer having the first magnetization in the first direction. In some implementations, the first portion is also known as an injector/injection portion (or an injection layer). In some implementations, the first portion includes a single magnetic layer and thus the first magnetic layer is the single magnetic layer. In some implementations, the first portion includes a plurality of magnetic layers and the first magnetic layer is the magnetic layer that is closest to a magnetic layer of the second portion. In some implementations, the second magnetic layer is the magnetic layer in the second portion that is closest to the first magnetic layer. In some implementations, the first portion and the second portion each has a cylindrical (e.g., annular) shape. In some implementations, the first magnetization and the second magnetization are vortex magnetizations having opposite directions (e.g., a clockwise direction and a counterclockwise direction, or vice versa). In some implementations, the first current causes each of the plurality of magnetic layers to have the first magnetization direction. Thus, the first current causes both the first magnetic layer and the second magnetic layer to have magnetization in the first direction. Thus, an initial magnetic instability (e.g., an initial defect) is created at the first magnetic layer and the second magnetic layer which are adjacent to each other. This operation should not impact magnetization of the first portion.

Thus, devices and systems are provided with methods creating, propagating (e.g., moving) and reading out magnetic bits in magnetic memory, thereby increasing the effectiveness, efficiency, and user satisfaction with such systems and devices.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

For a better understanding of the various described implementations, reference should be made to the Description of Implementations below, in conjunction with the following drawings in which like reference numerals refer to corresponding parts throughout the figures.

FIGS. 14A to 14D illustrate two magnetic ground states of an MRAM structure and a numerical example of the process for shifting magnetic bits in the MRAM system, in accordance with some implementations.

FIGS. 15A to 15D illustrates application of a current to a MRAM device, in accordance with some implementations.

FIG. 19 illustrates corresponding effective fields (in Tesla) for the 20 nm-wide MRAM device of FIG. 18, in accordance with some implementations.

FIG. 21 illustrates other values of RKKY coupling and Spin Hall Effect (SHE) angle and resistivity from prior art, in accordance with some implementations.

FIGS. 23A and 23B illustrate injection and propagation of defects in a MRAM system using alternative pulses, in accordance with some implementations.

FIGS. 24A to 24F illustrate a cylindrical MRAM device that is configured to inject and propagate one or more magnetic instabilities using the Spin Hall Effect (SHE), and the process of injecting and propagating the one or more magnetic instabilities via the SHE, in accordance with some implementations.

FIGS. 25A and 25B illustrate injection and propagation of defects in a cylindrical MRAM device using alternative pulses, in accordance with some implementations.

Like reference numerals refer to corresponding parts throughout the several views of the drawings.

DETAILED DESCRIPTION

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

As described in greater detail below, a three-dimensional magnetic memory device may provide data storage and logic operations. For example, data (e.g., information) is stored as magnetic instabilities (also known as defects and/or kink-solitons) in an otherwise well-ordered (e.g., having an anti-parallel or an anti-ferromagnetic configuration) magnetic structure comprising two or more magnetic layers. The magnetic instabilities may be transferred (e.g., propagated) along the length of the device by switching a respective magnetization direction of at least one of the magnetic layers.

Figure 1A:
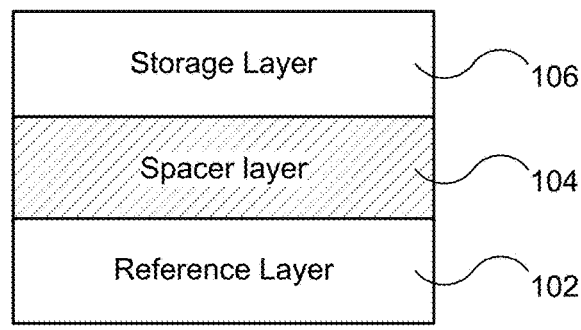
FIG. 1A illustrates a schematic diagram of a representative magnetic tunnel junction (MTJ) structure in accordance with some implementations.

FIG. 1A is schematic diagram of a magnetic tunnel junction (MTJ) structure 100 (e.g., for use in an MRAM device) in accordance with some implementations. In accordance with some implementations, the MTJ structure 100 is composed of a first ferromagnetic layer (reference layer 102), a second ferromagnetic layer (storage layer 106), and a non-magnetic layer (spacer layer 104). The reference layer 102 is also sometimes referred to as a pinned or fixed layer. The storage layer 106 is also sometimes referred to as a free layer. The spacer layer 104 is also sometimes referred to as a barrier layer (or a non-magnetic spacer layer). In some implementations, the spacer layer 104 comprises an electrically-insulating material such as magnesium oxide (MgO) or silicon oxide.

In some implementations, the reference layer 102 and the storage layer 106 are composed of the same ferromagnetic material. In some implementations, the reference layer 102 and the storage layer 106 are composed of different ferromagnetic materials. In some implementations, the reference layer 102 is composed of a ferromagnetic material that has a higher coercivity than the storage layer 106. In some implementations, the reference layer 102 and the storage layer 106 are composed of different ferromagnetic materials with the same or similar thicknesses (e.g., within 10%, 5%, or 1% of one another). In some implementations, the thickness of the reference layer 102 is different from that of the storage layer 106 (e.g., the reference layer 102 is thicker than the storage layer 106). In some implementations, the thickness of the spacer layer 104 is on the order of a few atomic layers. In some implementations, the thickness of the spacer layer 104 is on the order of a few nanometers (nm). In some implementations, thicknesses of the reference layer 102, the spacer layer 104, and the storage layer 106 are uniform. In some implementations, thicknesses of the reference layer 102, the spacer layer 104, and the storage layer 106 are not uniform (e.g., a first portion of the spacer layer 104 is thinner relative to a second portion of the spacer layer 104).

In some implementations, the reference layer 102 and/or the storage layer 106 is composed of two or more ferromagnetic layers separated from one another with spacer layers. In some implementations, each of these ferromagnetic layers is composed of identical, or varying, thickness(es) and/or material(s). In some implementations, the spacer layers are composed of identical, or varying, thickness(es) and/or material(s) with respect to one another.

Figure 1B:
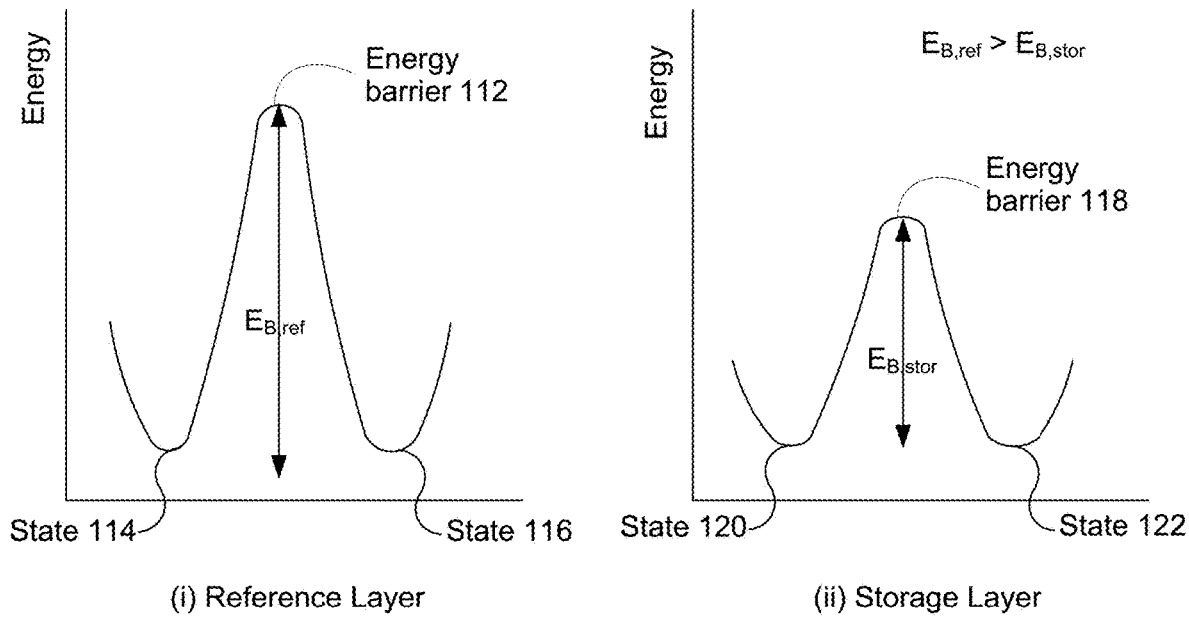
FIG. 1B illustrates representative energy barriers of the reference and storage layers of the MTJ of FIG. 1A in accordance with some implementations.
Figure 10B:
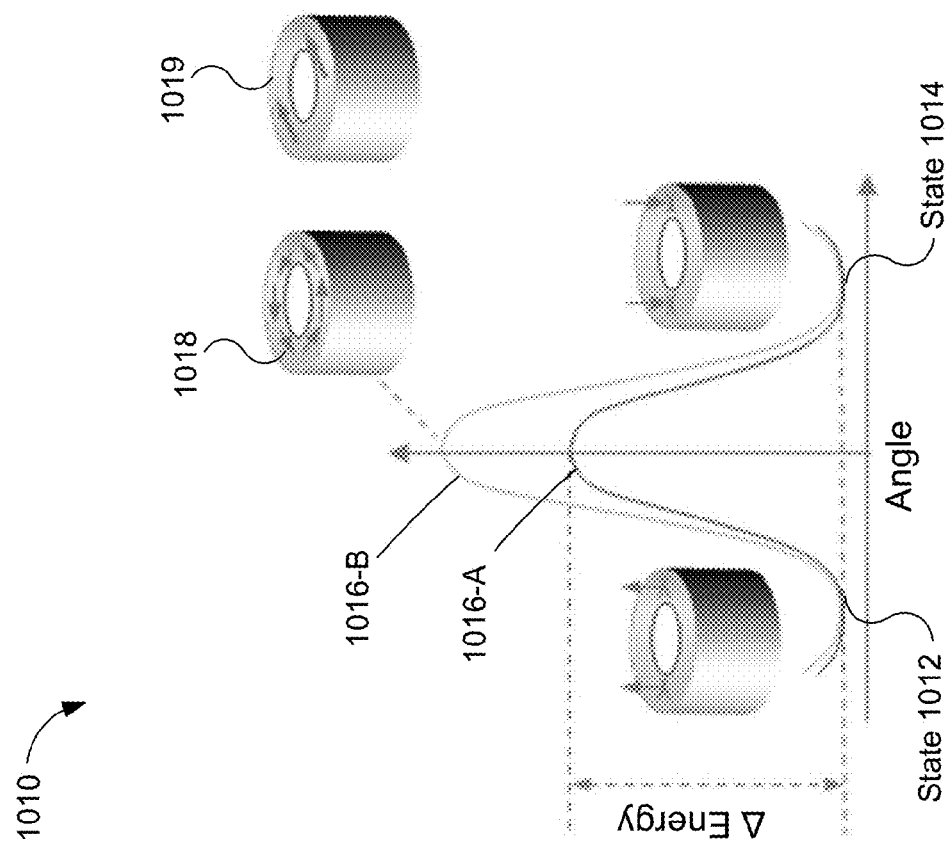
FIGS. 10A and 10B illustrate energy barriers of the cylindrical MTJ structure based on magnetization orientations in accordance with some implementations.
Figure 10A:
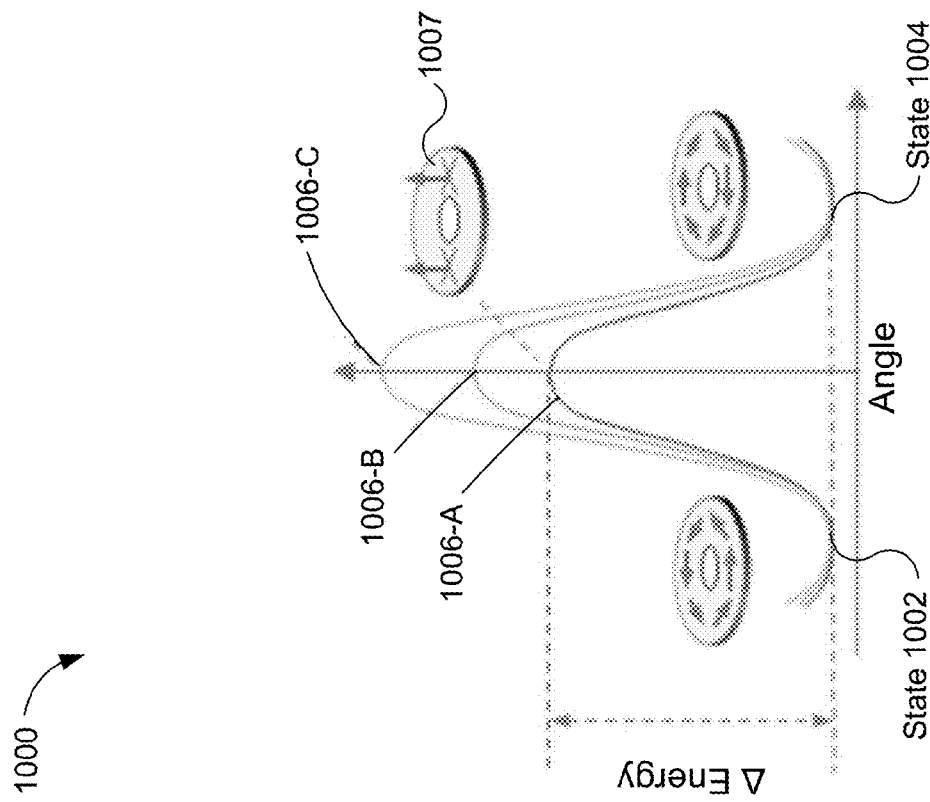

Magnetic anisotropy refers to the directional dependence of a material's magnetic properties. The magnetic moment of magnetically anisotropic materials will tend to align with an "easy axis," which is the energetically favorable direction of spontaneous magnetization. In some implementations and instances, the two opposite directions along an easy axis are equivalent, and the direction of magnetization can be along either of them (and in some cases, about them). For example, in accordance with some implementations, FIG. 1B shows low energy states 114 and 116 corresponding to opposite directions along an easy axis (additional examples are shown in FIGS. 10A-10B with reference to a cylindrical three-dimensional MTJ structure).

In some implementations, the MTJ structure 100 is an in-plane MTJ. In this instance, the magnetic moments of the reference layer 102 and the storage layer 106, and correspondingly their magnetization direction, are oriented in the plane of the ferromagnetic films of the reference layer 102 and the storage layer 106.

In some implementations, the MTJ structure 100 is a perpendicular (or out-of-plane) MTJ. In this instance, the magnetic moments of the reference layer 102 and the storage layer 106, and correspondingly their magnetization direction, are oriented perpendicular and out-of-plane to the ferromagnetic films of the reference layer 102 and the storage layer 106.

In some implementations, the MTJ structure 100 has preferred directions of magnetization at arbitrary angles with respect to the magnetic films of the reference layer 102 and the storage layer 106.

In accordance with some implementations, an MRAM device provides at least two states such that they can be assigned to digital signals "0" and "1," respectively. One storage principle of an MRAM is based on the energy barrier required to switch the magnetization of a single-domain magnet (e.g., switch the magnetization of the storage layer 106) from one direction to the other.

FIG. 1B shows representative energy barriers of the reference layer 102 and the storage layer 106 of the MTJ 100 in accordance with some implementations. In accordance with some implementations, the energy barrier refers the amount of energy the magnetic material must overcome in order to switch from one magnetization direction to its opposite (e.g., from the state 114 to the state 116). In an MRAM device, the magnetization direction of the reference layer 102 is generally considered fixed, while the magnetization direction of the storage layer 106 is varied to store the "0" and "1" states. Accordingly, the reference layer 102 is composed of materials such that an energy barrier 112 ($E_{B,\ ref}$) of the reference layer 102 is larger than the energy barrier 118 ($E_{B,\ stor}$) of the storage layer 106. In particular, FIG. 1B shows low energy states 114 and 116 for the reference layer 102 separated by the energy barrier 112, and shows low energy states 120 and 122 for the storage layer 106 separated by the energy barrier 118. In some implementations, the storage layer 106 is designed with materials that have a magnetic anisotropy that is high enough to store the magnetization over certain time duration (for e.g., 1 week, 1 month, 1 year, or 10 years).

For an MRAM device with the MTJ structure 100, the resistance states of the MRAM devices are different when the magnetization directions of the reference layer 102 and the storage layer 106 are aligned in a parallel (low resistance state) configuration or in an anti-parallel (high resistance state) configuration, as will be discussed with respect to FIGS. 2A and 2B.

Figure 2A:
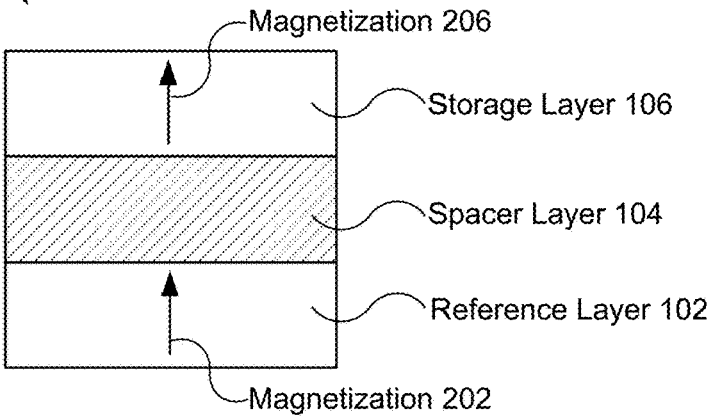
FIGS. 2A and 2B illustrate magnetization orientations in a representative perpendicular magnetic tunnel junction (pMTJ) structure in accordance with some implementations.
Figure 2B:
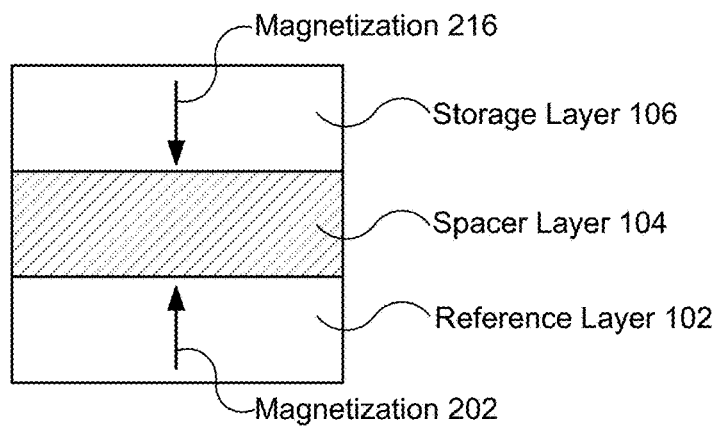

FIGS. 2A-2B illustrate magnetization orientations in a perpendicular magnetic tunnel junction (pMTJ) structure 200 in accordance with some implementations. In some implementations, the pMTJ structure 200 is the same as the MTJ structure 100 presented in FIG. 1A, comprising: the reference layer 102, the spacer layer 104, and the storage layer 106. In some implementations, the pMTJ structure 200 forms part of a MRAM device.

For the pMTJ structure 200 illustrated in FIGS. 2A and 2B, the fixed magnetization direction 202 for the reference layer 102 is chosen to be in an upward direction and is represented by an up arrow. In some implementations (not shown), the fixed magnetization direction of the reference layer 102 in the pMTJ structure 200 is in a downward direction.

FIG. 2A illustrates the magnetization directions of the storage and reference layers in a parallel configuration. In the parallel configuration, the magnetization direction 206 of the storage layer 106 is the same as the magnetization direction 202 of the reference layer 102. In this example, the magnetization direction 202 of the reference layer 102 and the magnetization direction 206 of the storage layer 106 are both in the upward direction. The magnetization direction of the storage layer 106 relative to the fixed layer 102 changes the electrical resistance of the pMTJ structure 200. In accordance with some implementations, the electrical resistance of the pMTJ structure 200 is low when the magnetization direction of the storage layer 106 is the same as the magnetization direction 202 of the reference layer 102. Accordingly, the parallel configuration is also sometimes referred to as a "low (electrical) resistance" state.

FIG. 2B illustrates the magnetization directions of the storage and reference layers in an anti-parallel configuration. In the anti-parallel configuration, the magnetization direction 216 of the storage layer 106 is opposite to the "fixed" magnetization direction 202 of the reference layer 102. In accordance with some implementations, the electrical resistance of the pMTJ structure 200 is high when the magnetization direction 216 of the storage layer 106 is the opposite of the magnetization direction 202 of the reference layer 102. Accordingly, the anti-parallel configuration is sometimes also referred to as a "high (electrical) resistance" state.

Thus, by changing the magnetization direction of the storage layer 106 relative to that of the reference layer 102, the resistance states of the pMTJ structure 200 can be varied between low resistance to high resistance, enabling digital signals corresponding to bits of "0" and "1" to be stored and read. Conventionally, the parallel configuration (low resistance state) corresponds to a bit "0," whereas the anti-parallel configuration (high resistance state) corresponds to a bit "1".

Although FIGS. 2A-2B show parallel and anti-parallel configurations with the pMTJ structure 200, in some implementations, an in-plane MTJ structure, or an MTJ structure with an arbitrary preferred angle, is used instead.

FIGS. 3A-3D illustrate representative processes for switching the pMTJ 200 between the parallel and anti-parallel configurations in accordance with some implementations. In accordance with some implementations, spin-transfer torque (STT) is used to modify the magnetization directions of an MTJ. STT is an effect in which the magnetization direction of a ferromagnetic layer in an MTJ is modified using a spin-polarized current.

In general, electrons possess a spin, a quantized number of angular momentum intrinsic to the electron. An electrical current is generally unpolarized, e.g., it consists of 50% spin up and 50% spin down electrons. When a current is applied though a ferromagnetic layer, the electrons are polarized with spin orientation corresponding to the magnetization direction of the ferromagnetic layer, thus producing a spin-polarized current (or spin-polarized electrons).

As described earlier, the magnetization direction of the reference layer 102 is "fixed" in an MTJ (e.g., the applied currents are insufficient to change the magnetization state of the reference layer). Therefore, spin-polarized electrons may be used to switch the magnetization direction of the storage layer 106 in the MTJ (e.g., switch between parallel and anti-parallel configurations).

As will be explained in further detail, when spin-polarized electrons travel to the magnetic region of the storage layer 106 in the MTJ, the electrons will transfer a portion of their spin-angular momentum to the storage layer 106, to produce a torque on the magnetization of the storage layer 106. When sufficient torque is applied, the magnetization of the storage layer 106 switches, which, in effect, writes either a "1" or a "0" based on whether the storage layer 106 is in the parallel or anti-parallel configuration relative to the reference layer.

Figure 3A:
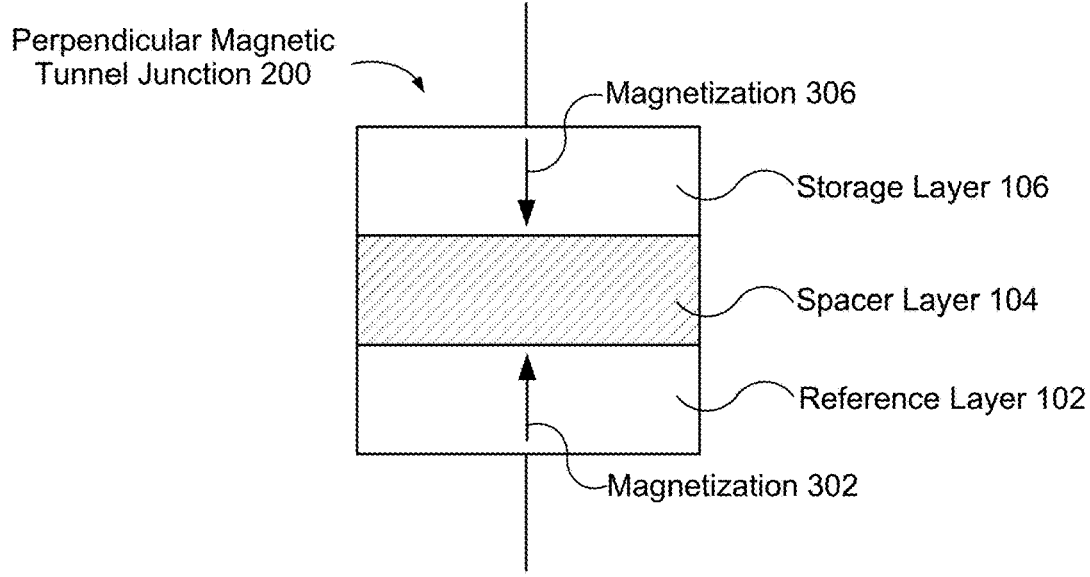
FIGS. 3A to 3D illustrate representative processes for switching the pMTJ of FIGS. 2A-2B between the parallel and anti-parallel configurations in accordance with some implementations.
Figure 3B:
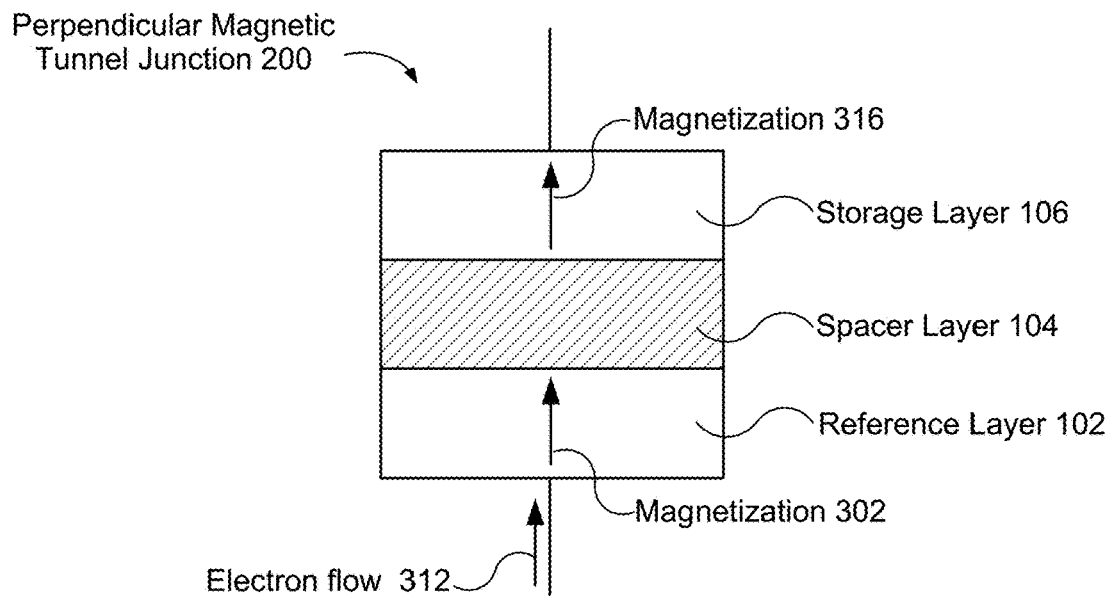

FIGS. 3A-3B illustrate the process of switching from the anti-parallel configuration to the parallel configuration. In FIG. 3A, the pMTJ structure 200 is in the anti-parallel configuration, e.g., the magnetization direction 302 of the reference layer 102 is opposite to the magnetization direction 306 of the storage layer 106.

FIG. 3B shows application of a current such that electrons flow through the pMTJ 200 in accordance with electron flow 312. The electrons are directed through the reference layer 102 which has been magnetized with the magnetization direction 302. As the electrons flow through the reference layer 102, they are polarized (at least in part) by the reference layer 102 and have spin orientation corresponding to the magnetization direction 302 of the reference layer 102. The majority of the spin-polarized electrons tunnel through the spacer layer 104 without losing their polarization and subsequently exert torque on the orientation of magnetization of the storage layer 106. When a sufficiently large current is applied (e.g., a sufficient number of polarized electrons flow into the storage layer 106), the spin torque flips, or switches, the magnetization direction of the storage layer 106 from the magnetization direction 306 in FIG. 3A to the magnetization direction 316 in FIG. 3B.

Thus, as shown in FIG. 3B, the magnetization direction 316 of the storage layer 106 is in the same (upward) direction as the magnetization direction 302 of the reference layer 102. Accordingly, the pMTJ structure 200 in FIG. 3B is in the parallel (low resistance state) configuration. In some implementations and instances, electrons that possess spins in the minority (opposite) direction are reflected at the barrier interfaces and exert torque on the magnetization direction 302 of the reference layer 102. However, the magnetization direction 302 of the reference layer 102 is not switched because the torque is insufficient to cause switching in the reference layer 102.

Figure 3C:
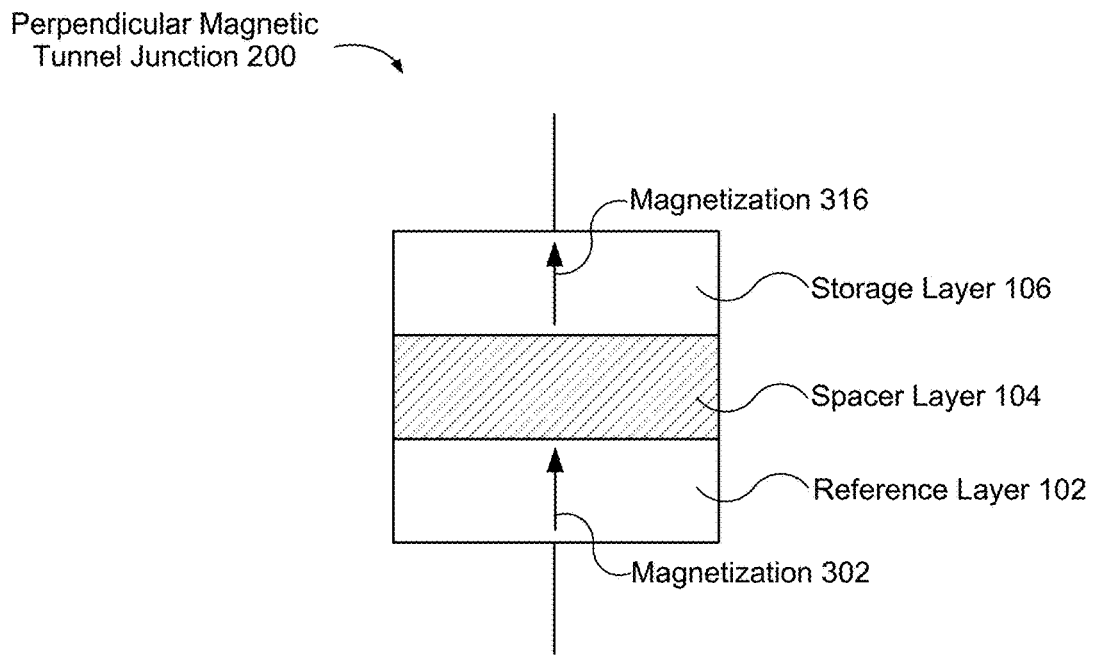
Figure 3D:
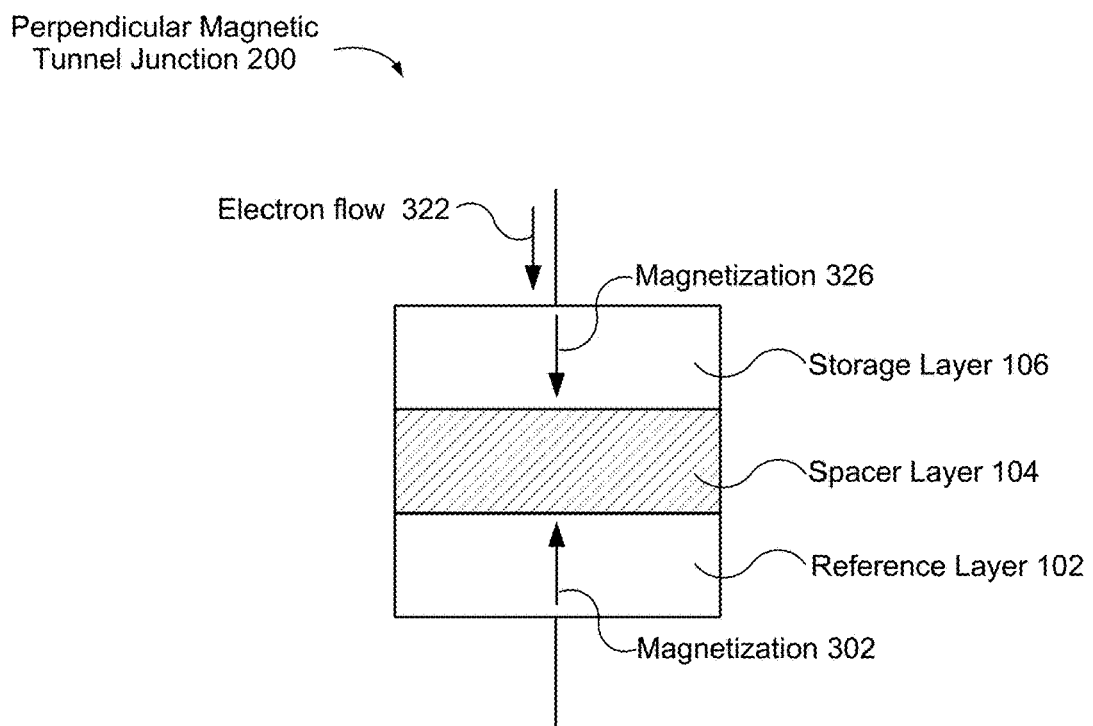

FIGS. 3C-3D illustrate the process of switching from the parallel configuration to the anti-parallel configuration. In FIG. 3C, the pMTJ structure 200 is in the parallel configuration. To initiate switching to the anti-parallel configuration, a current is applied such that electrons flow in accordance with electron flow 322 in FIG. 3D. The electrons flow from the storage layer 106 to the reference layer 102. As the electrons flow through the storage layer 106, they are polarized by the storage layer 106 and have spin orientation corresponding to the magnetization direction 316 of the storage layer 106.

The MTJ structure 200 in FIG. 3C is in the parallel (low resistance state) configuration and thus it has lower electrical resistance, therefore, in some implementations and instances, the majority of the spin-polarized electrons tunnel through the spacer layer 104. Minority spin electrons that are polarized with direction opposite to the magnetization direction 316 of the storage layer 106 are reflected at the barrier interfaces of the spacer layer 104. The reflected spin electrons then exert torque on the magnetization 316 of the storage layer 106, eventually leading to a switch of the magnetization direction 316 of the storage layer 106 in FIG. 3C to a magnetization direction 326 in FIG. 3D. Thus, the pMTJ structure 200 is switched from the parallel (low resistance state) configuration to the anti-parallel (high resistance state) configuration.

Accordingly, STT allows switching of the magnetization direction of the storage layer 106. MRAM devices employing STT (e.g., STT-MRAM) offer advantages including lower power consumption, faster switching, and better scalability, over conventional MRAM devices that use magnetic field to switch the magnetization directions. STT-MRAM also offers advantages over flash memory in that it provides memory cells with longer life spans (e.g., can be read and written to more times compared to flash memory).

Figure 4:
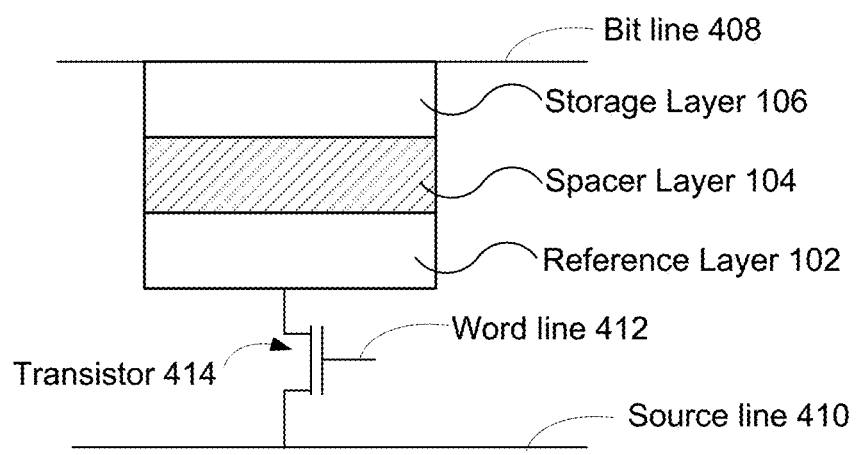
FIG. 4 is a schematic diagram of a representative spin transfer torque (STT) MRAM device in accordance with some implementations.

FIG. 4 is a schematic diagram of a spin transfer torque (STT) MRAM device 400 in accordance with some implementations. The includes an MTJ device with the reference layer 102, the spacer layer 104, the storage layer 106, and an access transistor 414. The MTJ device is coupled to a bit line 408 and a source line 410 via transistor 414, which is operated by a word line 412. The reference layer 102, the spacer layer 104, and the storage layer 106 compose the MTJ structure 100 and/or the pMTJ structure 200, as described above with reference to FIGS. 1-3. In some implementations, the STT-MRAM 400 includes additional read/write circuitry, one or more additional transistors, one or more sense amplifiers, and/or other components (not shown).

The MTJ structure 100 and/or the pMTJ structure 200 is also sometimes referred to as an MRAM cell. In some implementations, the STT-MRAM 400 contains multiple MRAM cells (e.g., hundreds or thousands of MRAM cells) arranged in an array coupled to respective bit lines and source lines. During a read/write operation, a voltage is applied between the bit line 408 and the source line 410 (e.g., corresponding to a "0" or "1" value), and the word line 412 enables current to flow between the bit line 408 to the source line 410. In a write operation, the current is sufficient to change a magnetization of the storage layer 106 and thus, depending on the direction of electron flow, bits of "0" and "1" are written into the MRAM cell (e.g., as illustrated in FIGS. 3A-3D). In a read operation, the current is insufficient to change the magnetization of the storage layer 106. Instead, a resistance across the MRAM cell is determined. e.g., with a low resistance corresponding to a logical "0" and a high resistance corresponding to a logical "1."

In accordance with some implementations of the present disclosure, a three-dimensional magnetic memory device stores data in a lattice of cells and passes data from cell to cell along a chain. In some implementations, the lattice of cells comprises multiple magnetic layers that are arranged in a stack. Data is passed (e.g., moved) from one magnetic layer to another along the stack.

Figure 5:
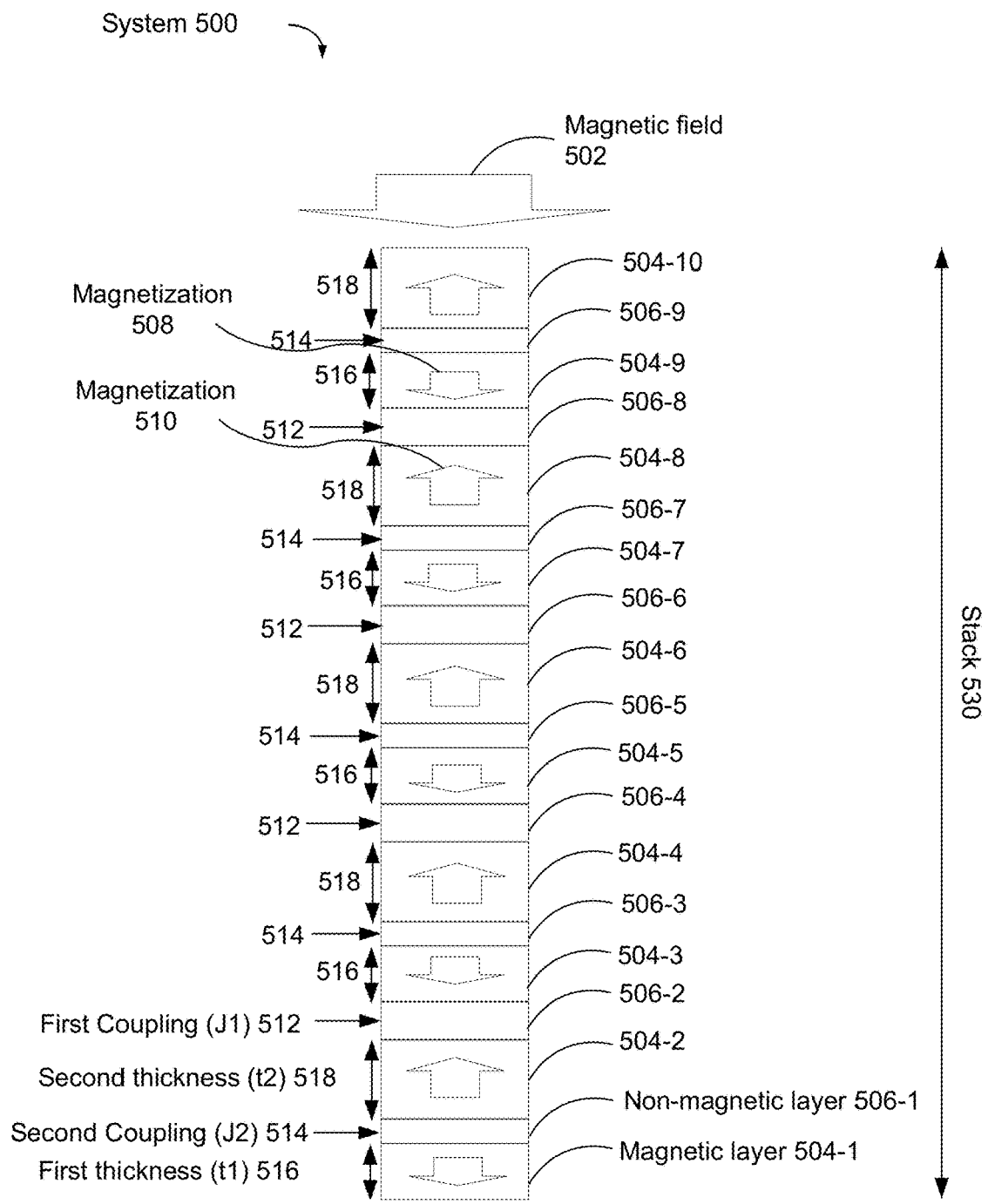
FIG. 5 illustrates an exemplary three-dimensional MRAM system for implementing a unidirectional vertical shift register between perpendicularly magnetized ferromagnets, in accordance with some implementations.

To this end, FIG. 5 illustrates an exemplary three-dimensional MRAM system 500 for implementing a unidirectional vertical shift register between perpendicularly magnetized ferromagnets, in accordance with some implementations.

FIG. 5 has been reproduced and adapted from Lavrijsen et al., "Magnetic ratchet for three-dimensional spintronic memory and logic," Nature 493, 647 (2013), which is incorporated by reference herein in its entirety.

The system (e.g., device) 500 is configured to receive a magnetic field 502 (e.g., an externally applied magnetic field) and comprises a plurality of magnetic layers 504. Each of the magnetic layers 504 comprises a ferromagnetic material and includes a perpendicular magnetization direction. In other words, the magnetization directions are oriented out of the plane of the ferromagnetic films of the magnetic layers 504.

In the example of FIG. 5, the odd-numbered magnetic layers (e.g., 504-1, 504-3, 505-5 etc.) have a first thickness (t1) 516 and a first perpendicular magnetization direction 508 that is indicated by the direction of the block arrow (e.g., downward, or down). The even-numbered magnetic layers (e.g., 504-2, 504-4, 505-6 etc.) have a second thickness (t2) 518 and a second perpendicular magnetization direction 510 (e.g., upward, or up) that is opposite to the first perpendicular magnetization direction 508. Of course, the designation of the down and up directions for the first and the second perpendicular magnetization directions in this instance are purely arbitrarily. In other implementations, the first magnetization direction 508 is the up direction and the second magnetization direction 510 is in the down. direction.

In some implementations, the first thickness 516 and the second thickness 518 are on the order of a few atomic layers (e.g., less than one nanometer). In some implementations, the first thickness 516 and the second thickness 518 are on the order of one nanometer or a few nanometers.

The system 500 further comprises a plurality of non-magnetic layers 506. As depicted in FIG. 5, two adjacent magnetic layers 504 are separated by a respective non-magnetic layer 506. Or, stated another way, two adjacent non-magnetic layers 506 are separated by a respective magnetic layer 504.

In some implementations, the non-magnetic layers 506 have a thickness that is on the order of a few atomic layers (e.g., 0.8 nm) or on the order of a few nanometers (e.g., 1.5 nm, 2.0 nm). In some implementations, the thicknesses of the non-magnetic layers facilitate an exchange coupling (e.g., a Ruderman-Kittel-Kasuya-Yosida (RKKY) coupling) between adjacent magnetic layers 504 in the system 500.

In the example of FIG. 5, adjacent magnetic layers with magnetization directions pointing away from each other (e.g., the magnetic layers 504-3 and 504-4) interact with each other via a first exchange coupling (J1) 512 (e.g., a first RKKY coupling), and adjacent magnetic layers with magnetization directions pointing toward each other (e.g., the magnetic layers 504-4 and 504-5) interact with each other via a second exchange coupling (J2) 514 (e.g., a second RKKY coupling).

Adjacent magnetic layers in the system 500 have opposite perpendicular magnetization directions. Thus, the plurality of magnetic layers 504 is arranged in an antiferromagnetic configuration. In some implementations, the antiferromagnetic configuration depicted in FIG. 5 is a first ground state (or a first stable state) of the system 500. In some implementations, the system 500 includes a second ground state (or a second stable state) which corresponds to the odd-numbered magnetic layers having an up magnetization direction and the even-numbered magnetic layers having a down magnetization direction (not shown).

In some implementations, the plurality of magnetic layers 504 and the plurality of non-magnetic layers 530 collectively form a stack 530 of the system 500. In some implementations, the stack 530 is also referred to as a propagation stack (or a soliton propagation stack).

In some implementations, the stack 530 includes a few magnetic layers 504 (e.g., five). In some implementations, the stack 530 includes tens of magnetic layers 504 (e.g., 15, 25, or 40 magnetic layers). In some implementations, the stack 530 includes a hundred or more magnetic layers. In each instance, two adjacent layers are separated by a non-magnetic layer.

Figure 6:
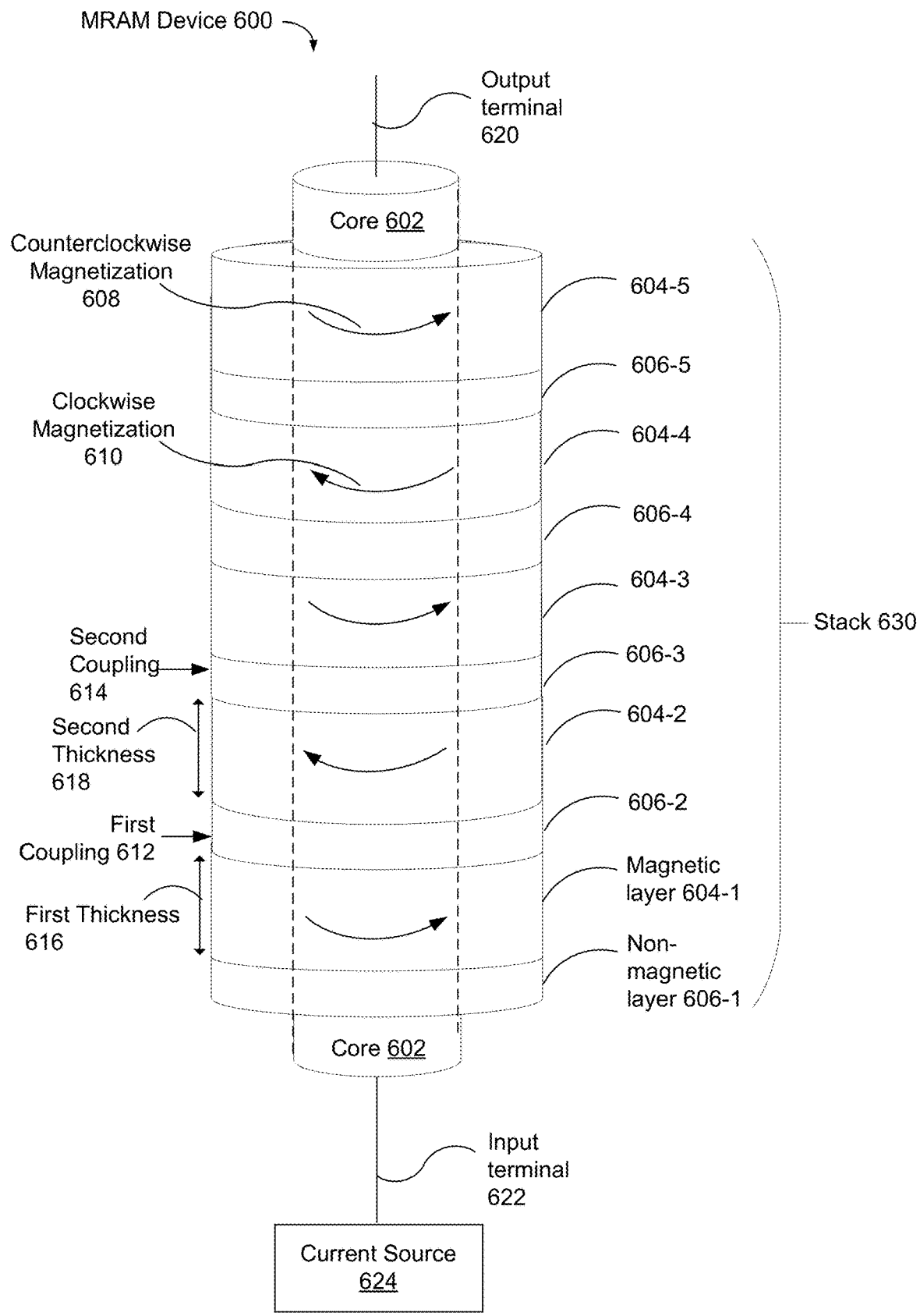
FIG. 6 illustrates another exemplary three-dimensional MRAM device in accordance with some implementations.

FIG. 6 illustrates another exemplary three-dimensional MRAM device 600 for implementing a vertical (e.g., unidirectional) shift register in accordance with some implementations.

The MRAM device 600 comprises an electrically-conductive and non-magnetic core 602 that is configured to receive a current.

In some implementations, the core 602 is made from a metal (e.g., a non-magnetic metal) and serves as a current lead for the MRAM device 600. In some implementations, the core 602 material includes at least partially, one or more of Tantalum (Ta) e.g., β-Ta), Tungsten (W) (e.g., β-W), Copper (Cu), Ruthenium (Ru), and Niobium (Nb), or a combination thereof. In the example of FIG. 6, the core 602 is cylindrical in shape. In other implementations, the core 602 may be conical or elliptical in shape.

The MRAM device 600 includes a plurality of magnetic layers 604 that each surrounds (e.g., shares a common surface with) the core 602. Each of the magnetic layers is annular in shape (e.g., ring-shaped). The plurality of magnetic layers 604 includes a first magnetic layer 604-1 with a first thickness (e.g., height) 616, and a second magnetic layer 604-2 with a second thickness (e.g., height) 618. Each of the magnetic layers 604 has a magnetic ground state (e.g., a vortex magnetic ground state, also referred to as a vortex magnetization) and a respective magnetization direction (e.g., a counterclockwise vortex magnetization direction 608 or a clockwise vortex magnetization direction 610).

In some implementations, the first magnetic layer 604-1 has a first set of characteristics, and the second magnetic layer 604-2 has a second set of characteristics that at least partially differ from the first set of characteristics. In some implementations, the first and the second sets of characteristics include: (i) film thicknesses of the first and second magnetic layers; (ii) radii of the first and second magnetic layers; and (iii) materials (e.g., material compositions) of the first and second magnetic layers.

In some implementations, the plurality of magnetic layers 604 includes a first plurality of pairs. Each of the first plurality of pairs includes a first magnetic member (e.g., a magnetic layer) and a second magnetic member (e.g., a magnetic layer). The first magnetic member has a respective set of characteristics (e.g., a material, a coupling coefficient, a thickness etc.) and the second magnetic member has another respective set of characteristics (e.g., a material, a coupling coefficient, a thickness etc.) that at least partially differ from the that of the first magnetic member. In some implementations, each of the first magnetic members has the same characteristics and/or each of the second magnetic members has the same characteristics. In some implementations, each of the first magnetic members has overlapping characteristics and/or each of the second magnetic members has overlapping characteristics. In other implementations, a subset of respective first magnetic members, and/or a subset of respective second magnetic members have different characteristics.

In some implementations, the first thickness (e.g., height) 616 is distinct from the second thickness (e.g., height) 618. In some implementations, the first thickness 616 is the same as the second thickness 618. In some implementations, the first thickness 616 and/or the second thickness 618 are on the order of a few atomic layers thick (e.g., less than one nanometer). In some implementations, the first thickness 616 and/or the second thickness 618 are on the order of a few nanometers (e.g., 1 nm, 2 nm, 5 nm etc.).

The device 600 also includes a plurality of non-magnetic layers 606 that each surrounds the cylindrical core 602 (e.g., each magnetic layer 604 and each non-magnetic layer 606 share a common surface with the core 602).

In some implementations, the non-magnetic layers 606 have a thickness that is on the order of a few atomic layers (e.g., three to five atomic layers, corresponding to ~0.6 nm to 1 nm), or on the order of a few nanometers (e.g., 1.5 nm, 2.3 nm). In some implementations, the thicknesses of the non-magnetic layers 606 enable an exchange coupling (e.g., a RKKY coupling) between adjacent magnetic layers 604 in the device 600.

In some implementation, the plurality of non-magnetic layers 606 couples adjacent magnetic layers 604 that are separated by respective non-magnetic layers via the RKKY coupling mechanism.

As shown in FIG. 6, the plurality of magnetic layers 604 and the plurality of non-magnetic layers 606 are arranged in a vertical stack 630 coaxial with the core 602, such that respective magnetic layers of the plurality of magnetic layers 604 are separated by (e.g., interspersed between) respective non-magnetic layers of the plurality of non-magnetic layers 606. In other words, respective magnetic layers 604 alternate with respective non-magnetic layers 606 in the stack 630, and a respective non-magnetic layer 606 is sandwiched between two magnetic layers 604 in the stack 630.

It will be apparent to one of ordinary skill in the art that the number of magnetic layers 604 and the number of non-magnetic layers 606 depicted in the MRAM device 600 of FIG. 6 is purely exemplary. In some implementations, the device 600 may include a larger or smaller number of magnetic layers 604 and non-magnetic layers 606. In some implementations, the stack 530 includes a few magnetic layers 504 (e.g., five or eight). In some implementations, the stack 530 includes tens of magnetic layers 504 (e.g., 15, 25, or 45 magnetic layers). In some implementations, the stack 530 includes a hundred or more magnetic layers. In each of these instances, two adjacent layers are separated by a non-magnetic layer.

In practice, given that each magnetic layer 604 is fairly thin (e.g., on the order of a couple of nm), one would not expect a significant variation of diameter from one layer to the next. However, when stacking tens or hundreds to layers to form the stack 630 in order to achieve large storage densities, one may expect to see variations of the diameters of the magnetic storage elements (e.g., the magnetic layers 604) from the top to the bottom of the stack 630. This variation (or tapering) is observed in practice in magnetic nanostructures due the fabrication process methodology. In some implementations, by tailoring the coupling fields J1 and J2, one can achieve significant switching margins to overcome the distributions of switching currents in a tapered structure whose variations of the diameters does not exceed a threshold percentage (e.g., 10%, 15%, or 20%).

In some implementations, the first non-magnetic layer 606-2 has a third set of characteristics, and the second non-magnetic layer 606-3 has a fourth set of characteristics that at least partially differ from the third set of characteristics. In some implementations, the third and the fourth sets of characteristics include: (i) film thicknesses of the first and second non-magnetic layers; (ii) radii of the first and second non-magnetic layers; and (iii) materials of the first and second non-magnetic layers.

In some implementations, the plurality of non-magnetic layers 606 includes a second plurality of pairs. Each of the second plurality of pairs includes a first non-magnetic member (e.g., layer) and a second non-magnetic member (e.g., layer). The first non-magnetic member has a respective set of characteristics (e.g., a material, a coupling coefficient, a thickness) and the second magnetic member has another respective set of characteristics that at least partially differ from that of the first non-magnetic member. In some implementations, each of the first non-magnetic members has the same characteristics and/or each of the second non-magnetic members has the same characteristics. In some implementations, each of the first non-magnetic members has overlapping characteristics and/or each of the second non-magnetic members has overlapping characteristics. In other implementations, a subset of respective first non-magnetic members, and/or a subset of respective second non-magnetic members have different characteristics.

In some implementations, each and every one of the layers 604 and 606 is cylindrical (e.g., annular, ring) in shape. In some implementations, when the core 602 is not cylindrical in shape, the inner surface of each of the magnetic layers 604 and each of the non-magnetic layers 606 conforms to the shape of the core 602.

In some implementations, each of the plurality of magnetic layers 604 is composed of a ferromagnetic material.

In some implementations and as shown in FIG. 6, the plurality of magnetic layers 604 is arranged in an antiferromagnetic configuration. In other words, adjacent magnetic layers are magnetized in opposite directions.

In some implementations, one or more of the magnetic layers 604 are composed of permalloy.

In some implementations, each of the plurality of non-magnetic layers 606 is composed of a non-magnetic metal (e.g., gold (Au) and/or ruthenium (Ru)). In some implementations, the non-magnetic metal is chosen to match the structure of the ferromagnetic layers. For example, Ru which has a hexagonal closed-packing (HCP) structure may be chosen to match the HCP structure of a cobalt (Co) ferromagnetic layer. As another example, Au which has a cubic structure (e.g., a face-centered cubic structure) may be chosen to match with ferromagnetic Fe which also has a cubic structure (e.g., a body-centered cubic structure).

In some implementations, the plurality of magnetic layers 604 and the plurality of non-magnetic layers 606 is collectively referred to as a stack 630, or a pillar, or a propagation layer (or a propagation stack/structure/portion) of the MRAM device 600. In some implementations, the stack 630 is also known as a soliton propagation ratchet or a Spin Hall ratchet as it enables magnetic instabilities (or magnetic defects) to be transported (e.g., unidirectionally) along the stack 640, as will be described later.

In some implementations, the cylindrical core 602 has a lower electrical resistance than a combined electrical resistance of the plurality of magnetic layers 604 and the plurality of non-magnetic layers 606 in the stack.

In some implementations, the MRAM device 600 has an outer diameter of approximately 20 nm. Alternatively, in some implementations, the outer diameter of the MRAM device 600 is greater than (or less than) 20 nm.

The device 600 includes an input terminal 622 coupled to a first end of the core 602, and a current source 624 that is coupled to the input terminal 622.

In some implementations, the current source 624 is configured to supply current imparting a Spin Hall Effect (SHE) around the circumference (e.g., perimeter, and/or surface of the cylindrical core and/or surface of the cylindrical core that is coaxial with the magnetic and non-magnetic layers) of the cylindrical core 602 (See also FIGS. 15, 24, and 25). As discussed in M. I. Dyakonov, "Spin Hall Effect," arXiv: 1210.3200 [cond-mat.mes-hall], which is hereby incorporated by reference in its entirety, the Spin Hall Effect (SHE) consists in spin accumulation at the lateral boundaries of a current-carrying conductor, the directions of the spins being opposite at the opposing boundaries. For a cylindrical core, the spins wind around the surface of the core. The boundary spin polarization is proportional to the current and changes sign when the direction of the current is reversed. The Spin Hall effect is somewhat similar to the normal Hall effect, where charges of opposite sign accumulate at the sample boundaries due to the action of the Lorentz force in magnetic field. However, there are significant differences. First, no magnetic field is needed for spin accumulation. On the contrary, if a magnetic field perpendicular to the spin direction is applied, it will destroy the spin polarization. Second, the value of the spin polarization at the boundaries is limited by spin relaxation, and the polarization exists in relatively wide spin layers determined by the spin diffusion length, typically on the order of one micron, as opposed to the much smaller Debye screening length where charges accumulate in the normal Hall effect.

In some implementations, each of the plurality of magnetic layers 604 has a respective magnetization (e.g., a vortex magnetization), and the SHE imparted around the circumference of the core contributes to a magnetization of each of the plurality of magnetic layers.

In some implementations, the current source 624 is configured to supply a specific current to change a direction of magnetization (e.g., a vortex magnetization) of a specific one of the plurality of magnetic layers 604 (e.g., from the clockwise magnetization direction 610 to the counterclockwise magnetization direction 608, or vice versa).

In some implementations, the current source 624 is configured to supply a specific current to change a direction of magnetization of a specific set of the plurality of magnetic layers 604 (e.g., the specific set comprising the odd-numbered layers of the plurality of magnetic layers 604, or the even-numbered layers of the plurality of magnetic layers 604).

In some implementations the device 600 includes an output terminal 620 coupled to a second end of the cylindrical core 602 that is opposite to the first end. The output terminal 620 is configured to provide a current readout to a readout component of the magnetic memory device 600 and to form a close circuit with the input terminal 622. Details of the readout component will be described in FIG. 12.

Figure 7A:
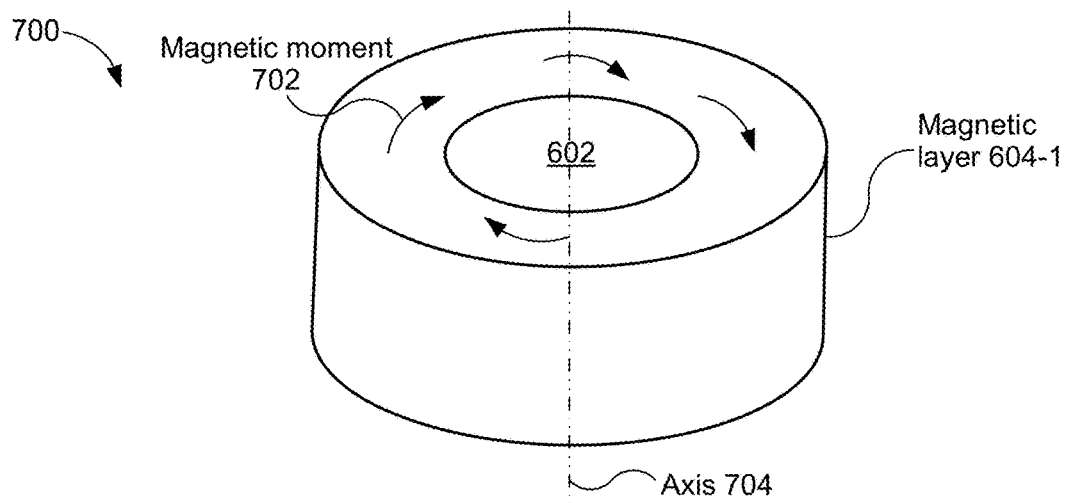
FIGS. 7A to 7C illustrate possible magnetic ground states (or magnetizations) for a magnetic layer 604 of a cylindrical MRAM structure, in accordance with some implementations.
Figure 7B:
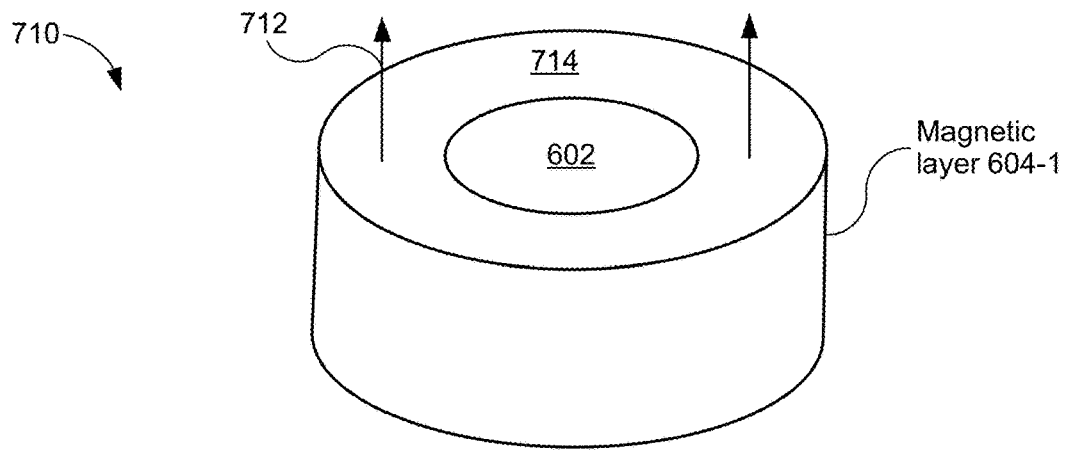
Figure 7C:
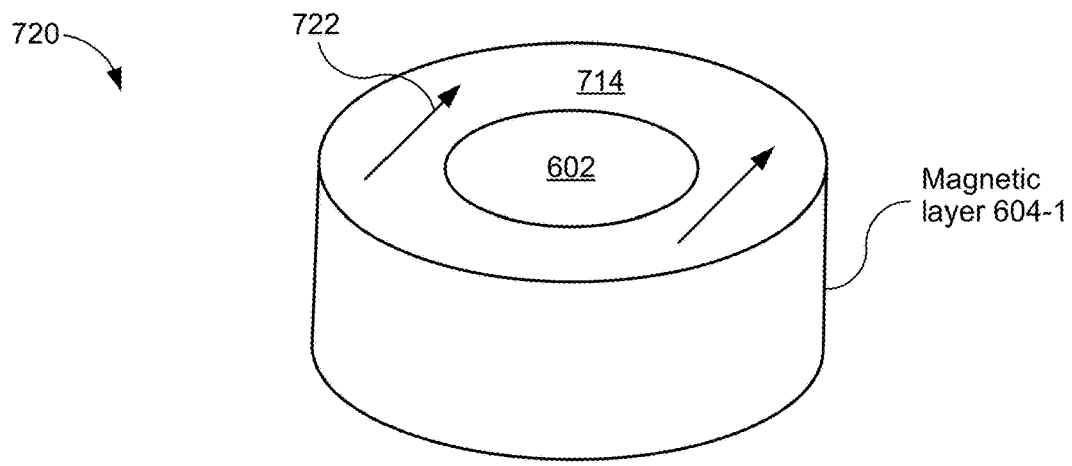

FIGS. 7A-7C illustrate possible magnetic ground states (or magnetizations) for a magnetic layer 604 of a cylindrical MRAM structure (e.g., the cylindrical MRAM device 600), in accordance with some implementations.

A magnetic ground state corresponds to the magnetic anisotropy of a ferromagnetic layer (e.g., the first magnetic layer 604-1) of the MRAM device 600. As explained above with reference to FIG. 1A, a magnetic moment of magnetically anisotropic materials will tend to align with an "easy axis," which is the energetically favorable direction of spontaneous magnetization. In some implementations and instances, the two opposite directions along (or about) an easy axis are equivalent, and the direction of magnetization can be along (or about) either of them. As will be described in more detail with reference to FIGS. 8A-8B, the magnetic ground state for a ferromagnetic layer is dictated by characteristics of the ferromagnetic layer (e.g., height, thickness, and material composition of the ferromagnetic layer) and the characteristics of the core 602 (e.g., height, radius, and material composition of the core 602). In the examples of FIGS. 7A to 7C, the first magnetic layer 604-1 is identified as the one of the plurality of magnetic layers 604, but it will be apparent to one of ordinary skill in the art that the description is equally applicable to other ones of the plurality of magnetic layers 604.

FIG. 7A illustrates a vortex magnetic ground state 700 (or vortex magnetization) in accordance with some implementations. In the vortex magnetic ground state 700, a magnetic moment 702 (e.g., direction of magnetization) of the first annular/cylindrical ferromagnetic layer 604-1 rotates around the core 602. For example, the core 602 is positioned along an axis 704 and the magnetic moment 702 of first magnetic layer 604-1 rotates around (e.g., about) the axis 704 within (e.g., in-plane) the first cylindrical magnetic layer 604-1. In some implementations, the magnetic moment 702 rotates around the core 602 in a clockwise direction (e.g., the clockwise magnetization direction 610). Alternatively, in some implementations, the magnetic moment 602 rotates around the core 602 in a counterclockwise direction (e.g., the counterclockwise magnetization direction 608). Although not shown in FIG. 7A, the magnetic moment 702 of the first magnetic layer 604-1 rotates around the core 602 through a cross section of the first magnetic layer 604-1.

FIG. 7B illustrates a perpendicular magnetic ground state (or perpendicular magnetization) in accordance with some implementations. The arrows 712 represent a direction of the magnetic moment of the bulk material of the first magnetic layer 604-1 (e.g., the first ferromagnetic layer). In some implementations, the magnetic field lines (not shown) extend out of a planar surface 714 of the first magnetic layer 604-1 in the same direction represented by the arrows 712 (e.g., upwards) and in doing so, the magnetic moment 712 of the bulk material of the first magnetic layer 604-1 parallels the axis 704 of the core 602. In some implementations, the magnetic moment 712 of the bulk material of the first magnetic layer 604-1 parallels the axis 704 of the core 602 and the magnetic field in a first direction (e.g., upwards). Alternatively, in some implementations (not shown), the magnetic moment 712 of the bulk material of the first magnetic layer 604-1 parallels the axis 704 of the core 602 and the magnetic field in a second direction (e.g., downwards). Although not shown in FIG. 7B, the magnetic moment 712 of the bulk material of the first magnetic layer 604-1 extends through a cross section of the first magnetic layer 604-1.

FIG. 7C illustrates an in-plane magnetic ground state (or in-plane magnetization) in accordance with some implementations. In the in-plane magnetic ground state, a magnetic moment 722 of the first magnetic layer 604-1 parallels the planar surface 714 of the first magnetic layer 604-1. In doing so, the magnetic moment 722 of the first magnetic layer 604-1 is perpendicular to the axis 704 of the core 602. In some implementations, the magnetic moment 722 parallels the planar surface 714 of the first magnetic layer 604-1 in a first direction (e.g., rightwards). Alternatively, in some implementations, the magnetic moment 722 parallels the planar surface 714 of the first cylindrical ferromagnetic layer 502 in a second direction (e.g., leftwards). Although not shown in FIG. 7C, the magnetic moment 722 of the first magnetic layer 604-1 extends through the cross section of the first magnetic layer 604-1. Because the structure possesses radial symmetry, every magnetization direction is energetically equivalent in the radial plane in the in-plane ground state. Accordingly, the magnetization direction may be equally likely to be pointing rightwards or leftwards or in any other direction in the radial plane. In some implementations and situations, this ground state (e.g., having a magnetic layer with the in-plane magnetic ground state) is not preferred when it comes to encoding information as there is no energy barrier to overcome to go from the anti-parallel to the parallel configuration and the system could assume any angular configuration in-between which is not ideal for storing a bit.

In some implementations, material composition of a ferromagnetic layer is tailored to a specific magnetic ground state. For example, ferromagnetic layers with a lower exchange energy prefer the vortex magnetic ground state 700 (e.g., lower relative to a baseline). In some implementations, lowering the exchange energy of a ferromagnetic layer is achieved by increasing and/or decreasing a proportion of one or more elements/compounds that compose the ferromagnetic layer. For example, increasing a proportion of Fe (e.g., from a baseline) in the ferromagnetic layer deceases the exchange energy of the ferromagnetic layer. Additionally, and/or alternatively, lowering the exchange energy of a ferromagnetic layer is achieved by using a combination (bilayer) of CoFeB and other layers, such as permalloy, which lowers the overall exchange stiffness of the layer.

Conversely, in some implementations, ferromagnetic layers with a high exchange energy prefer for the perpendicular magnetic ground state 710. For example, increasing a proportion of Co (e.g., from a baseline) in the ferromagnetic layer increases an exchange energy of the ferromagnetic layer. Other material properties, such as saturation magnetization and uniaxial anisotropy, are also considered for tailoring.

Figure 8A:
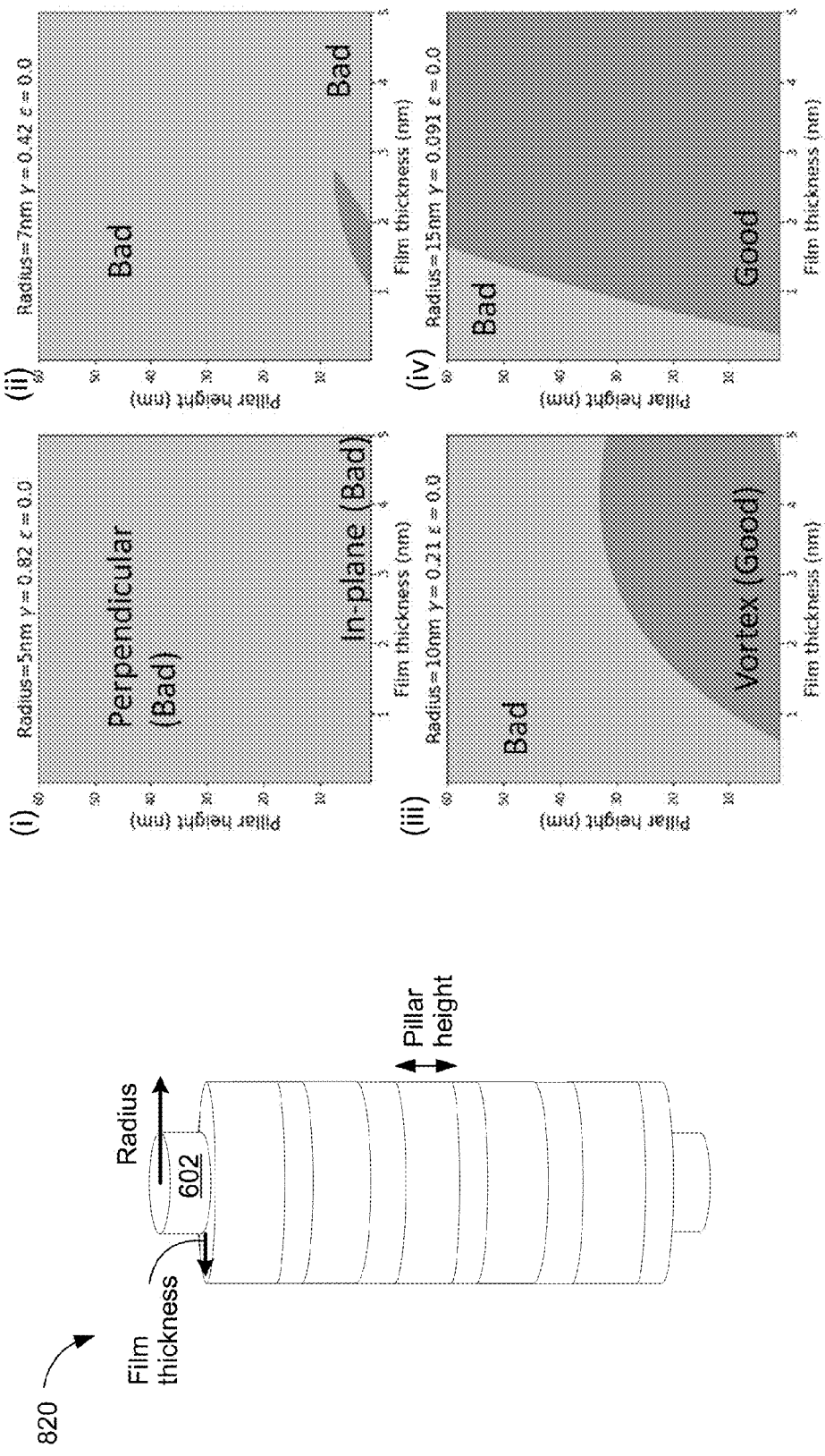
FIGS. 8A and 8B are phase diagrams showing the relationship between dimensions of a cylindrical MRAM device and the various magnetic ground states (e.g., perpendicular, in-plane, and vortex magnetic ground states) for permalloy and iron ferromagnetic layers, in accordance with some implementations.
Figure 8B:
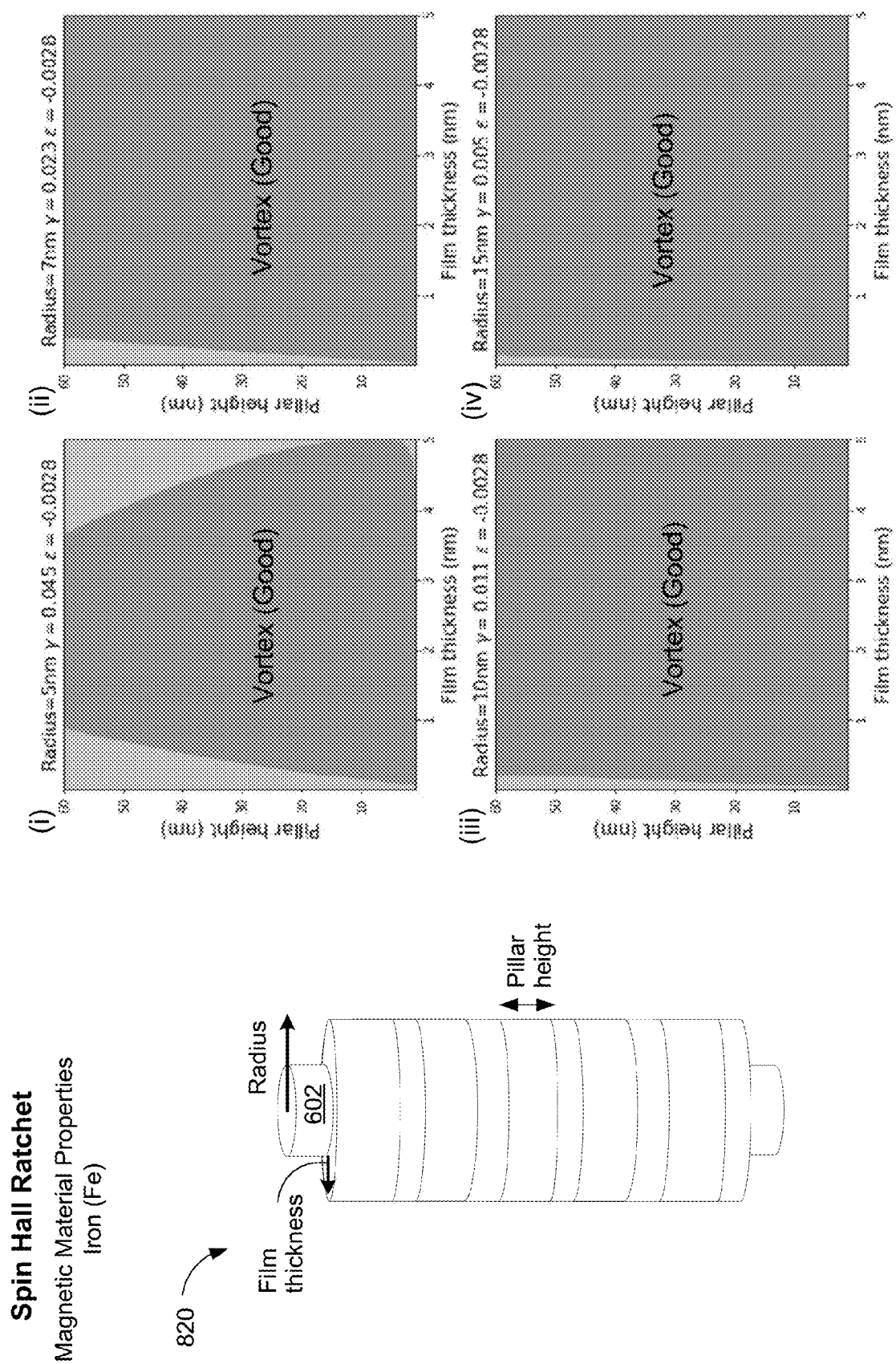

FIGS. 8A and 8B are phase diagrams showing the relationship between dimensions of the cylindrical MRAM device 600 and the various magnetic ground states (e.g., perpendicular, in-plane, and vortex magnetic ground states) for permalloy and iron ferromagnetic layers respectively, in accordance with some implementations.

In some implementations, the vortex magnetic ground state that is depicted in FIGS. 6 and 7A is the preferred magnetic ground state for MRAM devices that are used as magnetic shift registers (or as Spin Hall ratchets).

A magnetic ground state of a magnetic layer 604 (e.g., a ferromagnetic layer) is based, at least in part, on a set of characteristics of the magnetic layer 604. In some implementations, the set of characteristics includes one or more of: (i) a thickness (e.g., radius or annular radius) of the ferromagnetic (e.g., permalloy) layer, (ii) a height of the ferromagnetic layer, (iii) exchange energy of the ferromagnetic layer, (iv) saturation magnetization of the ferromagnetic layer, and (v) uniaxial anisotropy of the ferromagnetic layer. Additionally, in some implementations, the magnetic ground state of the magnetic layer 604 is further based on a set of characteristics of the core 602. In some implementations, the set of characteristics of the core 602 includes one or more of: (i) a radius of the core 602 relative to the thickness of the ferromagnetic layer and (ii) a height of the core 602.

A legend 820 illustrates dimensions discussed below with reference to the phase diagrams in FIGS. 8A and 8B. Here, "Pillar Height" refers to the height of an individual cylindrical magnetic layer. In some implementations and according to FIGS. 8A and 8B, the "pillar height" (Y-axis of the phase diagrams) ranges from 0 to 60 nm. "Film thickness" refers to the radial thickness ($R_{outer}$-$R_{inner}$) of the annular layer. In some implementations and according to FIGS. 8A and 8B, the "film thickness ranges from 0 to 5 nm. These numbers are exemplary and the actual numbers could be increased or decreased. "Radius" refers to a combined radius of the core 602 and the radius of the annular magnetic and non-magnetic layers. The "Radius" is a fixed dimension (e.g., 5 nm, 7 nm, 10 nm, 15 nm, 20 nm, etc.), and therefore an increase in the film thickness results in a corresponding decrease in the radius of the core 602 (and vice versa). In some implementations, the stack comprises magnetic layers and non-magnetic layers having different film thicknesses and the X-axis corresponds to an average film thickness of the stack in these instances.

The phase diagrams of FIG. 8A show that the perpendicular magnetic ground state 710 tends to form in tall (e.g., elongated) cylindrical MRAM structures with small film thicknesses (e.g., magnetic layers having relatively small annular radii, or are thin relative to a radius of the core 602 and/or the Radius of the vertical stack 630). In some implementations or instances, the perpendicular magnetic ground state 712 tends to form when a ratio between the pillar height and the width/thickness of the magnetic layer 604 satisfies a threshold, where the ratio corresponds to an energetically favorable direction of spontaneous magnetization. For example, when the ratio between the pillar height and the film thickness satisfies the threshold, meaning that the magnetic layer 604 is sufficiently tall and thin, the energetically favorable direction of spontaneous magnetization is along the height (e.g., in a height dimension, as shown by the upward arrows) of the magnetic layer 604. Such is the result because it is energetically more favorable for the magnetic moment of the magnetic layer 604 to lie along the axis of the core (in the height direction) than it is for the magnetic moment to lie in the plane (e.g., along the width), based on the dimensions of the magnetic layer 604 (e.g., the height dimension is the "easy axis").

In some implementations or instances, the parallel (or in-plane) magnetic ground state 720 tends to form when the ratio between the pillar height and the film thickness does not satisfy the threshold. The in-plane magnetic ground state 720 favors "short" cylindrical MRAM structures (e.g., having small pillar heights) with "thick" ferromagnetic film layers (e.g., thick relative to the pillar height). In such cases, it is easier for the magnetic moment of the first ferromagnetic layer 604-1 to lie perpendicular to the axis of the core 602 (in the thickness dimension) than it is for the magnetic moment to lie perpendicular to the axis of the core, based on the dimensions of the first ferromagnetic layer 604 (e.g., the thickness dimension is the "easy axis").

As shown in FIG. 8A, for a magnetic layer comprising permalloy, the perpendicular magnetic ground state 720 occupies the majority of the phase diagrams (i), (ii), and (iii). The phase diagrams (iii) and (iv) show that as the radius increases, the vortex magnetic ground state 700 (or vortex magnetization) becomes increasingly favorable for permalloy magnetic layers having large film thicknesses and large pillar heights.

In some implementations and as shown in the phase diagrams of FIGS. 8A(i) and 8A(ii), a magnetic film with a sub-nm pillar height may exhibit a vortex magnetic ground state when the device radius is 10 nm or more. Accordingly, one may pack (e.g., densely pack) many layers on top of each other and still achieve a small pillar height.

The phase diagrams of FIG. 8B show that the vortex magnetic ground state tends to form in cylindrical MRAM devices whose magnetic layers comprise iron, and with radii ranging from 5 nm to 15 nm.

Figure 9A:
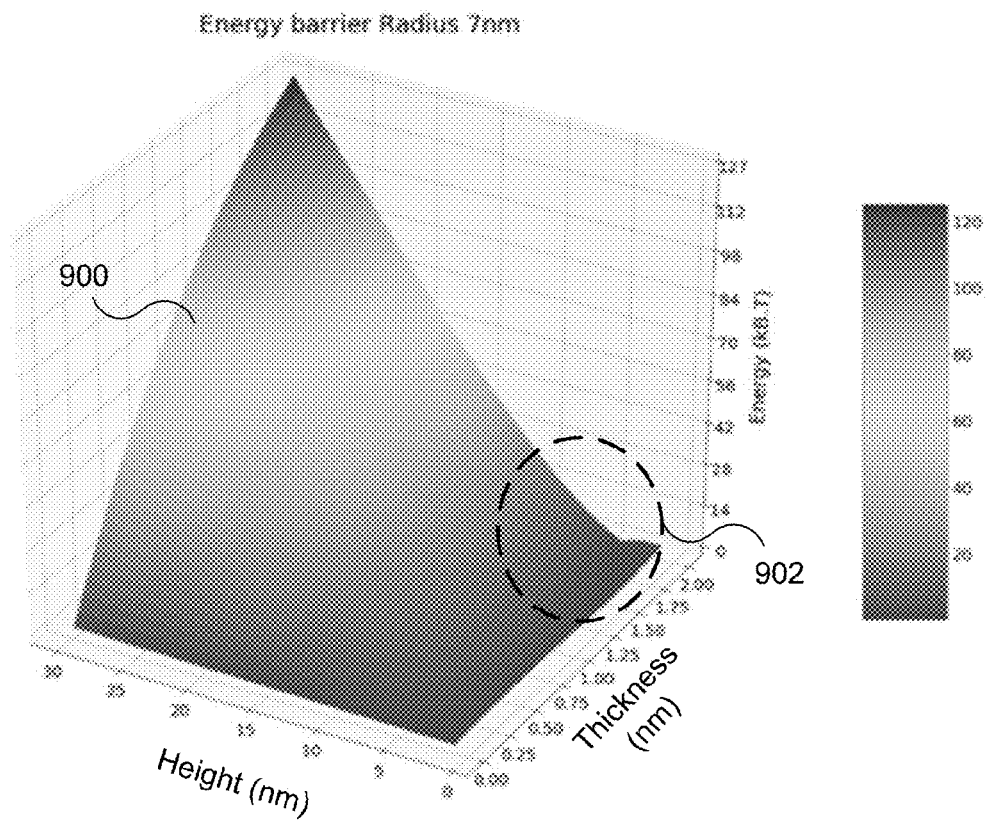
FIGS. 9A and 9B illustrate various energy barrier diagrams for the cylindrical MTJ structure in accordance with some implementations.
Figure 9B:
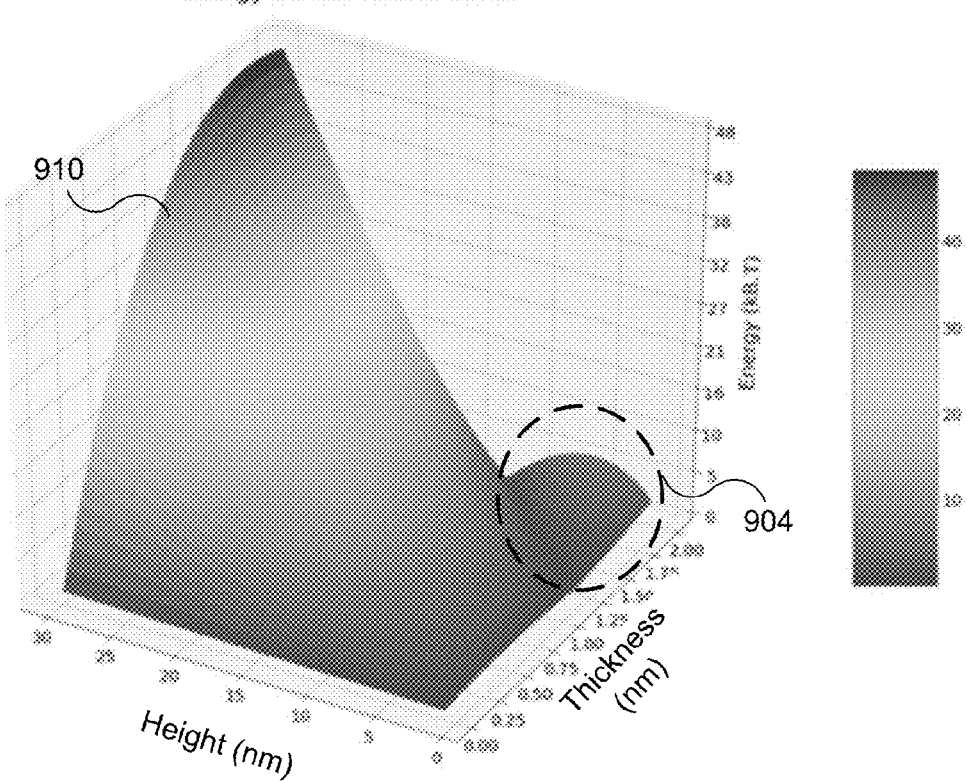

FIGS. 9A-9B shows representative energy barriers that at least partially correspond to the phase diagrams of FIGS. 8A-8B in accordance with some implementations. It should be noted that the "Height" and the "Thickness" in FIGS. 9A and 9B have the same definition as the "Pillar Height" and "Film thickness" described in FIGS. 8A and 8B. The dimensions for "Height" and "Thickness" shown in FIGS. 9A-9B are merely one set of possible dimensions.

FIG. 9A shows a representative energy barrier 900 that at least partially corresponds to the phase diagram 800 of FIG. 8A. An "energy barrier" refers to the amount of energy the magnetic material must overcome in order to switch from one magnetization direction to its opposite (e.g., from the state 114 to the state 116, FIG. 1B). Thus, as the energy barrier for a ferromagnetic layer increases, the ferromagnetic layer is said to become more thermally stable. Increasing the thermal stability of a ferromagnetic layer results in a greater energy input being required to switch the magnetization direction of the ferromagnetic layer. With reference in FIG. 9A, as pillar height and film thickness of the ferromagnetic layer increases, the representative energy barrier 900 for the ferromagnetic layer also increases. In this particular example, the increase in thermal stability is fairly uniform.

In some implementations, the magnetic ground state of the ferromagnetic layer affects the thermal stability of the ferromagnetic layer. For example, if the ferromagnetic layer is in a first magnetic ground state (e.g., the vortex magnetic ground state), then the thermal stability of the ferromagnetic layer may differ from a thermal stability of a ferromagnetic layer in a second magnetic ground state (e.g., the perpendicular magnetic ground state). To illustrate, with reference to FIG. 9B, the region 904 (dotted circle) shows an energy barrier bulge in the representative energy barrier 910, which is not present in the representative energy barrier 900 (e.g., the region 902 (dotted circle) does not include a corresponding energy barrier bulge and instead continues uniformly upwards toward a peak energy barrier). The energy barrier bulge 904 shown in FIG. 9B, in some circumstances, is caused by the ferromagnetic layer being in the vortex magnetic ground state (e.g., FIG. 8A). The energy barrier bulge 904 corresponds to the vortex magnetization region shown in the bottom left phase diagram of FIG. 8A.

FIGS. 10A-10B show representative energy barriers of a ferromagnetic layer in different magnetic ground states in accordance with some implementations. As discussed above, the energy barrier refers to the amount of energy the magnetic material must overcome in order to switch from one magnetization direction to its opposite (e.g., from the state 1002 to the state 1004). FIG. 10A shows low energy states 1002 and 1004 for a ferromagnetic layer in a vortex magnetic ground state and multiple energy barriers 1006-A, 1006-B, and 1006-C. In this example, the low energy state is achieved in both 1002 and 1004 magnetic configurations, 1002 corresponds to a counterclockwise magnetization direction and 1004 corresponds to a clockwise magnetization direction. 1002 and 1004 have equivalent energies at equilibrium without external perturbations.

FIG. 10B shows low energy states 1012 and 1014 for a ferromagnetic layer in a perpendicular magnetic ground state and multiple energy barriers 1016-A and 1016-B. In this example, the low energy state 1012 corresponds to a first magnetization direction of the perpendicular magnetic ground state (e.g., upwards) and the lower energy state 1014 corresponds to a second magnetization direction of the perpendicular magnetic ground state (e.g., downwards). In some implementations, a respective energy barrier for the ferromagnetic layer in the vortex magnetic ground state differs from a respective energy barrier for the ferromagnetic layer in the perpendicular magnetic ground state (e.g., less energy is required to overcome the energy barrier 1006 relative to an amount of energy required to overcome the energy barrier 1016, or vice versa). It is noted that the illustrated Δ Energies are not necessarily drawn to scale.

In some implementations or instances, a first ferromagnetic layer in a first magnetic ground state with a first set of characteristics has an energy barrier (e.g., energy barrier 1006-A) that differs from an energy barrier (e.g., energy barrier 1006-B) of a second ferromagnetic layer in the first magnetic ground state with a second set of characteristics. Put plainly, as discussed above with reference to FIGS. 8A-8B and 9A-9B, an energy barrier for a ferromagnetic layer will differ depending on a geometry of the ferromagnetic layer. To illustrate, FIG. 10A includes three different energy barriers 1006-A, 1006-B, and 1006-C, which gradually increase as a result of the geometry of the ferromagnetic layer changing (e.g., increase in layer thickness and/or decrease in layer height). Further, FIG. 10B includes two different energy barriers 1016-A and 1006-B, which gradually increase as a result of the geometry of the ferromagnetic layer changing (e.g., decrease in layer thickness and/or increase in layer height).

In some implementations, the magnetic ground state of the ferromagnetic changes momentarily from a first magnetic ground state in the low energy states (e.g., vortex magnetic ground state at low energy states 1002 and 1004) to a second magnetic ground state in a high energy state (e.g., perpendicular magnetic ground state at high energy state 1007). To illustrate this phenomenon, assume the "angle" of the low energy state 1002 is "0" degrees and further assume the angle of the low energy state 1004 is "180" degrees (e.g., the low energy state 1004 is opposite to the low energy state 1002). Thus, the midpoint between the two low energy states is "90" degrees (e.g., the angle at the high energy state is perpendicular to the respective angles at low energy states 1002 and 1004). Accordingly, as shown in FIG. 10A, the ferromagnetic layer momentarily has the perpendicular magnetic ground state 1007 when switching from the counterclockwise vortex magnetization direction to the clockwise vortex magnetization direction (e.g., at the high energy state). A similar result is illustrated in FIG. 10B. For example, the ferromagnetic layer momentarily has either the vortex magnetic ground state 1018 or the parallel magnetic ground state 1019 when switching from the upwards to downwards.

Figure 11:
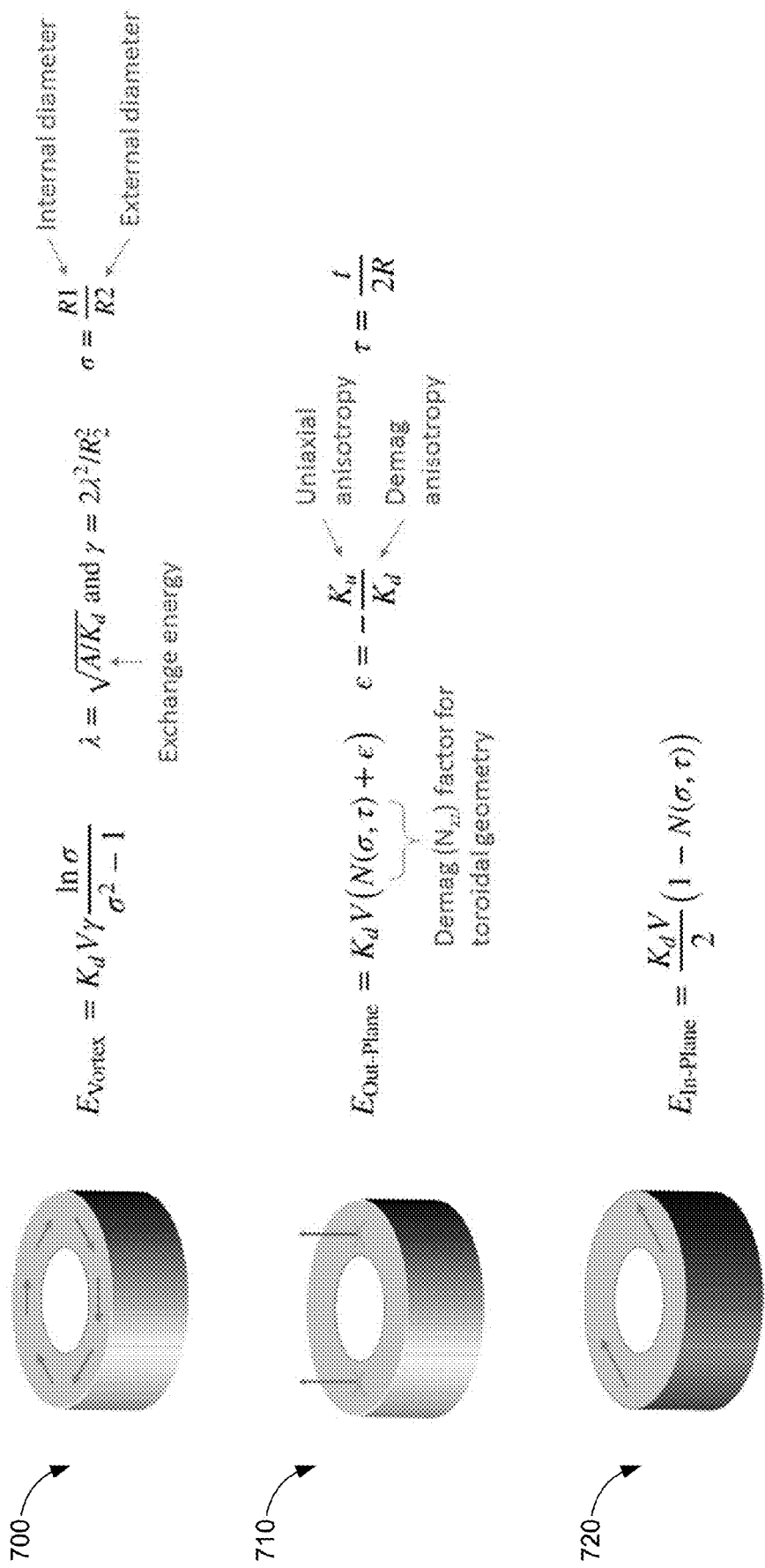
FIG. 11 provides representative energy barrier equations for various magnetization orientations in accordance with some implementations.

FIG. 11 provides representative energy barrier equations for various magnetization orientations in accordance with some implementations. The parameters labeled in FIG. 11 (e.g., exchange energy, demagnetization (demag) anisotropy, uniaxial anisotropy, inner diameter, and external diameter) relate to characteristics of the first ferromagnetic layer, as discussed above (e.g., magnetization orientation tailoring). Additionally, changing one or more of the parameters in the various equations may result in an energy barrier for the first ferromagnetic layer also changing (e.g., as shown in FIGS. 10A-10B). For ease of illustration and discussion, the barrier layer 504 and the second cylindrical layer 506 are not included in FIG. 11. However, one skilled in the art will appreciate that the equations apply equally to the second ferromagnetic layer 506.

As described in FIG. 6, the MRAM device 600 includes the output terminal 620 that is coupled to the second end of the cylindrical core 602 opposite to the first end. In some implementations, the output terminal 620 of the MRAM device is configured to provide a current readout to a readout component 1200.

Figure 12:
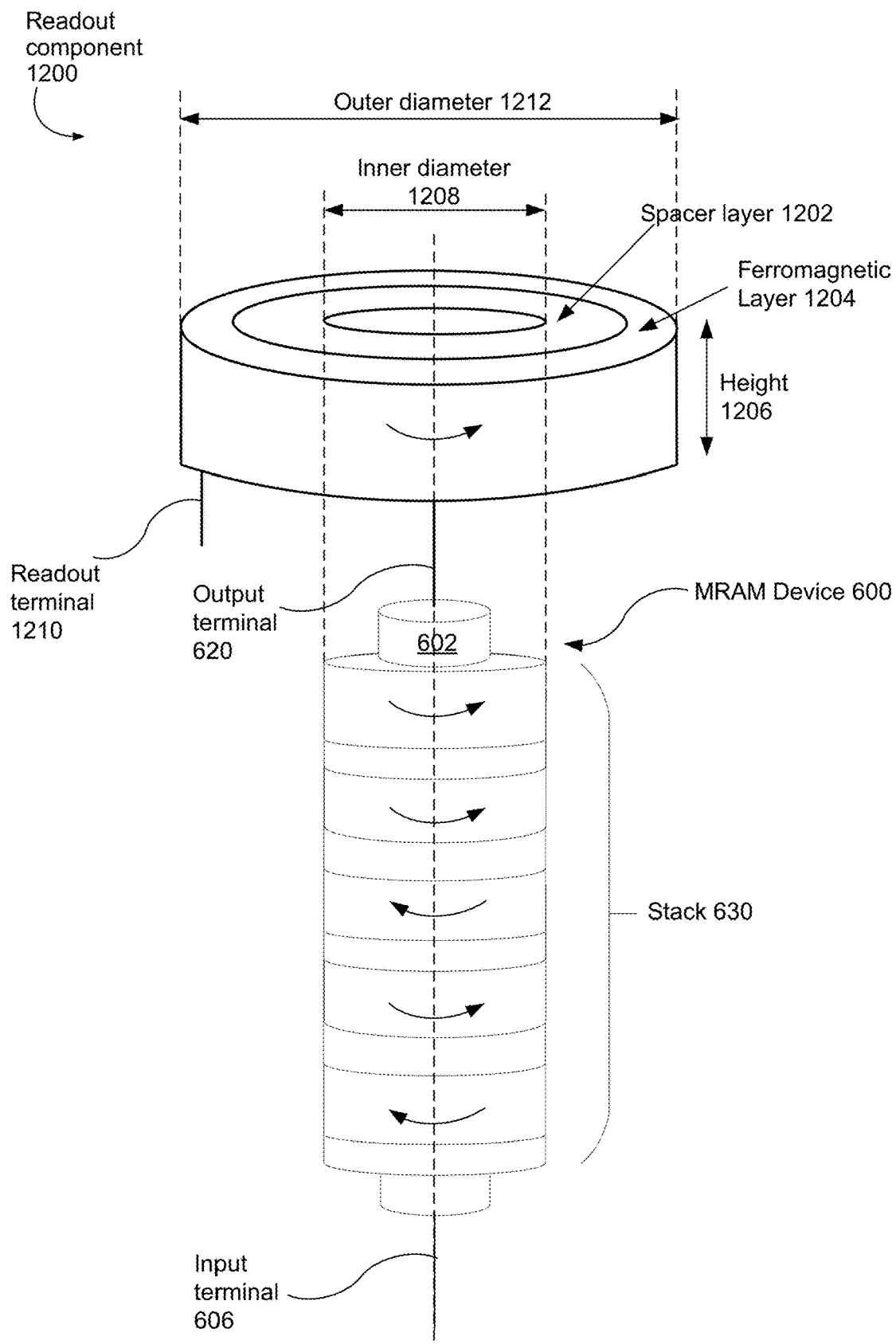
FIG. 12 illustrates a readout component for a MRAM device, in accordance with some implementations.

FIG. 12 illustrates the readout component 1200 for the MRAM device 600, in accordance with some implementations.

In some implementations, in order to utilize the SHE to write the state of the MRAM device 600, the radial thicknesses of the magnetic layers 604 need to be fairly narrow, which precludes being able to read out on the top of the MRAM device 600. In some implementations, the read out is accomplished using a concentric Magnetic Tunnel Junction MTJ that comprises a "inner magnetic metal/insulator/outer magnetic metal" structure, in which the inner magnetic metal comprises one or more of the magnetic layers 604 in the stack 630 and the outer magnetic metal comprises a concentric ferromagnetic layer (e.g., a Fe layer) distinct from the magnetic layers 604 and having a fixed vortex magnetization state. By passing current radially through the MRAM device 600, the tunneling current would depend on the relative alignment of the magnetization of the magnetic layers in the ratchet and the magnetization in the outer layer of the device, thereby enabling a readout of the magnetic state of the underlying (e.g., inner) magnetic layers in the ratchet 630.

In some implementations, the readout component 1200 is annular (e.g., ring) in shape and includes a concentric (e.g., annular, ring-shaped) spacer layer 1202 and a concentric (e.g., annular, ring-shaped) ferromagnetic layer 1204 that surrounds the spacer layer 1202. The readout component 1200 has an inner diameter 1208, an outer diameter 1212, and a height 1206. The ferromagnetic layer 1204 has a fixed (e.g., predefined) magnetization direction (e.g., a vortex magnetization).

In some implementations the readout component 1200 is coaxial with the cylindrical core 602 and surrounds a region of the stack 630. The inner diameter 1208 of the readout component 1200 is designed to fit over the stack 630 (e.g., the inner diameter 1208 matches the outer diameter of the stack 630). Thus, the readout component surrounds (e.g., overlaps with) a portion of the trunk of the stack 630, e.g., a top portion, a middle portion, a bottom portion of the stack 630. The area/volume defined by the inner diameter 1208 and the height 1206 includes at least one magnetic layer of the plurality of magnetic layers 604 of the stack 630.

Accordingly, the ferromagnetic layer 1204, the spacer layer 1202, and the at least one magnetic layer of the plurality of magnetic layers 604 of the stack 630 forms an MTJ structure (e.g., in the MTJ structure 100 in FIG. 1A). Here, the ferromagnetic layer 1204 is the reference layer and the at least one magnetic layer of the plurality of magnetic layers 604 is the free (or storage) layer. The resistance state of the readout component 1200 is determined by the fixed magnetization direction of the ferromagnetic layer 1204 and the effective magnetization of the at least one magnetic layer of the plurality of magnetic layers 604 (e.g., the free layer). For example, when the magnetization (e.g., vortex magnetization) of the ferromagnetic layer 1204 is aligned in the same direction as the effective magnetization of the at least one magnetic layer of the plurality of magnetic layers 604 in the stack 630, the readout component 1200 corresponds to a parallel configuration. The parallel configuration is also sometimes referred to as a "low (electrical) resistance" state. Alternatively, when the magnetization (e.g., vortex magnetization) of the ferromagnetic layer 1204 is aligned in the opposite direction as the effective magnetization of the at least one magnetic layer of the plurality of magnetic layers 604 in the stack 630, the readout component 1200 corresponds to an anti-parallel configuration. The anti-parallel configuration is also sometimes referred to as a "high (electrical) resistance" state.

In some implementations, the area/volume defined by the inner diameter 1208 and the height 1206 includes exactly one magnetic layer 604 in the stack 630. In this instance the single magnetic layer is the free layer. Thus, when the magnetization direction of the exactly one magnetic layer 604 is aligned in the same direction as the fixed magnetization direction of the ferromagnetic layer 1204, it corresponds to the "low (electrical) resistance" state (e.g., bit "0"). When the magnetization direction of the exactly one magnetic layer 604 is aligned in the opposite direction as the fixed magnetization direction of the ferromagnetic layer 1204, it corresponds to the "high (electrical) resistance" state (e.g., bit "1").

In some implementations, the height 1206 of the readout component 1200 corresponds to the surrounding of a single magnetic layer 604 in the stack 630. In this instance the single magnetic layer is the free layer.

In some implementations, the area/volume defined by the inner diameter 1208 and the height 1206 includes two or more magnetic layers 604 in the stack 630. In this instance, the two or more magnetic layers surrounded by the readout component act as the free layer and the magnetization direction of the free layer is the effective magnetization direction of the two or more layers. In some implementations, the effective magnetization of the two or more layers can be calculated by treating the system as multiple MTJs in parallel and calculating the effective parallel magnetization (e.g., resistance).

In some implementations and as illustrated in FIG. 12, the readout component 1200 further includes a readout terminal 1210 that is connected to the ferromagnetic layer 1204. The readout terminal 1210 is configured to close a readout circuit with the output terminal 620.

In some implementations, the spacer layer 1202 is composed of a dielectric material. In some implementations, the dielectric material is an insulator material. In some implementations, the spacer layer includes MgO.

In some implementations, the MRAM device 600 includes multiple readout components 1200, each readout component 1200 surrounding (e.g., overlapping with) a respective distinct portion of the stack 630. Thus, each of the readout components 1200 forms an MTJ structure with the at least respective one magnetic layer of the plurality of magnetic layers 604 that it surrounds, and each of the readout components 1200 effectively reads out a low resistance state and or a high resistance state depending on the magnetization direction of the at least respective one magnetic layer of the plurality of magnetic layers 604 and the fixed magnetization of the respective ferromagnetic layer 1204.

FIGS. 13A to 13K illustrate an exemplary process for shifting magnetic bits in the perpendicularly magnetized ferromagnetic layers of the MRAM system 500 (e.g., MRAM device) of FIG. 5.

In some implementations, by controlling the thickness of each magnetic layer (e.g., the magnetic layer 504) and the exchange coupling (e.g., the first coupling 512 and the second coupling 514) between the layers, the MRAM system 500 acts like a ratchet that allows information in the form of a sharp magnetic kink soliton to be unidirectionally pumped (e.g., moved, shifted, or propagated) from one magnetic layer to another.

Figure 13A:
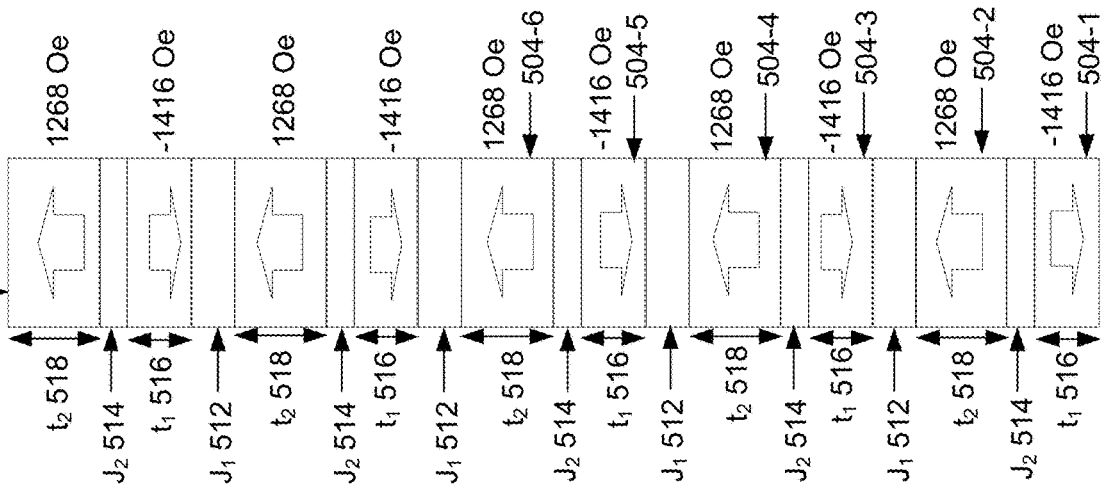
FIGS. 13A to 13J illustrate propagation of a magnetic instability in an MRAM system, in accordance with some implementations.

In the numerical example illustrated by FIGS. 13A to 13K, the block arrows in each of the magnetic layers 504 represent the actual magnetization direction (e.g., up or down) of the layer. The MRAM system 500 has the following values: first thickness ($t_1$) 516=0.7 nm; second thickness ($t_2$) 518=0.8 nm; first coupling ($J_1$) 512=650 Oe nm; second coupling ($J_2$) 514=180 Oe nm; and coercive field $H_C$=230 Oe. It is noted that a positive coupling value (i.e., J>0) represents an antiferromagnetic coupling and a negative coupling value (i.e., J<0) represents a ferromagnetic coupling. In FIG. 13A, the MRAM system 500 is in an antiferromagnetic configuration.

In some implementations, information in the system 500 (e.g., in the form of magnetic bits of "1" and "0," formed by adjacent magnetic layers) is shifted when the magnetization direction of a respective magnetic layer 504 is switched. To switch a particular magnetic layer 504, one must overcome both its coercive field ($H_c$) and the antiferromagnetic coupling with its neighbors (e.g., the magnetic layers that are immediately above and below the particular magnetic layer). The switching field (in Oe) of the $i^{th}$ magnetic layer, $H_{SW}(i)$, may be computed using:

$$H_{SW}(i) = -\mu_i H_C + (\mu_{i-1} J_{i-1/2} + \mu_{i+1} J_{i+1/2})/t_i \quad (1)$$

where $\mu_i$ denotes the sign of the magnetization of the i-th magnetic layer $\mu_i = M_i/|M_i|$, $H_C$ is the coercive field, $J_i$ is the coupling of the $i^{th}$ magnetic layer and $t_i$ is the thickness of the $i^{th}$ magnetic layer.

Suppose $\mu_i = -1$, and correspondingly $\mu_{i+1} = \mu_{i-1} = 1$, the downward switching field $H_{SW}(down)$, defined here as the switching field required to switch a magnetic layer to the down magnetization direction from the up magnetization direction, is:

$$H_{SW}(down) = H_C + (J_1 + J_2)/t_i \quad (2)$$

Suppose $\mu_i = 1$, and correspondingly $\mu_{i+1} = \mu_{i-1} = -1$, the upward switching field $H_{SW}(up)$, defined here as the switching field required to switch a magnetic layer to the up magnetization direction from the down magnetization direction, is:

$$H_{SW}(up) = -H_C - (J_1 + J_2)/t_i \quad (3)$$

FIG. 13A shows the computed values of the switching fields $H_{SW}$ (in Oe) next to each of the magnetic layers 504. Because of the different values of $t_1$ and $t_2$, the magnetic layers having an up magnetization direction (e.g., 504-2, 504-4 etc.) have a different switching field $H_{SW}$ from the magnetic layers having a down magnetization direction (e.g., 504-1, 504-3 etc.). To switch a magnetic layer from the up direction to the down direction requires an applied field of H>$H_{SW}$(down). To switch a magnetic layer from the down direction to the up direction requires an applied field H<$H_{SW}$(up).

Figure 13B:
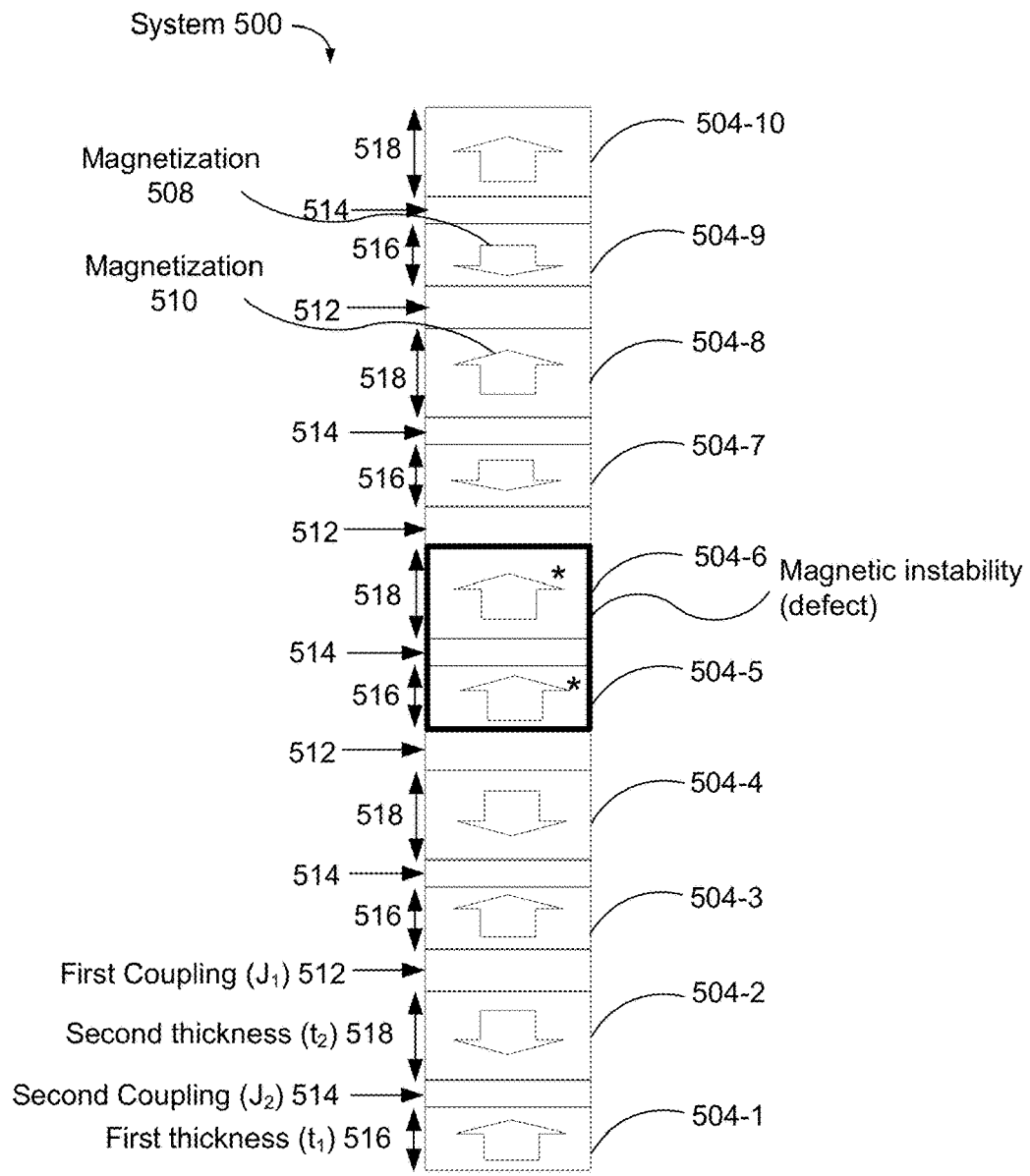

FIG. 13B, which has been adapted from Lavrijsen et al., shows a magnetic instability in the system 500 in accordance with some implementations. A magnetic instability (or a defect) is associated with two adjacent magnetic layers having a same magnetization direction. Suppose a device has a ground state comprising a sequence of "up" and "down" magnetization directions (Obviously the reverse sequence is also an acceptable magnetic ground state). A magnetic instability (or a defect) is then identified as a transition from the ground state to its reverse sequence. For a simple antiferromagnetic structure "up-down" a defect will exhibit two consecutive layers with the same orientation (e.g., going from "up-down" to "down-up" or vice versa). In some implementations, a magnetic instability formed by two adjacent magnetic layers is also known as a sharp kink soliton (or a soliton). All magnetic layers either above or below need to be switched to return the system to the ground state. In some implementations, information is contained in two adjacent magnetic layers. In some implementations, information is contained in two adjacent magnetic layers having the same magnetization direction.

FIG. 13B shows that the MRAM system 500 is in an antiferromagnetic configuration with the exception of the adjacent magnetic layers 504-5 and 504-6 that are both magnetized in the upward magnetization direction. In this instance, the lowest-energy position of a soliton to reside is between layers coupled by J2, because J2<J1. In other examples and instances (e.g., in systems having different coupling values and/or thicknesses), the magnetic instability may be located in another two adjacent magnetic layers and/or may have a different magnetization direction (e.g., a downward magnetization direction). In some implementations, the system 500 may have more than one magnetic instability. Each of the magnetic instabilities is associated with two adjacent magnetic layers that both have an upward or a downward magnetization direction.

Figure 13C:
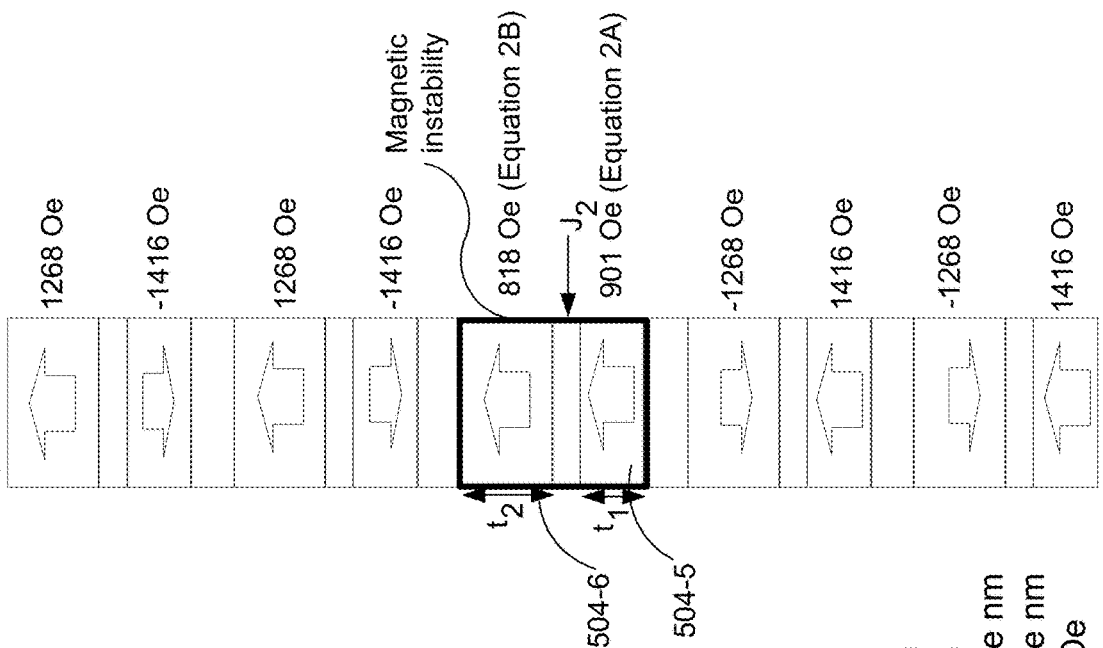

FIG. 13C shows the computed values of the switching fields $H_{SW}$ for each of the magnetic layers 504 in the system 500. The switching field required to switch the magnetic layer 504-5 from the up magnetization direction to the down magnetization direction, $H_{SW,1}$(defect,down), is given by Equation 2A:

$$H_{SW,1}(\text{defect,down})=H_C+(J_1-J_2)/t_1 \qquad (2A)$$

The switching field required to switch the magnetic layer 504-6 from the up magnetization direction to the down magnetization direction, $H_{SW,2}$(defect,down), is given by Equation 2B:

$$H_{SW,2}(\text{defect,down})=H_C+(J_1-J_2)/t_2 \qquad (2B)$$

Notice that the sign in front of $J_2$ in both Equations (2A) and (2B) is negative. This is because of the presence of a defect which means that the sign of the magnetization of the (i−1)th layer is the same as the sign of the i-th layer, namely $\mu_{i-1}=\mu_i=\mu_{i+1}$.

When a magnetic field (e.g., an external magnetic field) is applied, the magnetic layer that has the lowest switching field is the first magnetic layer to change (e.g., reverse, flip) its magnetization direction. In FIG. 13C, the magnetic layer 504-6 has the lowest switching field and thus it is the first magnetic layer to switch its magnetization direction.

Figure 13D:
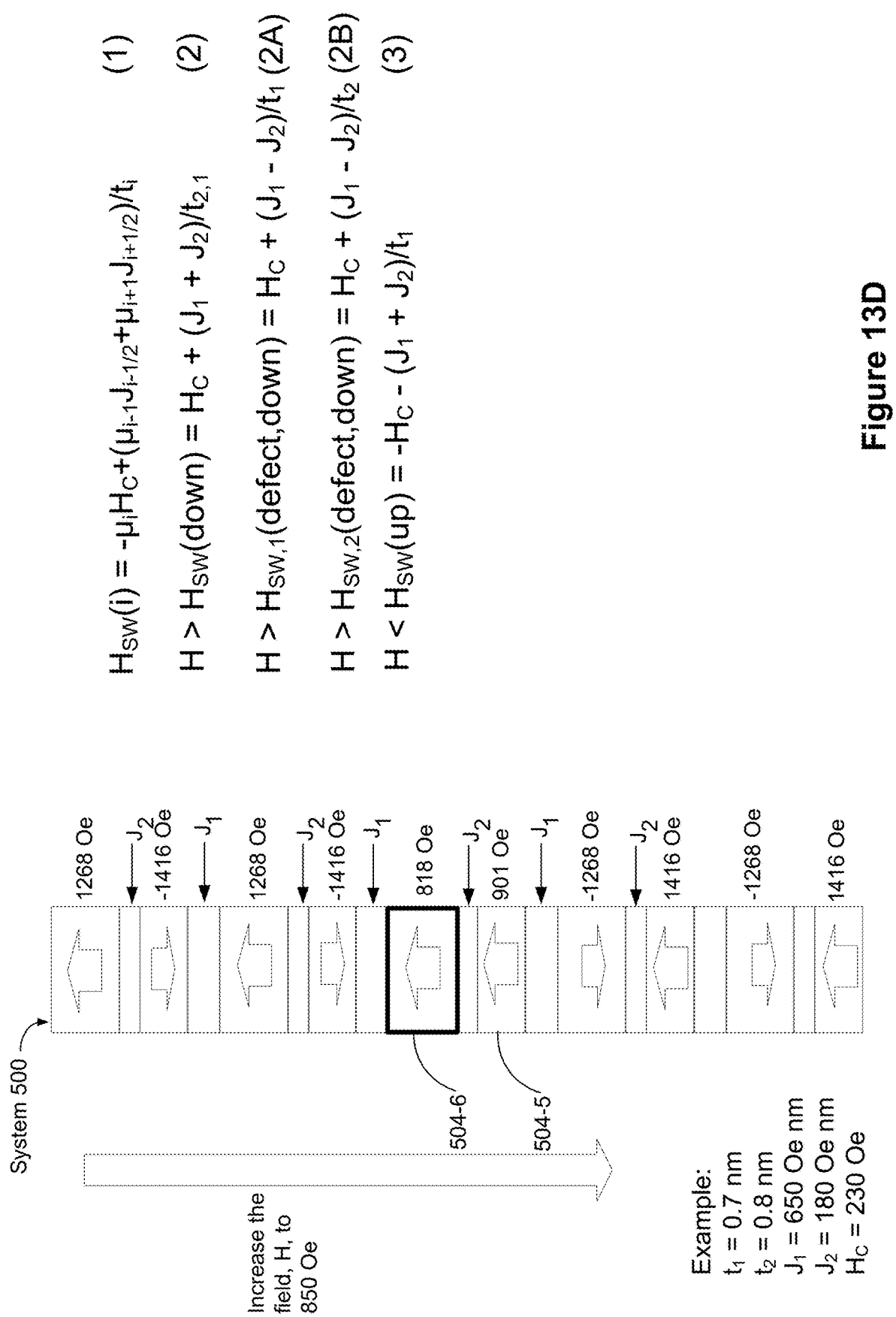
Figure 13E:
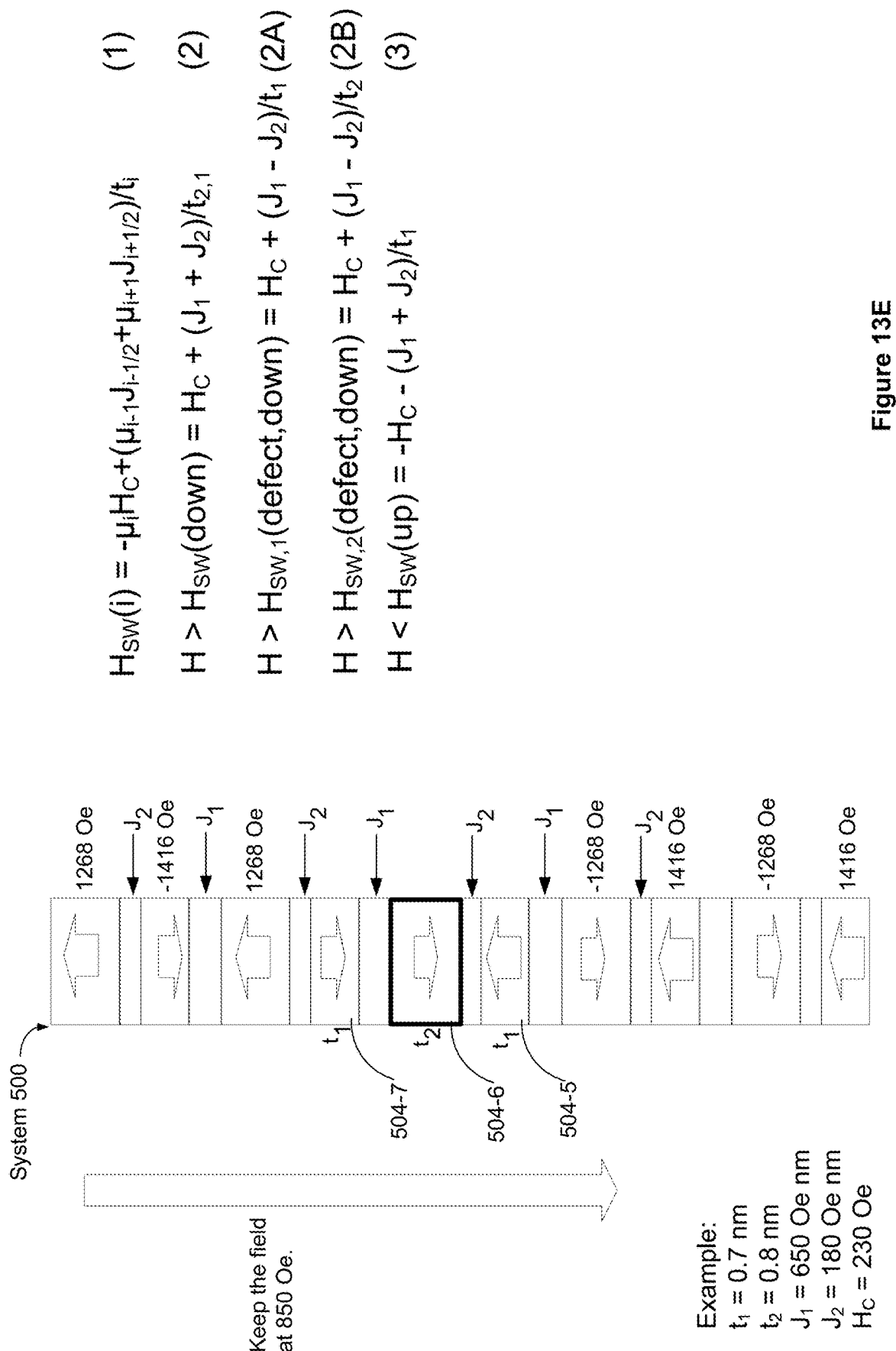

FIG. 13D shows the application of a magnetic field (e.g., an external magnetic field) of 850 Oe to the MRAM system 500. Since the applied field of 850 Oe is larger than the switching field of the magnetic layer 504-6 (e.g., 818 Oe), the magnetization direction of the magnetic layer 504-6 switches from the up direction to the down direction, as illustrated in FIG. 13E. The applied field of 850 Oe is too small to cause the remaining magnetic layers having the up magnetization direction to switch. The switching (or "flipping") of the magnetization direction in the layer 504-6 causes the soliton to move (e.g., propagate) one layer up. The magnetic instability is now located at the magnetic layers 504-6 and 504-7, as denoted in FIG. 13F. Here, both the magnetic layers 504-6 and 504-7 have the down magnetization direction.

Figure 13F:
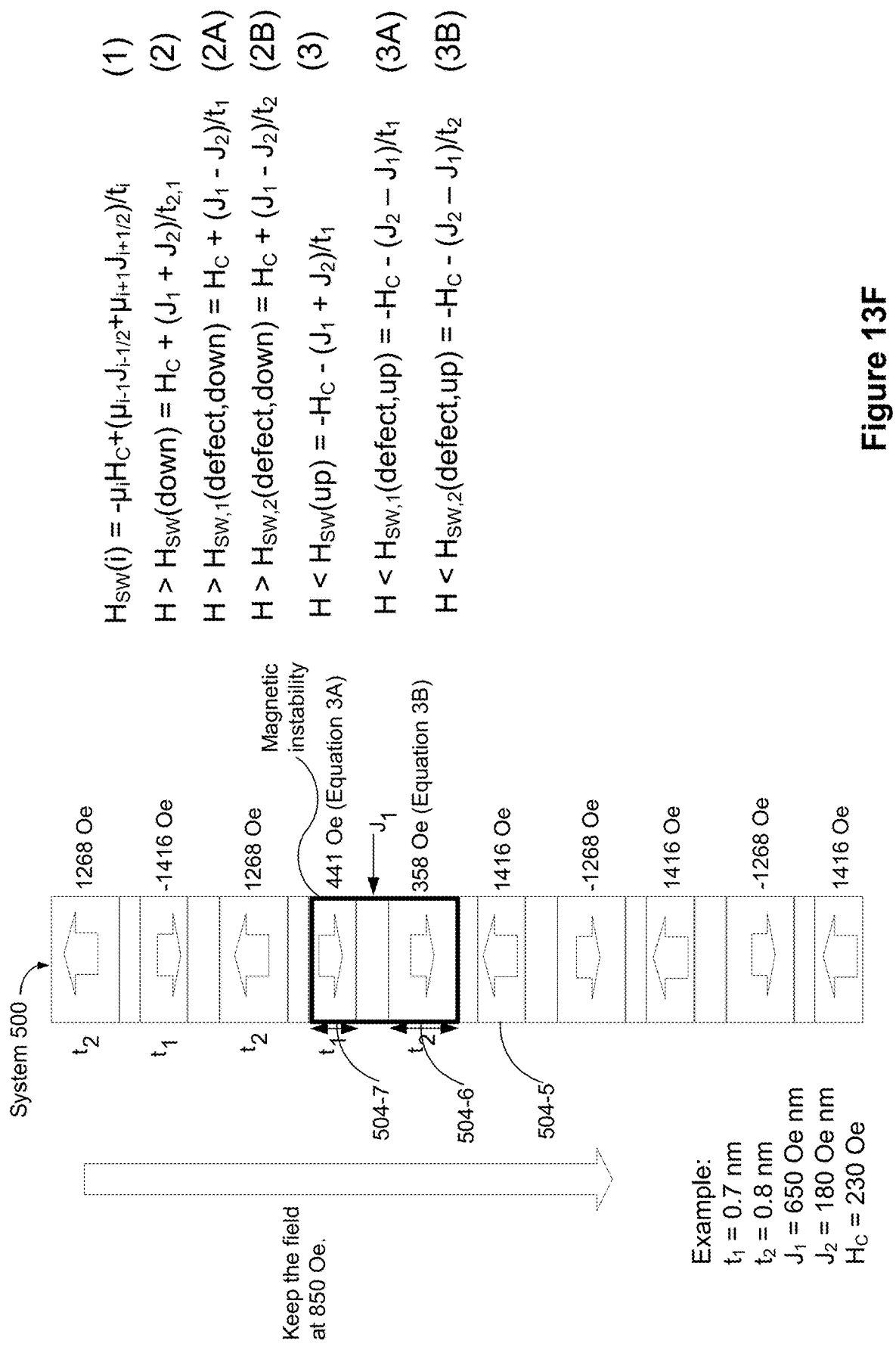

FIG. 13F also shows the updated switching values for each of the magnetic layers 504 as a result of the moving of the magnetic instability. The switching fields of the magnetic layer 504-6 and its two neighboring layers have changed. The switching field required to switch the magnetic layer 504-7 from the down direction to the up direction, $H_{SW,1}$(defect,up) is given by Equation 3A:

$$H_{SW,1}(\text{defect,up})=-H_C-(J_2-J_1)/t_1 \qquad (3A)$$

The switching field required to switch the magnetic layer 504-6 from the down magnetization direction to the up magnetization direction, $H_{SW,2}$(defect,up), is given by Equation 3B:

$$H_{SW,2}(\text{defect,up})=-H_C-(J_2-J_1)/t_2 \qquad (3B)$$

In some implementations and instances, the defect layers 504-6 and 504-7 are metastable. They have a positive switching field even though they are in the down direction (e.g., as if the magnetization direction were pointing upward).

Figure 13G:
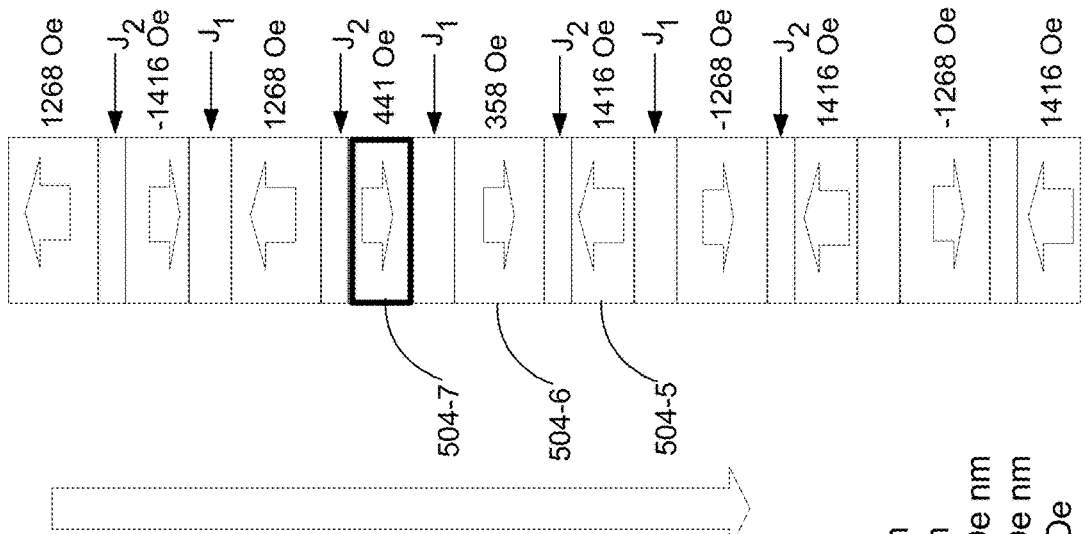
Figure 13H:
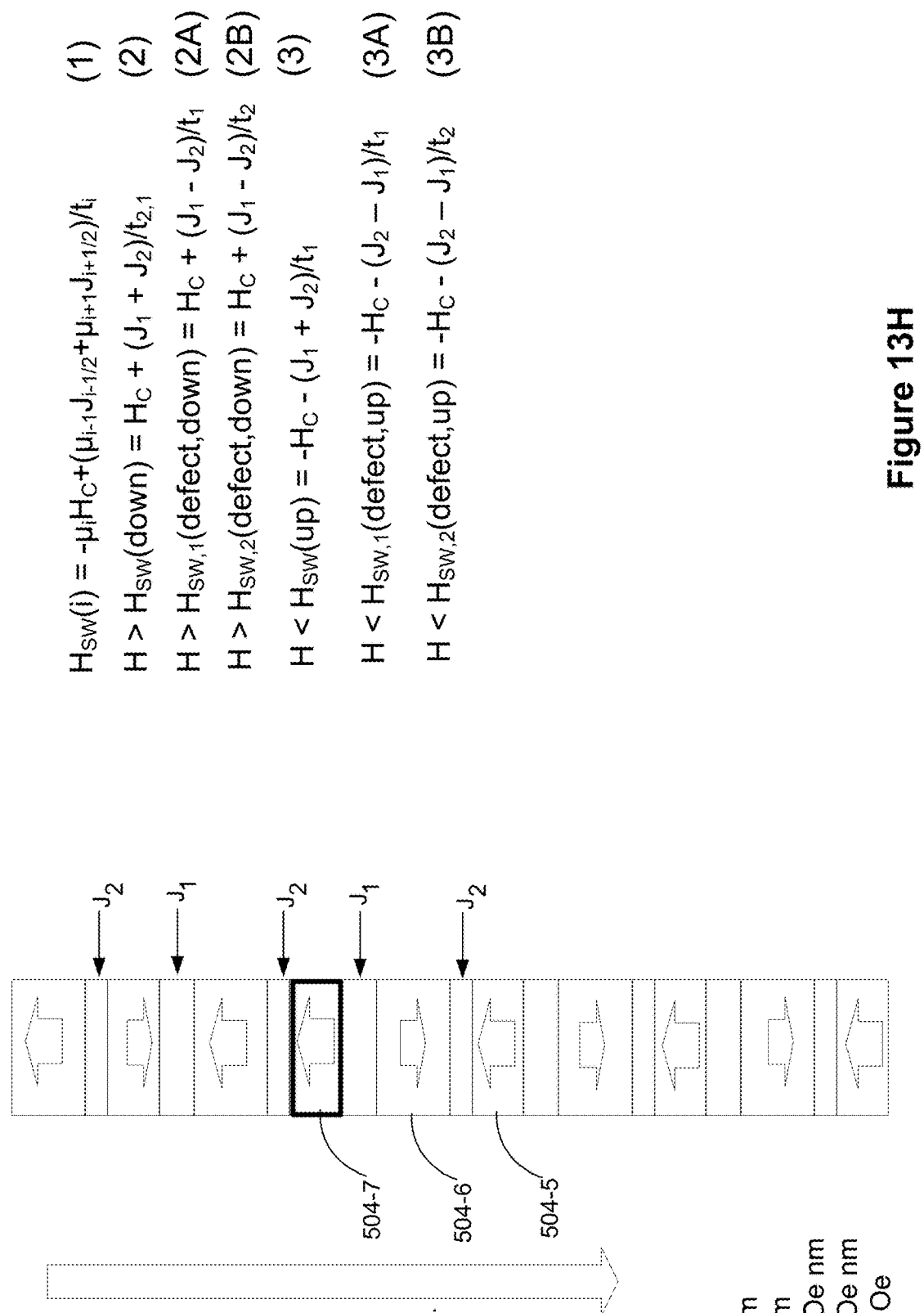
Figure 13I:
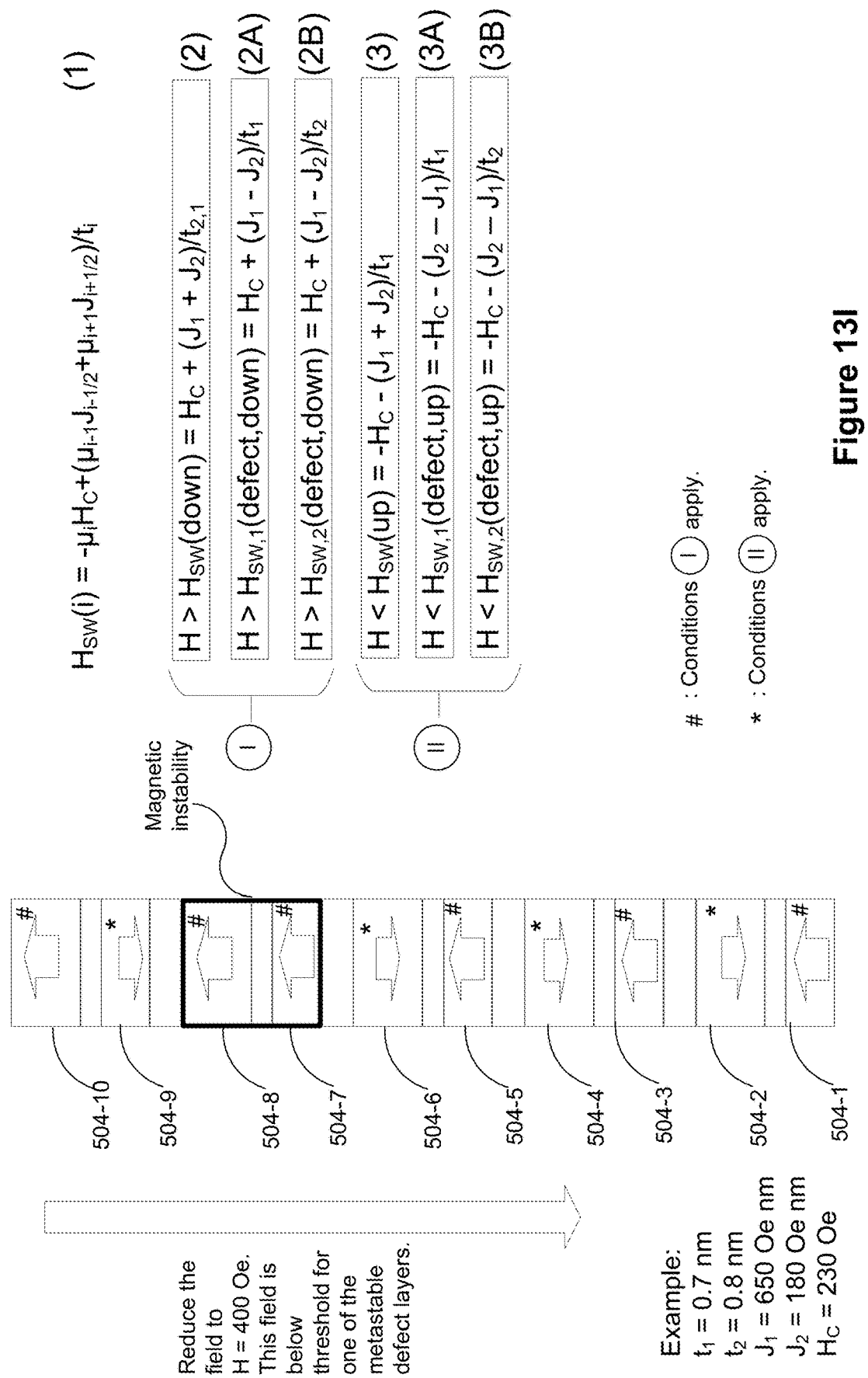

FIG. 13G shows a reduction in the applied field from 850 Oe to 400 Oe which is below the threshold switching field for the metastable defect magnetic layer 504-7 (441 Oe). Thus, the magnetization direction of the magnetic layer 504-7 switches from the down direction to the up direction, as illustrated in the transition from FIG. 13G to FIG. 13H. Accordingly, the soliton propagates one layer up in the stack 530, resulting in the formation of a defect (e.g., magnetic instability) in the magnetic layers 504-7 and 504-8, as illustrated in FIG. 13I. FIG. 13I also clarifies that the switching fields of the magnetic layers 504 that are marked with a hash (#) are governed by conditions (I) (i.e., Equations 2, 2A, and 2B) whereas the switching fields of the magnetic layers 504 that are marked with an asterisk (*) are governed by the conditions (II) (i.e., Equations 3, 3A, and 3B).

Figure 13J:
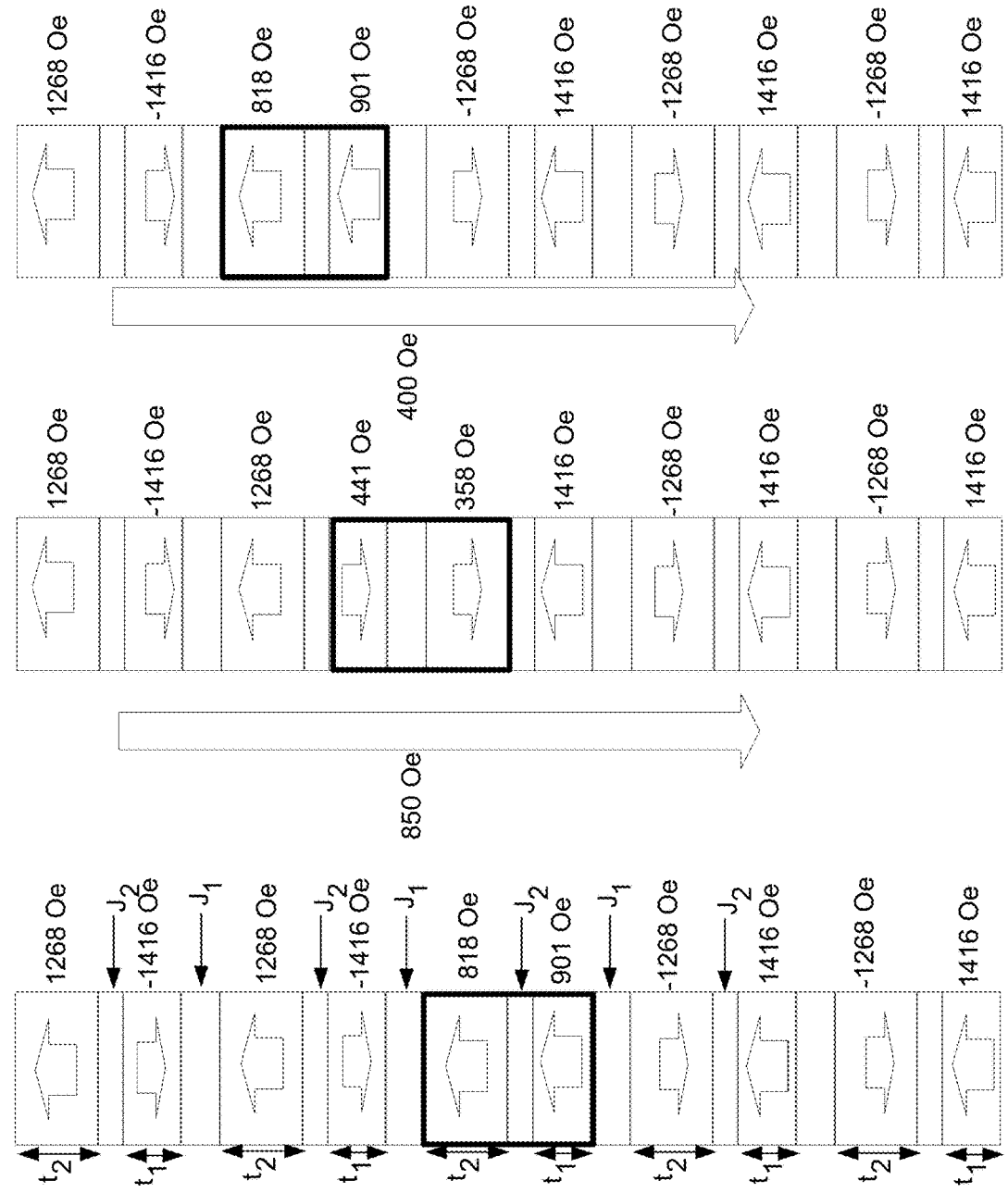

FIG. 13J presents a summary for the kink soliton ratchet of the MRAM system 500. In some implementations, the direction of propagation of the magnetic instability (e.g., defect) in the MRAM system 500 is unidirectional (e.g., upwards or downwards). In some implementations, the magnetic instability (or defect) can be propagated upwards or downwards by changing one or more parameters including an exchange coupling value (J) and/or a thickness value (t). In the example of FIG. 13, the conditions $J_1>J_2$ and $t_1<t_2$ ensure upward soliton ratchet action.

FIG. 14A to 14D illustrate two magnetic ground states of an MRAM structure 1400 and a numerical example of the process for shifting magnetic bits in the structure 1400, in accordance with some implementations. FIG. 14 has been adapted from Lavrijsen et al., "Multi-bit operations in vertical spintronic shift registers," which is incorporated by reference herein in its entirety. In some implementations, the MRAM structure 1400 is known as a three-layer-cell ratchet.

Figure 14A:
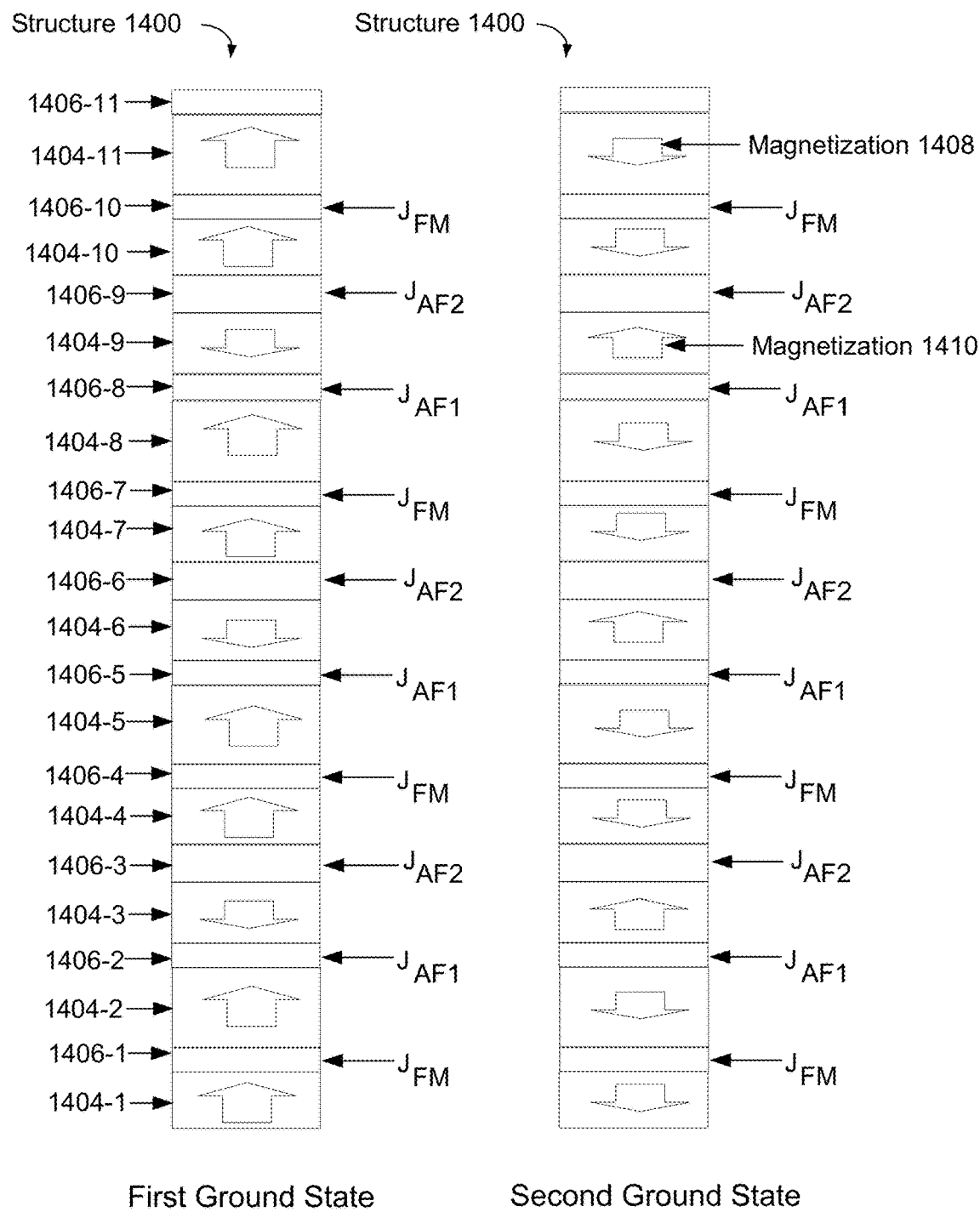
Figure 14B:
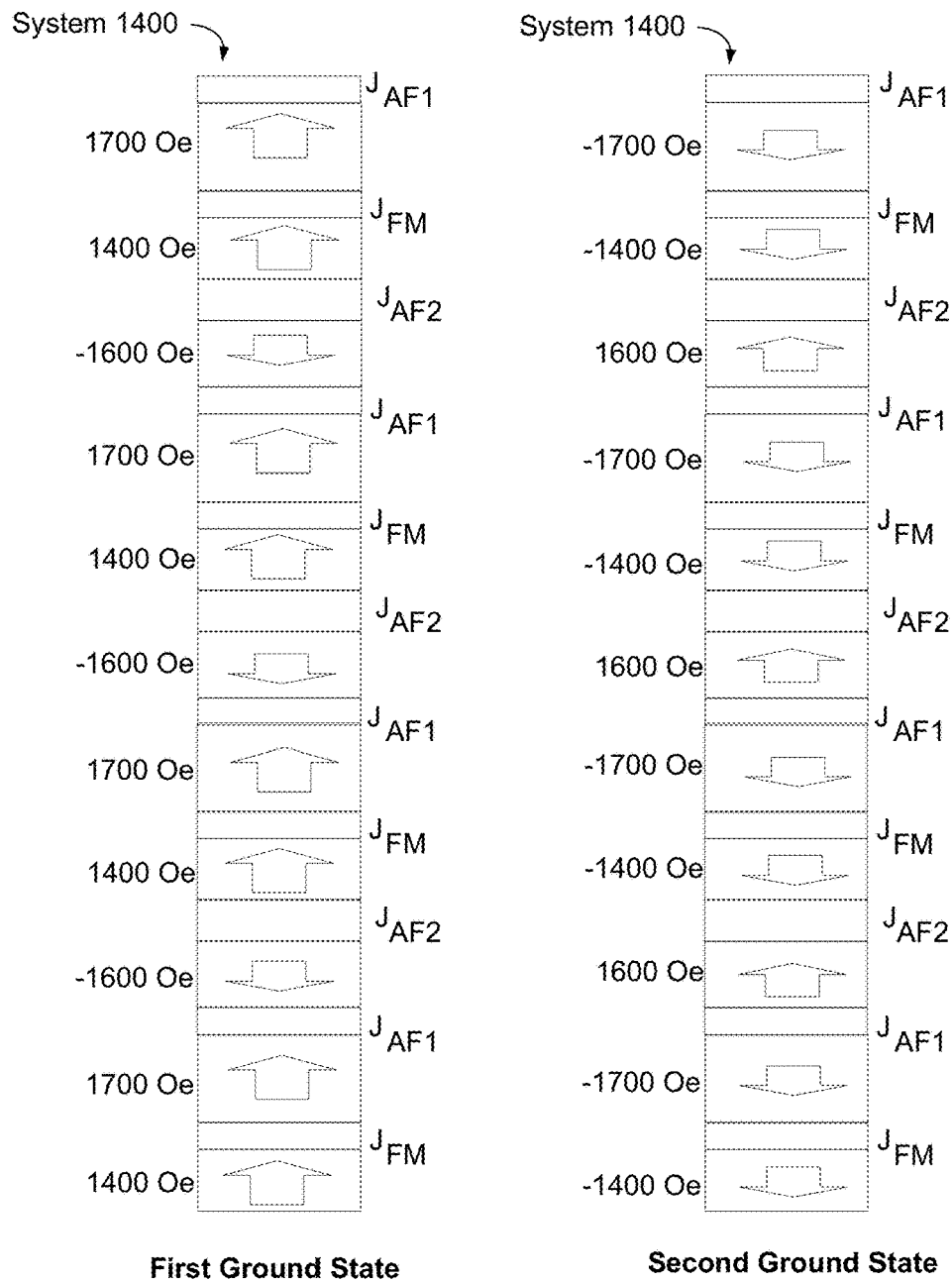

MRAM systems of various configurations may be designed by varying one or more of: a type of exchange coupling (e.g., ferromagnetic or anti-ferromagnetic coupling), a strength (e.g., value) of exchange coupling, and thickness(es) of the magnetic layers and non-magnetic layers. FIG. 14A shows two ground states of an MRAM structure 1400 that comprises a plurality of magnetic layers 1404 and a plurality of non-magnetic layers 1406. The actual number of the magnetic layers 1404 and the non-magnetic layers 1406 shown in FIG. 14 is merely exemplary. In some implementations, the MRAM structure 1400 comprises a unit cell that contains three magnetic and three non-magnetic layers. A ground state has unit cells "up-up-down" (FIG. 14A) or "down-down-up" (FIG. 14B). The MRAM system 1400 has coupling configuration $J_{FM}$-$J_{AF1}$-$J_{AF2}$.

FIG. 14B shows the computed numerical values of switching fields ($H_{SW}$) (in Oe) for each of the magnetic layers 1404, for the two ground states. The $H_{SW}$'s are calculated using equations (1) to (3) described with respect to FIG. 13, and values $J_{FM}$=300 Oe, $J_{AF1}$=500 Oe, $J_{AF2}$=200 Oe, and $H_C$=900 Oe for the respective parameters.

Figure 14D:
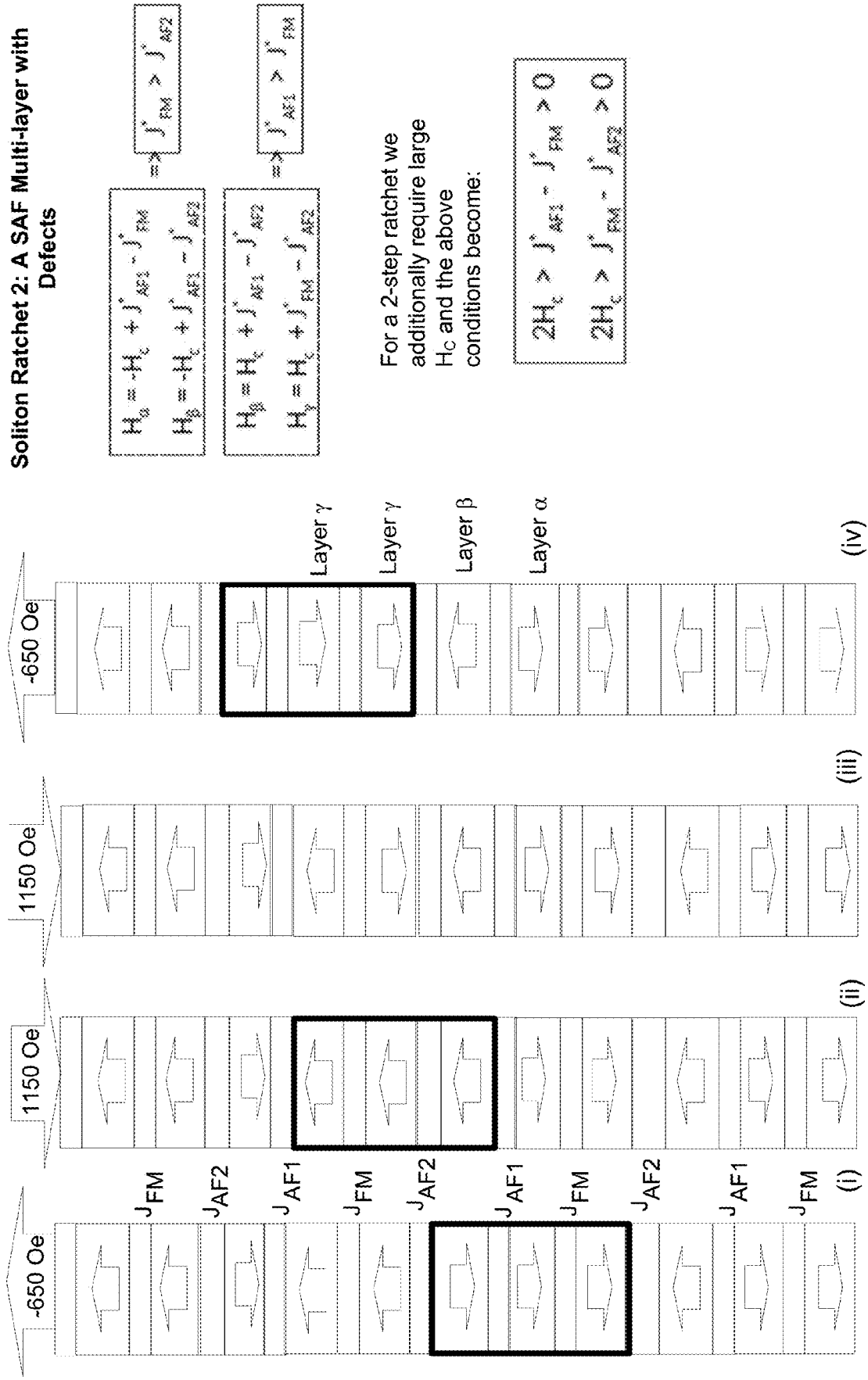

FIGS. 14C and 14D illustrate an exemplary process for shifting magnetic bits in the MRAM structure 1400. A defect is observed when three consecutive magnetic layers have the same orientation. One ground state is observed above a defect and the other ground state is observed below the defect. In the example of FIG. 14C(i), a "down-down-down" defect is illustrated. The three magnetic layers below this defect have the "down-down-up" magnetic ground state, whereas the three magnetic layers above this defect have "up-up-down" magnetic ground state. Thus, the defect represents a break in the order shown by a ground state.

The process is similar to that described in FIG. 13 and will not be repeated for the sake of brevity. One key difference between the MRAM system 500 and the MRAM system 1400 is that because of the presence both antiferromagnetically coupled and ferromagnetically coupled pairs of magnetically layers, there are three adjacent magnetic layers with the same magnetization direction whenever the defect s present in an antiferromagnetically coupled pair (see, e.g., FIG. 14C-ii and FIG. 14C-iv). In some implementations, the system 1400 is also known as a three-layer-cell soliton ratchet.

In some implementations and as illustrated in FIG. 14D, for a three-layer-cell ratchet, one additionally requires a large coercive field ($H_C$) and accordingly the propagation process requires:

$$2H_C > J_{AF1} - J_{FM} > 0; \text{ and}$$

$$2H_C > J_{FM} - J_{AF2} > 0 \quad (4)$$

In some implementations, a magnetic memory device comprises tens or hundreds of the MRAM structures described in FIGS. 5, 6, 13, and 14 that are closely packed. One characteristic of the implementations disclosed in FIGS. 13 and 14 is that large magnetic fields are required. In some implementations, it is challenging to apply large magnetic fields to a single structure without affecting nearby structures in the memory device. In some implementations, Spin Transfer Torques are more practical than magnetic fields because they appear at the same place as electrical current (e.g., inside the pillars). Magnetic fields cannot be directed as easily as electrical current, which literally follows the electrical circuit.

In accordance to some implementations of the present disclosure, propagation of magnetic instabilities may be achieved using a spin polarized current. In other words, instead of a magnetic field, a current is applied to an MRAM device and/or system. The applied current produces a Spin Hall Effect (SHE) that is in turn used to switch the magnetic layers of the MRAM device and/or system. In some implementations, the propagation of magnetic instabilities (e.g., magnetic defects) using the SHE requires the magnetic layers in the MRAM system and/or device to have the vortex magnetization state (e.g., the vortex magnetic ground state 700 of FIG. 7A). In some implementations, the propagation of magnetic instabilities (e.g., magnetic defects) using the SHE requires the exchange of the individual magnetic layers to be relatively weak so as favor the vortex magnetic state. Furthermore, the coupling layers (e.g., non-magnetic layers) must facilitate RKKY coupling between the magnetic layers.

FIGS. 15A to 15D illustrates application of a current to the MRAM device 600, in accordance with some implementations. The current produces the SHE causing respective magnetic layers of the MRAM device 600 to switch a magnetization direction.

In some implementations, the MRAM device 600 is also known as a three-dimensional magnetic shift register. Each of the magnetic layers 604 has a vortex magnetization state (e.g., the vortex magnetic ground state 700 of FIG. 7A), and adjacent magnetic layers are separated by a respective non-magnetic layer 606. The magnetic layers 604 are antiferromagnetically coupled. Accordingly, the MRAM device of FIG. 15(A) is in one of two possible magnetic ground states.

As shown in FIG. 15A and also referring to FIG. 6, the MRAM device 600 includes the input terminal 622 coupled to one end (e.g., a first end) of the core 602. The current source 624 (FIG. 6) is coupled to the input terminal 622. In some implementations, the current source 622 is configured to supply current imparting a Spin Hall Effect (SHE) around the circumference of the core 602. The SHE contributes to a magnetization of the plurality of magnetic layers 604 in the stack 630.

In some implementations, the current source 624 is configured to supply a specific current to change a direction of magnetization of a specific one of the plurality of magnetic layers 604. In other implementations, the current source is configured to supply a specific current to change a direction of magnetization of a specific set (e.g., two or more) of the plurality of magnetic layers 604. The current is introduced in the core 602 which is metallic. However, due to the fact that the magnetic layers 604 themselves are also metallic, and may possess a lower resistivity than the core 602, a large fraction of the current may be shunted via the outer metallic magnetic layers 604. In some implementations, the magnitude of the current depends on the thermal stability of the layers but for a typical stability of 60 kT (where k is the Boltzmann's constant=$1.38 \times 10^{-23}$ J/K, and T is the temperature in Kelvin) those currents would be of the order of a few hundred micro-Amperes (e.g., 200 µA, 300 µA, or 400 µA) taking into account the shunt current via the magnetic layers 604.

When a current is applied through the core 602, a magnetic field is created around the core 602. This is also known as the Ampere Law effect. The Ampere Law Effect is distinct from the SHE. In some implementations, depending on the material used for the core 602, the sign of the SHE can be reversed. This mostly depends on the sign of Russell-Saunders Coupling (or the L-S coupling) in the core material. For materials with a positive Spin Hall angle, the direction of the SHE and the Ampere Law magnetic field would be the same and hence the additional Oersted field would further help in switching the layers. Obviously in the case of a negative Spin Hall angle those effects are antagonistic. However, a rough calculation reveals that for a 400 µA current through the core, an Oersted field equivalent to 400 Oe is generated, which is only 10% of the required spin hall switching field. In other words, one would expect the SHE effect to be the more dominant of the two effects.

In some implementations and referring to the transition from FIG. 15A to FIG. 15B, the MRAM device 600 includes a first magnetic layer 604-1 and a second magnetic layer 604-2 that is separated from the first magnetic layer 604-1 by a first non-magnetic layer 606-2 of the plurality of non-magnetic layers 606. The first magnetic layer has a vortex magnetization (e.g., vortex magnetic ground state) in a first direction 608 (e.g., a counterclockwise rotational direction). The second magnetic layer has a vortex magnetization in a second direction 610 (e.g., a clockwise rotational direction) that is opposite to the first direction 608. The vortex magnetization of the first magnetic layer 604-1 switches from the first direction 608 (e.g., counterclockwise) to the second direction 610 (e.g., clockwise) when the SHE imparted around the circumference (e.g., perimeter) of the core 602 satisfies a first SHE threshold. The vortex magnetization of the second magnetic layer 604-2 switches from the second direction 610 (e.g., clockwise) to the first direction 608 (e.g., counterclockwise) when the SHE imparted around the circumference (e.g., perimeter) of the core 602 satisfies a second SHE threshold. In some implementations, the clockwise direction and the counterclockwise direction are determined using the Right Hand Rule convention. In some implementations, the transition from FIG. 15A to FIG. 15B is facilitated by an injector that is configured to introduce (e.g., inject) one or more magnetic instabilities (e.g., defects) into the MRAM device 600, which will be discussed in greater detail in FIG. 24.

FIG. 15B shows a magnetic instability at adjacent magnetic layers, in accordance with some implementations. As described previously, a magnetic instability (or a defect) is associated with two (e.g., a pair of) adjacent magnetic layers having a same magnetization direction. Here, the second magnetic layer 604-2 and the third magnetic layer 604-3 are adjacent magnetic layers that are separated by the second non-magnetic layer 606-3. Both the second magnetic layer 604-2 and the third magnetic layer 604-3 have vortex magnetization in the first direction (e.g., counterclockwise). In some implementations, a magnetic defect includes a pair of adjacent magnetic layers of the device 600 both having the clockwise magnetization direction. In some implementations, a magnetic instability in the clockwise (counterclockwise) direction is referred to as a magnetic instability of the first (second) sign/polarity, whereas a magnetic instability in the counterclockwise (clockwise) direction is referred to as a magnetic instability of the second (first) sign/polarity. It is noted that the designation of the "first" sign and the "second" sign to the counterclockwise and the clockwise directions is arbitrary.

FIGS. 15B to 15D illustrate the propagation the magnetic stability in the device 600 in accordance with some implementations.

In some implementations and referring to the transition from FIG. 15B to FIG. 15C, the device 600 includes a third magnetic layer 604-3 that is separated from the second magnetic layer 604-2 by a second non-magnetic layer 606-3. The third magnetic layer 604-3 has a vortex magnetization in the first direction 608. In some implementations, the current source 624 coupled to the input terminal 622 is configured to supply current having a first magnitude $I_1$ 1502 that imparts a SHE around the circumference of the core 602. The vortex magnetization of the third magnetic layer 604-2 switches from the first direction 608 (e.g., counterclockwise) to the second direction 610 (e.g., clockwise) when the SHE imparted around the circumference (e.g., perimeter) of the core satisfies a third threshold. That is to say, the current that is supplied causes a spin current that is large enough to overcome the magnetic field (e.g., the magnetic switching field).

As depicted in FIGS. 15 and 6, the ring-shaped (or annular-shaped) magnetic layers 604 of the MRAM device 600 employ spin currents (instead of external fields) to switch the individual layers. In some implementations, one may boil down the expression of the energy of the vortex state to an effective field via $H_{eff}=2\Delta/(M_s V)$ where $\Delta$ is the energy barrier of the vortex state, $M_s$ is the magnetic moment and V is the volume of the element. The value of this effective field is the value of a field that wraps concentrically around the core 602 (similar to a field in the vicinity of an infinitely long wire) and that would be required to switch the direction of the magnetic state from one rotational direction to its opposite, in essence a coercive field. When including the coupling from the top and bottom elements, one can use the expression $$H_{SW} = H_{eff} + \frac{J_1}{t} - \frac{J_2}{t}$$

that has been derived from Equation (1), where $\mu_i=-1$ and t is the thickness of the magnetic element, to estimate the value of the switching field.

In some implementations and referring to the transition from FIG. 15C to FIG. 15D, the device 600 includes a fourth magnetic layer 604-4 that is separated from the third magnetic layer 604-3 by a third non-magnetic layer 606-4. The fourth magnetic layer 604-4 has a vortex magnetization in the second direction 610. In some implementations, the current source 624 is configured to supply current having a second magnitude $I_2$ 1504 that imparts a SHE around the circumference of the core 602. The vortex magnetization of the fourth magnetic layer 604-4 switches from the second direction 610 to the first direction 608 when the SHE imparted around the circumference (e.g., perimeter) of the core 602 satisfies a fourth threshold.

In some implementations, each of the first, second, third, and fourth thresholds is distinct. In some implementations, at least two of the first, second, third, and fourth thresholds have a same value.

In some implementations, the first current magnitude $I_1$ 1502 and the second current magnitude $I_2$ 1504 are part of a current pulse supplied by the current source 624. In some implementations, the current pulse comprises a triangular pulse that includes a leading edge and a trailing edge. In some implementations, the first current magnitude $I_1$ 1502 corresponds to the peak value of the leading edge and the second current magnitude $I_2$ 1504 corresponds to a predefined value of the trailing edge of the triangular pulse.

In some implementations, the current pulse supplied by the current source 624 corresponds to a current pulse with a square wave function.

In some implementations, the first SHE threshold and the second SHE threshold are satisfied in response to one or more current pulses supplied by the current source 624. In some implementations, each of the one or more current pulses includes a leading edge and a trailing edge, as also illustrated in FIGS. 25A and 25B.

In some implementations, the current source 624 is configured to supply a specific current to change a direction of magnetization of a specific one of the plurality of magnetic layers 604 (e.g., from a clockwise direction to a counterclockwise direction). In some implementations, the current source 624 is configured to supply a specific current to change a direction of magnetization of a specific one set of the plurality of magnetic layers 604.

In some implementations, the direction of the propagation of the magnetic instability (e.g., defect) is unidirectional. In the example of FIG. 15, the magnetic instability propagates in an upward direction. In other implementations, the magnetic instability propagates uni-directionally in a downward direction.

Figure 16:
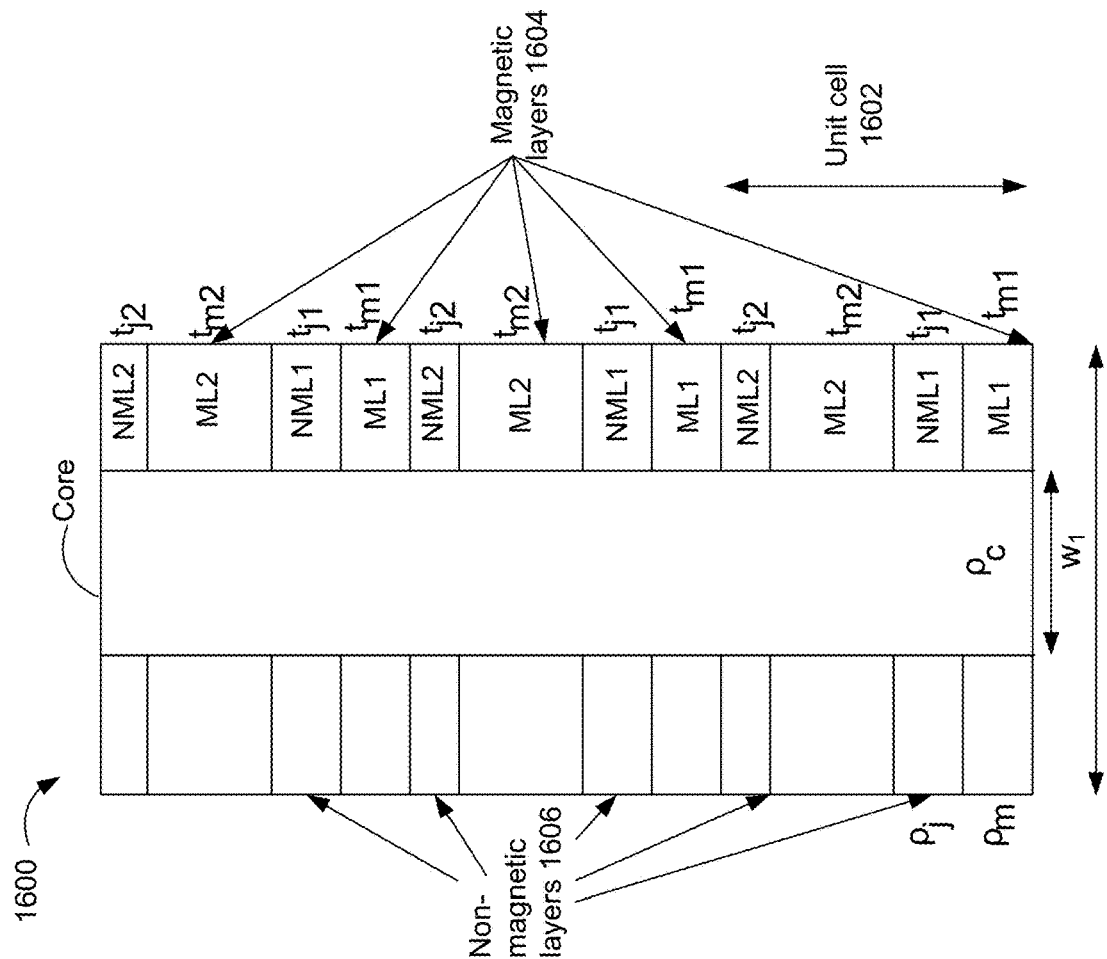
FIG. 16 illustrates a cross-sectional view of an MRAM device and relevant parameters, in accordance with some implementations.

FIG. 16 illustrates a cross-sectional schematic 1600 of a cylindrical MRAM device (e.g., the MRAM device 600), in accordance with some implementations. The schematic shows cross-sectional schematic of magnetic layers 1604 alternating between non-magnetic layers 1606. In some implementations, the cross-sectional schematic magnetic layers 1604 correspond to the magnetic layers 604 of FIG. 6, and the cross-sectional schematic non-magnetic layers 1606 correspond to the magnetic layers 606 of FIG. 6.

The magnetic layers 1604 include a plurality of first magnetic layers (ML1) each having a thickness (e.g., height) of $t_{m1}$ and a resistivity of $\rho_m$. The magnetic layers 1604 further include a plurality of second magnetic layers (ML2) each having a thickness (e.g., height) of $t_{m2}$ and a resistivity of $\rho_m$. The non-magnetic layers 1606 include a plurality of first non-magnetic layers (NML1) each having a thickness (e.g., height) of $t_{j1}$ and a resistivity of $\rho_j$. The non-magnetic layers 1606 further include a plurality of second non-magnetic layers (NML2) each having a thickness (e.g., height) of $t_{j2}$ and a resistivity of $\rho_j$. The core (e.g., the core 602) has a resistivity of $\rho_c$ and a width (e.g., diameter) of $w_1$. The width (e.g., diameter) of the stack including the core, the magnetic layers and the non-magnetic layers is $w_2$.

In some implementations, the magnetic layers 1604 and the non-magnetic layers 1606 in the stack are arranged as repeating unit cells 1602, each unit cell having the sequence (from bottom to top) ML1-NML1-ML2-NML2. FIG. 16 also shows a table identifying relevant parameters (e.g., resistivity, coupling, and Spin Hall angle) and representative values of identified materials.

Figure 17:
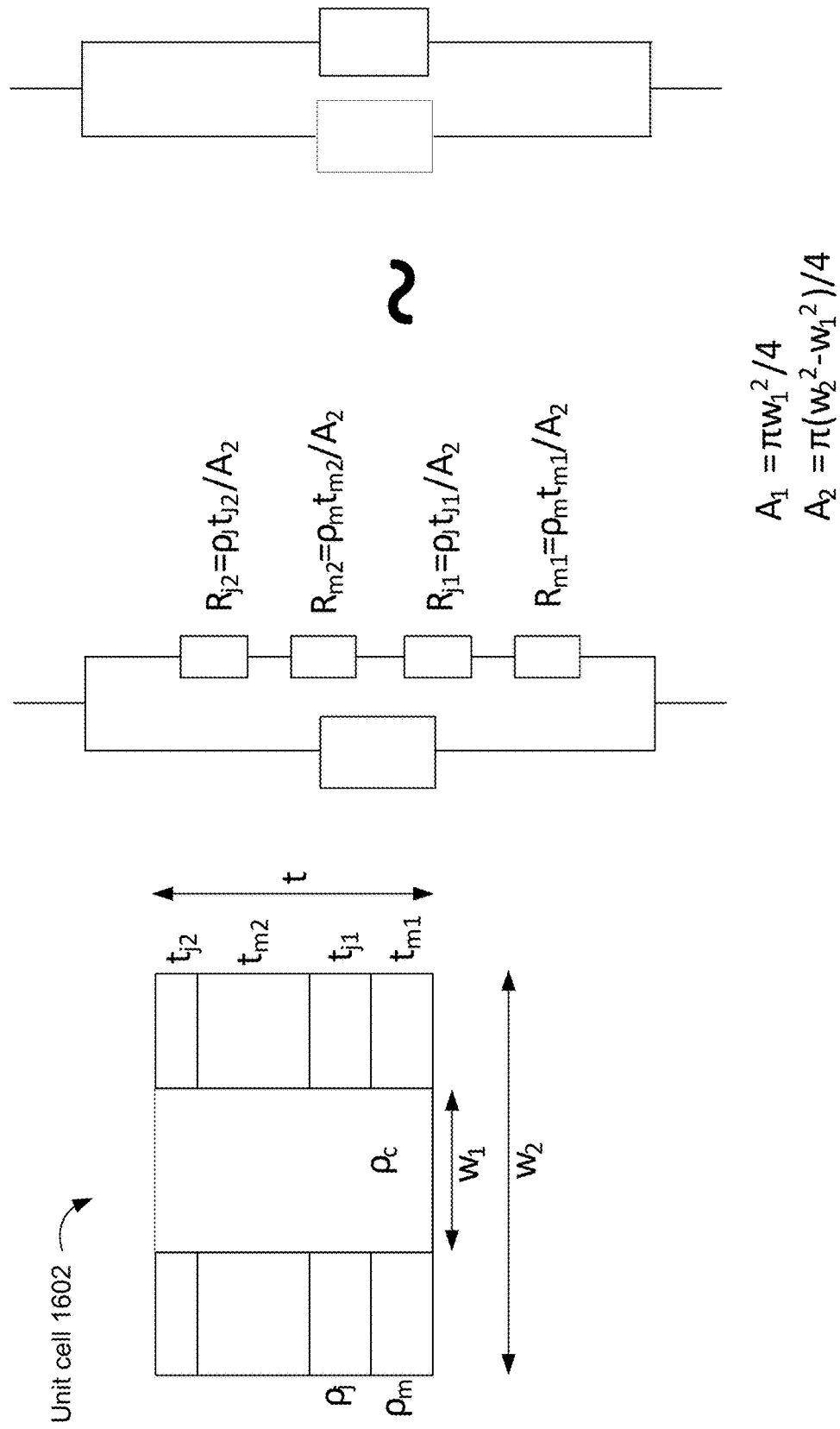
FIG. 17 illustrates a resistivity model for an MRAM device, in accordance with some implementations.

FIG. 17 shows a resistivity model of the unit cell 1602 for a MRAM device (e.g., the MRAM device 600), in accordance with some implementations. In some implementations, each of the magnetic layers and the non-magnetic layers may be thought of a, respectively, a magnetic resistor having a respective resistance value and a non-magnetic resistor having a respective resistance value. The core (e.g., the core 602) may be thought of as a core resistor with a corresponding core resistance value. The non-magnetic resistors and the magnetic resistors are arranged in a parallel configuration with respect to the core resistor.

In some implementations, the core (e.g. the core 602) has a lower electrical resistivity than a combined electrical resistivity of the magnetic layers 1604 and the non-magnetic layers 1606 in the stack 630. Accordingly, most of the current from the input terminal 622 flows through the core 602. In other words, the core 602 must have higher electrical conductivity than the combined electrical conductivity of the layers in the stack 630.

In some implementations, the core is composed of a material that is non-magnetic, electrically conductive and/or has a high Spin Hall angle (e.g., β-Tantalum or β-Tungsten). In some implementations, β-W is a preferred material for the core owing to its high electrical conductivity.

Figure 18:
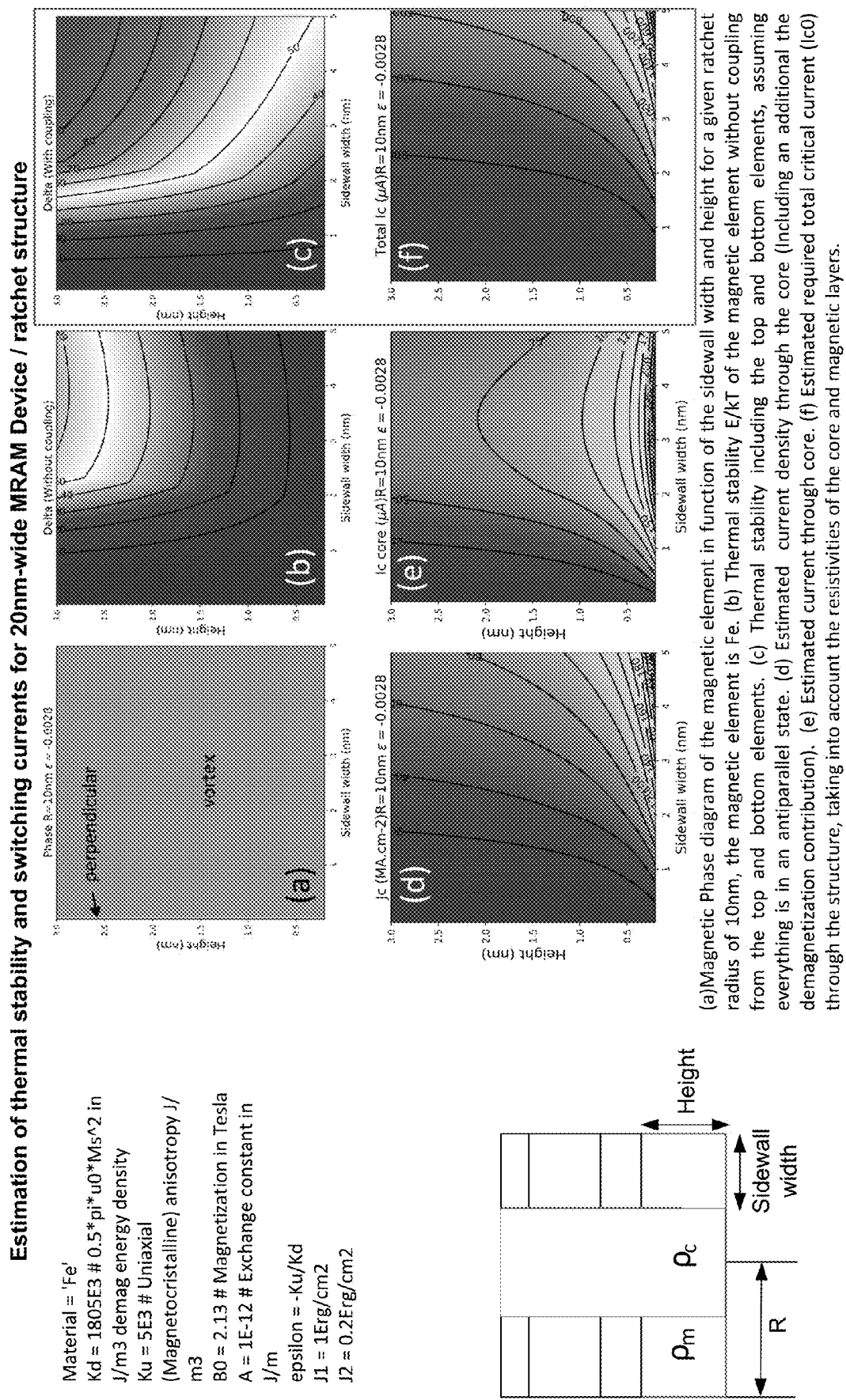
FIG. 18 illustrates estimations of thermal stability and switching currents for a 20 nm-wide MRAM device, in accordance with some implementations.

FIG. 18 illustrates estimations of thermal stability and switching currents for a 20 nm-wide MRAM device (e.g., a ratchet structure), in accordance with some implementations.

FIG. 19 illustrates corresponding effective fields (in Tesla) for the 20 nm-wide MRAM device (e.g., ratchet structure) of FIG. 18, in accordance with some implementations.

Figure 20B:
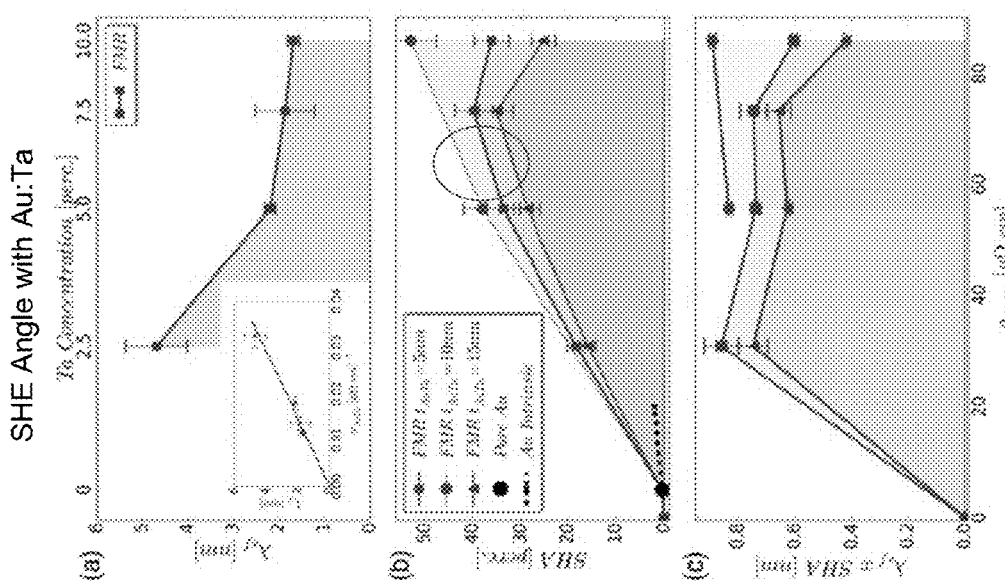
FIGS. 20A and 20B illustrate values of RKKY coupling and Spin Hall Effect (SHE) angle and resistivity from the prior art, in accordance with some implementations.
Figure 20A:
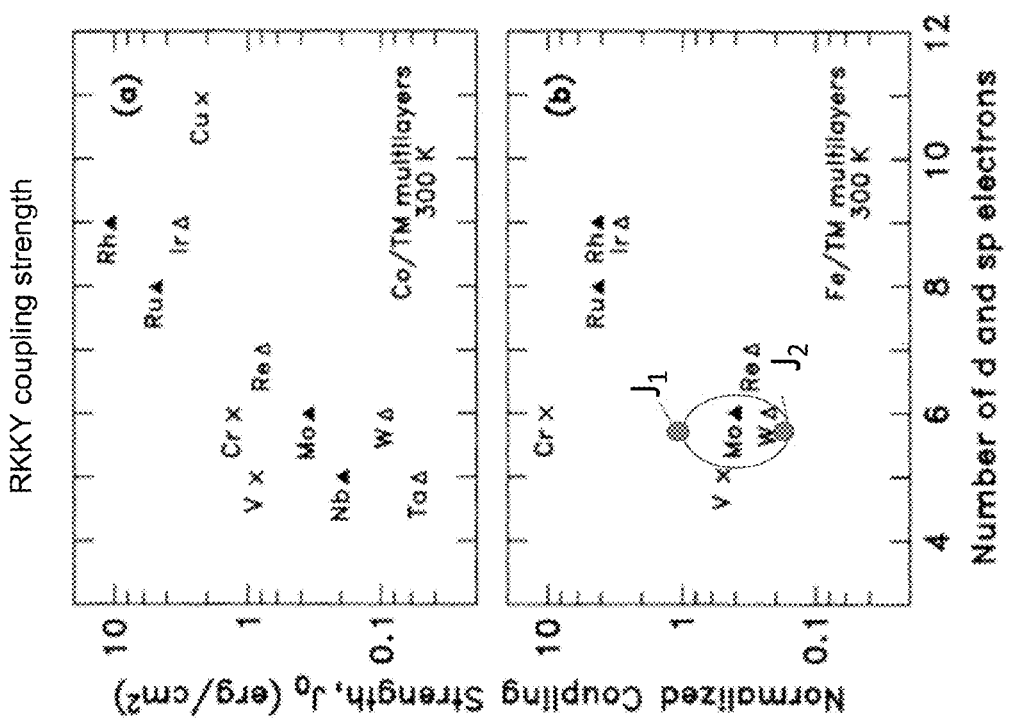

FIGS. 20A-20B illustrate values of RKKY coupling and Spin Hall Effect (SHE) angle and resistivity from the prior art, in accordance with some implementations.

FIG. 21 illustrates other values of RKKY coupling and Spin Hall Effect (SHE) angle and resistivity from prior art, in accordance with some implementations.

FIG. 22A to 22F illustrate injection and propagation of magnetic instabilities (e.g., defects) in the MRAM system 500, in accordance with some implementations.

In some implementations and as depicted in FIG. 22, the MRAM system 500 further comprises an injector 2210 that is configured to introduce (e.g., inject) one or more magnetic instabilities (e.g., defects) into the stack 530. In some implementations, the stack 530 is also known as the "soliton propagation layer" or the "propagation layer", and is used interchangeably henceforth. The injector 510 and the propagation layer 530 are adjacent to (e.g., contiguous with) each other in the MRAM system 500. The injector 2210 is arranged in a stack with respect to the propagation layer 530.

In some implementations, the injector 2210 includes a single magnetic (e.g., ferromagnetic) layer. In some implementation, the injector 2210 includes a plurality of magnetic layers (not shown). In some implementations, the injector 2210 includes a height (e.g., a thickness) that is larger than a respective height (e.g., thickness) of each the magnetic layers 504 in the propagation layer 530. In some implementations, the injector 2210 has a larger magnetic coercivity than each of the magnetic layers 504 in the propagation layer 530.

In the FIGS. 22A to 22F, the left half of the Figure provides a schematic of the MRAM system 500 at every step of the injection and/or propagation operation. The steps are numbered numerally at the top of the schematic. The schematic includes block arrows 2202 representing a downward switching field, $H_{SW}$(down), and/or block arrows 2204 representing an upward switching field, $H_{SW}$(up), for each of the magnetic layers 504. As discussed earlier with respect to FIG. 13, $H_{SW}$(down) refers to the field (e.g., in Oe) required to switch a magnetic layer to the down magnetization direction from the up magnetization direction. $H_{SW}$(up) refers to the field required to switch a magnetic layer to the up magnetization direction from the down magnetization direction. The numbers inside each of the block arrows 2202 and 2204 represent the magnitude of the switching fields. It is noted here that the actual magnetization direction of the magnetic layers 504 are in fact opposite to those depicted by the block arrows 2202 and 2204.

The right half of the each of the FIGS. 22A to 22F show line diagrams 2240, applied external magnetic field ($H_{ext}$) 2242 (in units of Oe), markers 2248 that identify the magnetic layer 504 whose magnetization direction is switched in each step (if applicable), and a plot 2220 showing variation of the applied field $H_{ext}$ over time. Essentially, the right half of the figure provides the same information given on the left, but in a different form. The line diagrams 2240 include arrows 2244 pointing to the right (i.e., →) and/or arrows 2246 pointing to the left (i.e., ←). The arrows 2244 pointing to the right are equivalent to the block arrows 2202 representing $H_{SW}$(down). The arrows 2246 pointing to the left are equivalent to the block arrows 2204 representing $H_{SW}$(up).

In some implementations, the injection of an initial defect (e.g., a first defect 2230-1) comprises: At step (0), a large negative external magnetic field (e.g., −1000 Oe) is applied to reset the MRAM system 500 so that each of the magnetic layers 504 has a downward switching field $H_{SW}$(down) (i.e., up magnetization direction). From step (0) to step (1), the external field ($H_{ext}$) is reduced (e.g., from −1000 Oe to −500 Oe) to relax the MRAM system 500 to cause formation of an antiferromagnetic (AFM) configuration in the propagation layer 530. From step (1) to step (2), the external field ($H_{ext}$) is further reduced (e.g., from −500 Oe to 0 Oe) and an AFM configuration in the propagation layer 530 results.

Figure 22A:
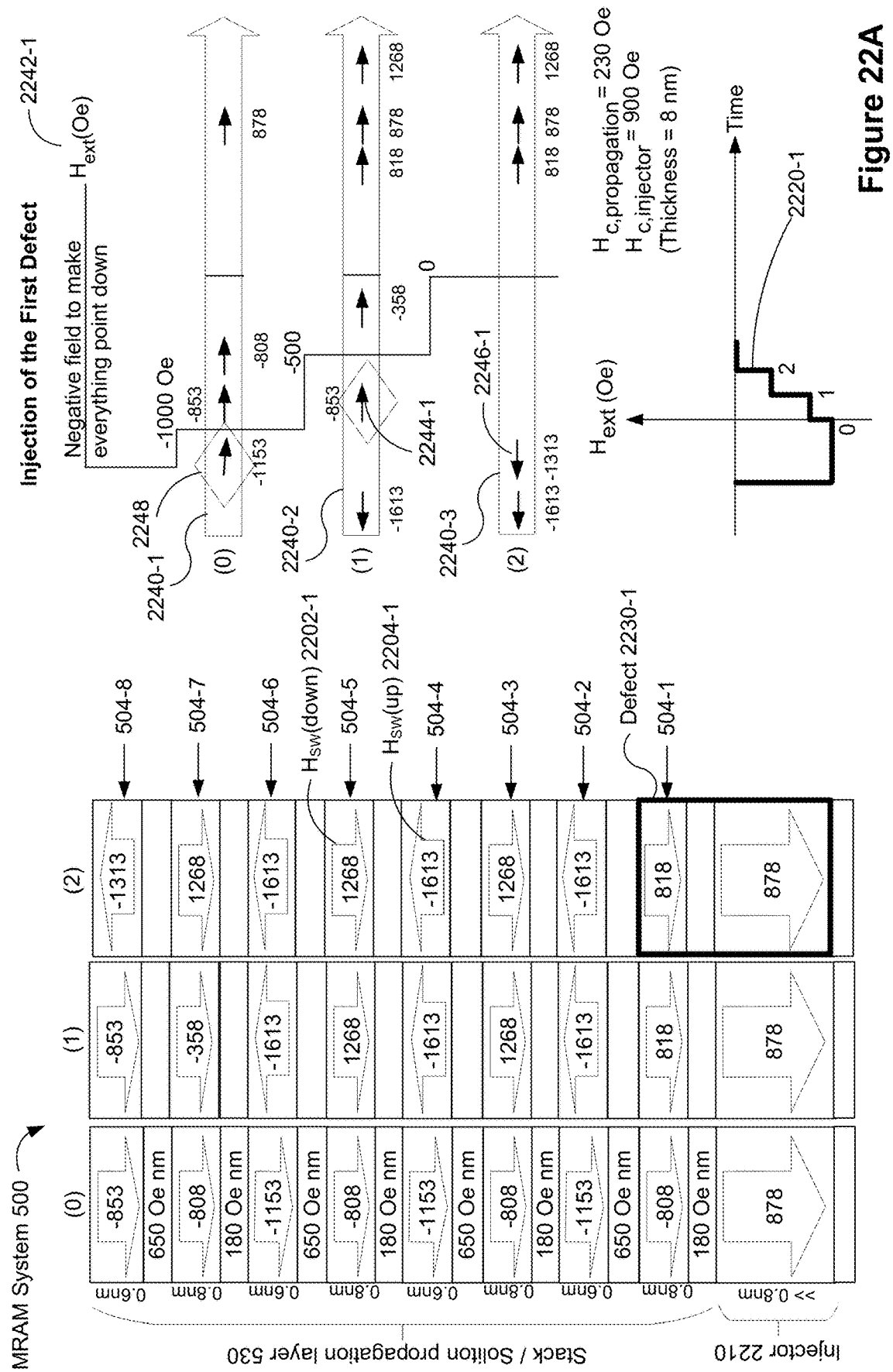
FIGS. 22A to 22F illustrate injection and propagation of defects in a MRAM system, in accordance with some implementations.

FIG. 22A illustrates that the injector 2210 has the same $H_{SW}$(down) switching field direction (or the same up magnetization direction) as the magnetic layer 504-1. Furthermore, the injector 2210 and the magnetic layer 504-1 are adjacent magnetic layers. Accordingly, a defect 2230-1 (or magnetic instability) is associated with the injector 2210 and the magnetic layer 504-1. In some implementations, the defect 2230-1 is also known as a negative defect because the switching fields of the two adjacent magnetic layers are in a same (e.g., downward) direction.

Figure 22B:
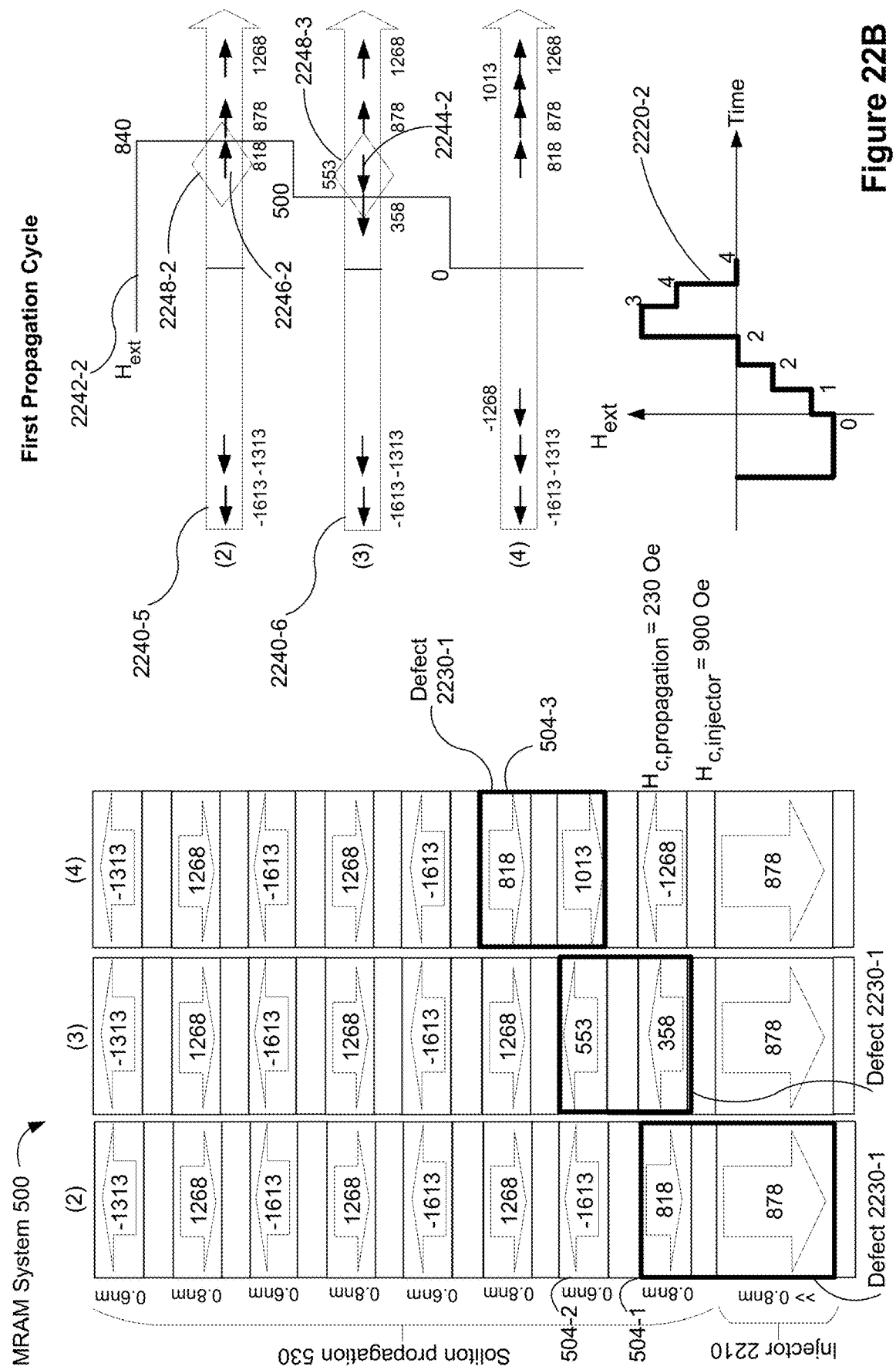

FIG. 22B illustrates the first propagation cycle in accordance with some implementations. After the AFM configuration is formed in the stack 530 in FIG. 22A at step (2), an external magnetic field $H_{ext}$ (e.g., 840 Oe) is applied. In some implementations, the applied field $H_{ext}$ (e.g., 840 Oe)

is larger than the switching field $H_{SW}$(down) (e.g., 818 Oe) of the magnetic layer 504-1. Responsive to the external magnetic field $H_{ext}$ (e.g., 840 Oe), the magnetic layer 504-1 switches from the up magnetization to the down magnetization, as illustrated in the transition from (2) to (3). In other words, the switching field of the magnetic layer 504-1 switches from $H_{SW}$(down) 2202 to $H_{SW}$(up) 2204, as illustrated in the transition from (2) to (3). Thus, the first (e.g., initial) defect 2230-1 moves (e.g., propagates) up by one layer. The defect 2230-1 is now associated with the magnetic layers 504-1 and 504-2. The transition from (2) to (3) also shows that when the defect 2230-1 propagates (e.g., upward) by one magnetic layer, the polarity of the defect 2230-1 switches (e.g., reverses). In some implementations, the defect 2230-1 in step (3) is also known as a positive defect because the switching fields of the two respective adjacent magnetic layers are in the upward (e.g., $H_{SW}$(up) 2204)) direction.

At step (3), $H_{ext}$ is reduced (e.g., from 840 Oe to 500 Oe). Since $H_{ext}<H_{SW}$(up)=553 Oe for the magnetic layer 504-2, the $H_{ext}$ (e.g., 500 Oe) causes the magnetic layer 504-2 to flip from the down magnetization direction in (3) to the up magnetization direction in (4). In other words, the switching field of the magnetic layer 504-2 switches from $H_{SW}$(up) 2204 to $H_{SW}$(down) 2202 from step (3) to (4) and is shown in FIG. 22B. The defect 2230-1 moves up again by one magnetic layer and is now associated with the magnetic layers 504-2 and 504-3. The defect 2230-1 switches (e.g., changes) from the positive polarity in (3) to the negative polarity in (4).

Figure 22C:
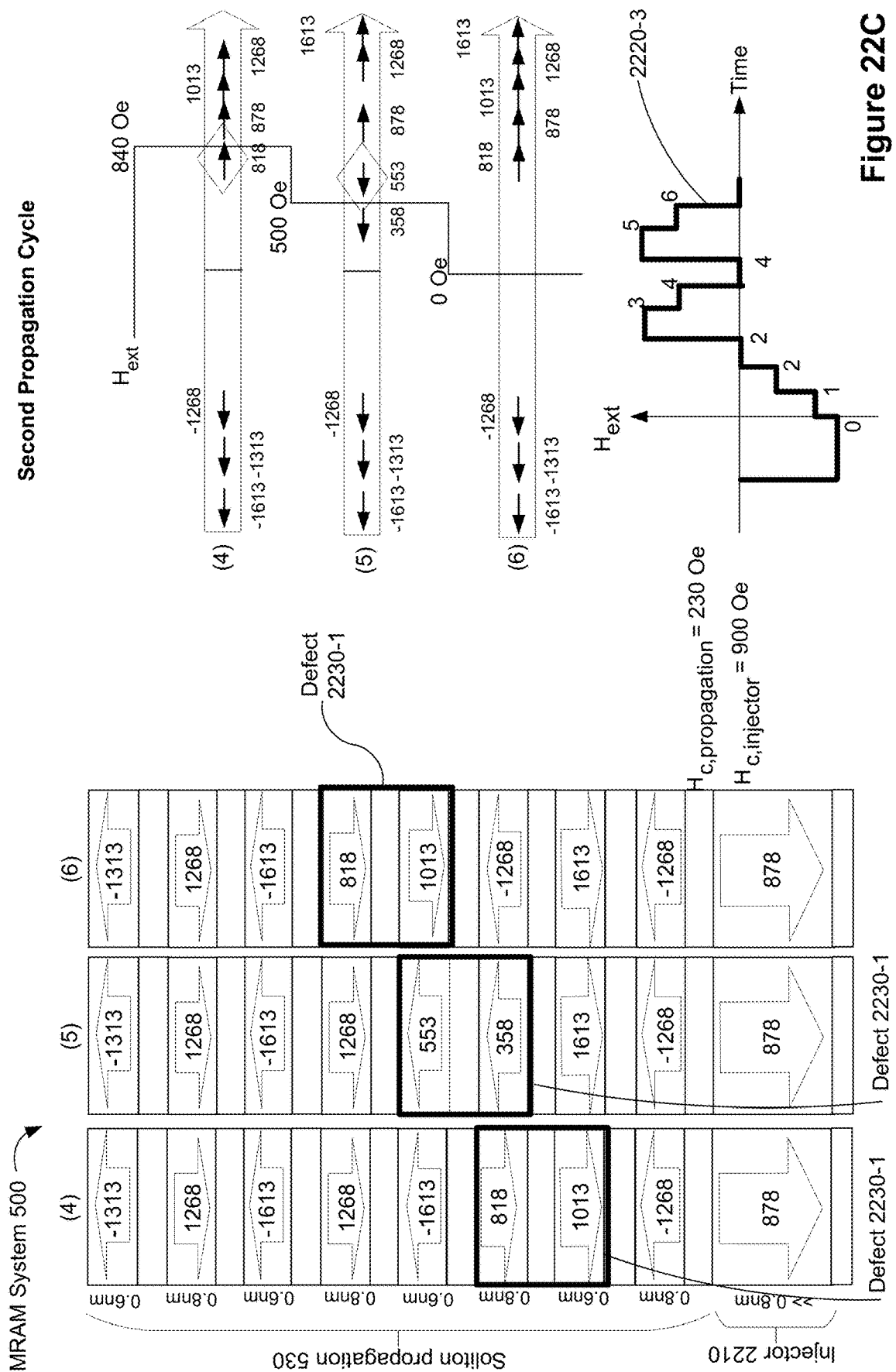

FIG. 22C illustrates the second propagation cycle, in accordance with some implementations. The second propagation cycle includes steps (4), (5), and (6), and is similar to the first propagation cycle as described with respect to FIG. 23. In each of the steps in the second propagation cycle, the defect 2230-1 moves (e.g., propagates) upward in the stack 530 by one layer and the polarity of the defect 2230-1 switches between consecutive steps.

Figure 22D:
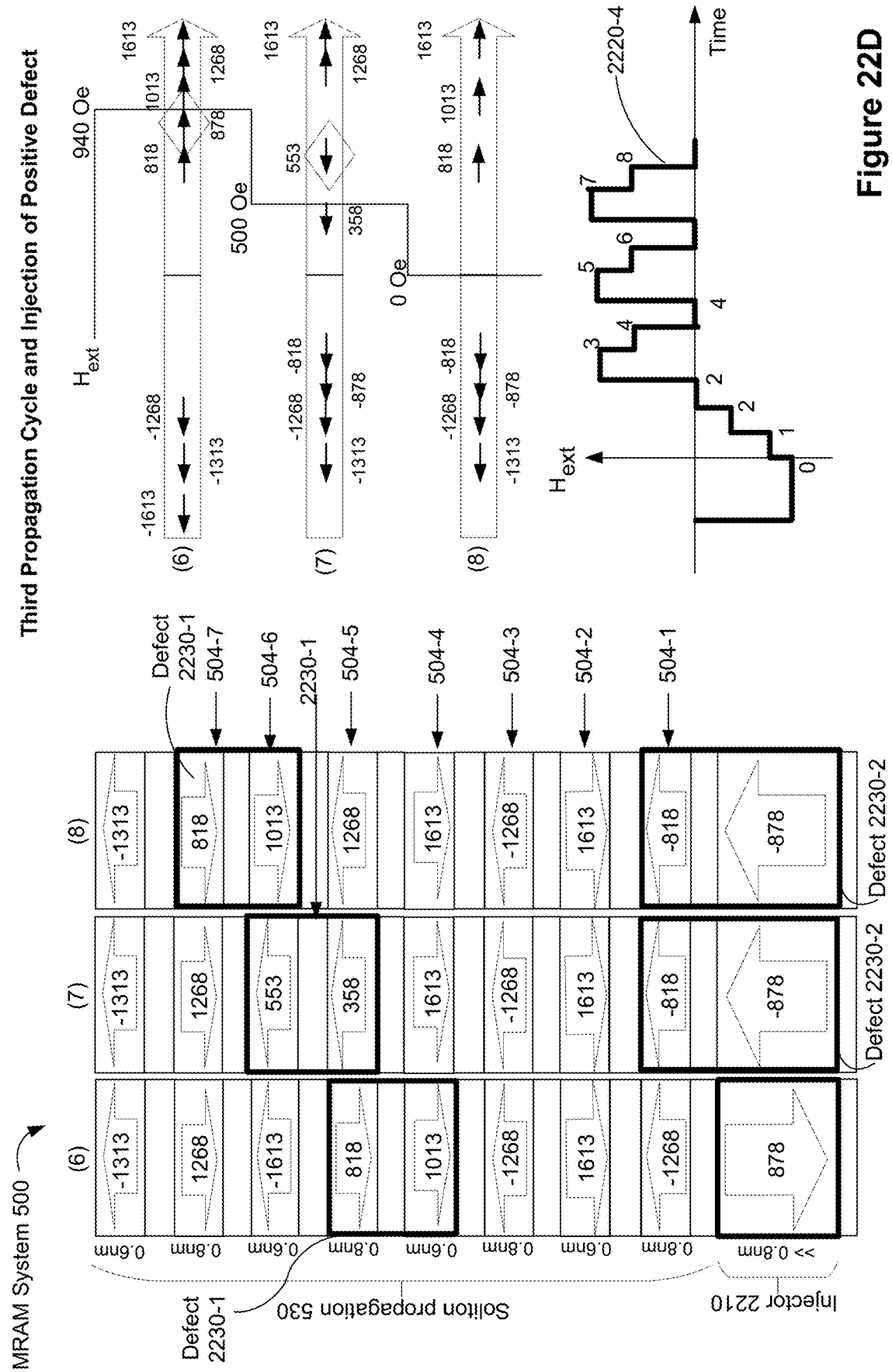

FIG. 22D illustrates the third propagation cycle and the injection of a positive defect, in accordance with some implementations. In some implementations, a new defect 2230-2 (e.g., a second defect) having a polarity that is opposite to the initial defect 2230-1 may be created (e.g., introduced) by applying a predefined external field $H_{ext}$ to cause the injector 2210 to reverse its magnetization direction. In the example of FIG. 22D, an external field $H_{ext}$ of 940 Oe is applied at step (6). Since $H_{ext}>H_{SW}$(down)=878 Oe for the injector 2210 and $H_{ext}>H_{SW}$(down)=818 Oe for the magnetic layer 504-5, the switching field direction of both the injector 2210 and the magnetic layer 504-5 changes from the $H_{SW}$(down) direction 2202 to the $H_{SW}$(up) direction 2204 in the transition from step (6) to (7). As shown in step (7), the second defect 2230-2 with a positive polarity is formed at the adjacent injector layer 2210 and the magnetic layer 504-1. The MRAM system 500 now includes two defects 2230-1 and 2230-2

At step (7), $H_{ext}$=500 Oe is applied to the MRAM system 500. Since $H_{ext}<H_{SW}$(up)=553 Oe for the magnetic layer 504-6, this applied field causes the magnetic layer 504-6 to switch (e.g., reverse) its magnetization direction, as illustrated in the transition from (7) to (8). The initial defect 2230-1 moves (e.g., propagates) upward in the stack 530 by one layer and the polarity of the defect 2230-1 switches from positive in (7) to negative in (8).

Figure 22E:
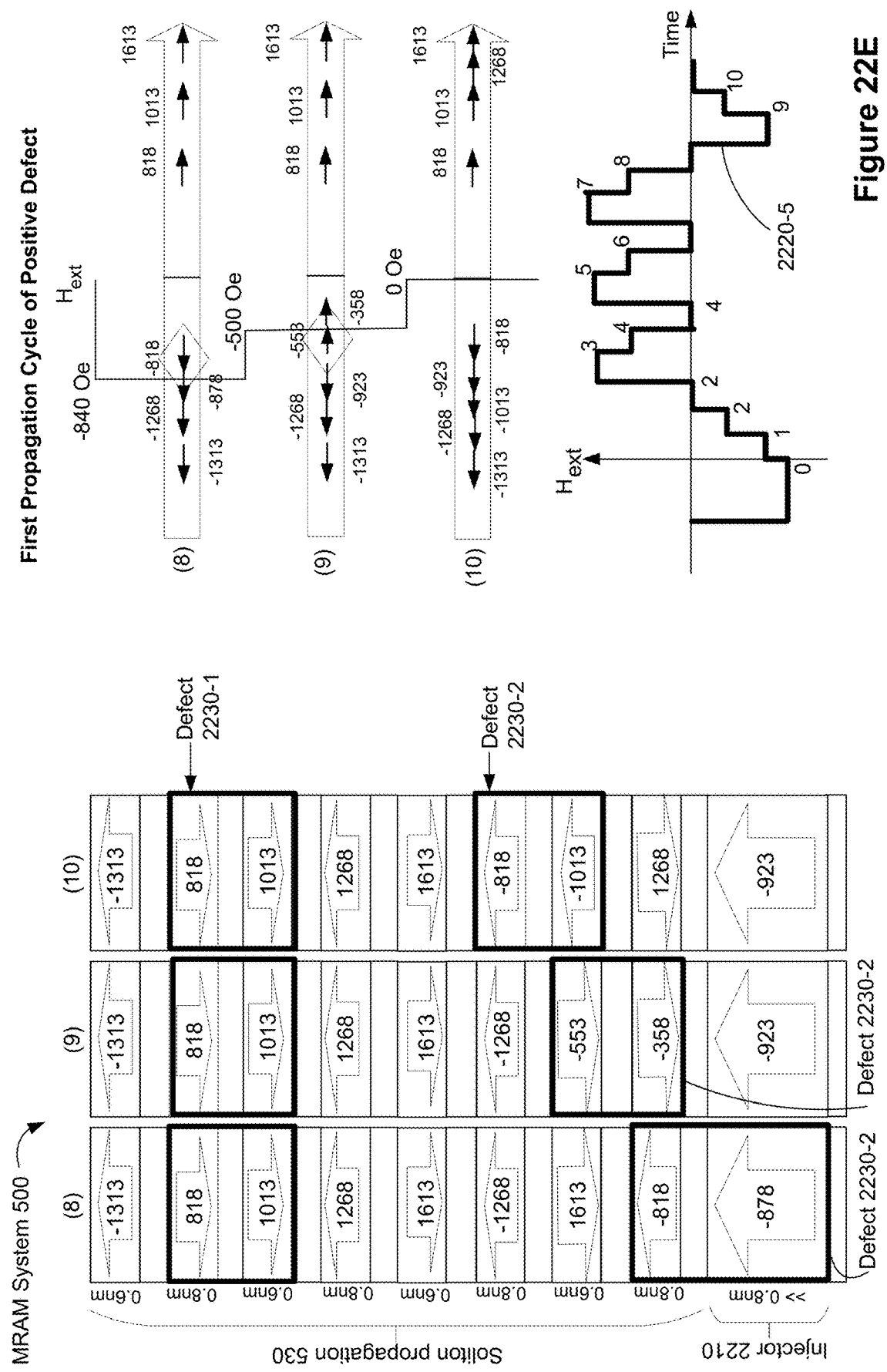

FIG. 22E illustrates the first propagation cycle of the second defect 2230-2 (e.g., the positive defect), in accordance with some implementations. In some implementations and instances, the second defect 2230-2 has a polarity (e.g., sign, or magnetization direction) that is opposite to the initial defect 2230-1. The second defect 2230-2 may be propagated by applying a magnetic field with a polarity that is opposite to the magnetic field that is used to propagate the initial defect 2230-1. In this example, a negative magnetic field ($H_{ext}$=−840 Oe) is applied to the MRAM system 500 at step (8). Because the applied field of −840 Oe<$H_{SW}$(up)=−818 Oe for the magnetic layer 504-1, it causes the magnetic layer 504-1 to switch (e.g., flip) its magnetization direction, as illustrated in the transition from (8) to (9). Accordingly, the second defect 2230-2 moves (e.g., propagates) upward in the stack 530 by one layer and its polarity reverses (e.g., switches) from positive in (8) to negative in (9). At (9), a negative field $H_{ext}$=−500 Oe field is applied. Since −500 Oe>$H_{SW}$(down)=−553 Oe for the magnetic layer 504-2, this applied field causes the magnetic layer 504-2 to switch (e.g., reverse) its magnetization direction, as illustrated in the transition from (9) to (10). Thus, the second defect 2230-2 moves (e.g., propagates) upward in the stack 530 by one layer and its polarity reverses (e.g., switches) from negative in (9) to positive in (10).

As further illustrated in FIG. 22E, the application of the negative magnetic fields to the MRAM system 500 causes only the second (e.g., positive) defect 2230-2 and not the initial defect 2230-1 to move in the stack 530.

In some implementations, the MRAM system 500 comprises multiple first (e.g., negative) defects 2230-1 and multiple second (e.g., positive) defects 2230-2. In some implementations, the applied fields $H_{ext}$ include fields having a first (e.g., positive) polarity and fields having a second (e.g., negative) polarity. In some implementations, the applied fields $H_{ext}$ having the first (e.g., positive) polarity causes propagation of only the first defects 2230-1 and not the second defects 2230-2. In some implementations, the applied fields $H_{ext}$ having the second (e.g., negative) polarity causes propagation of only the second defects 2230-2 and not the first defects 2230-1.

Figure 22F:
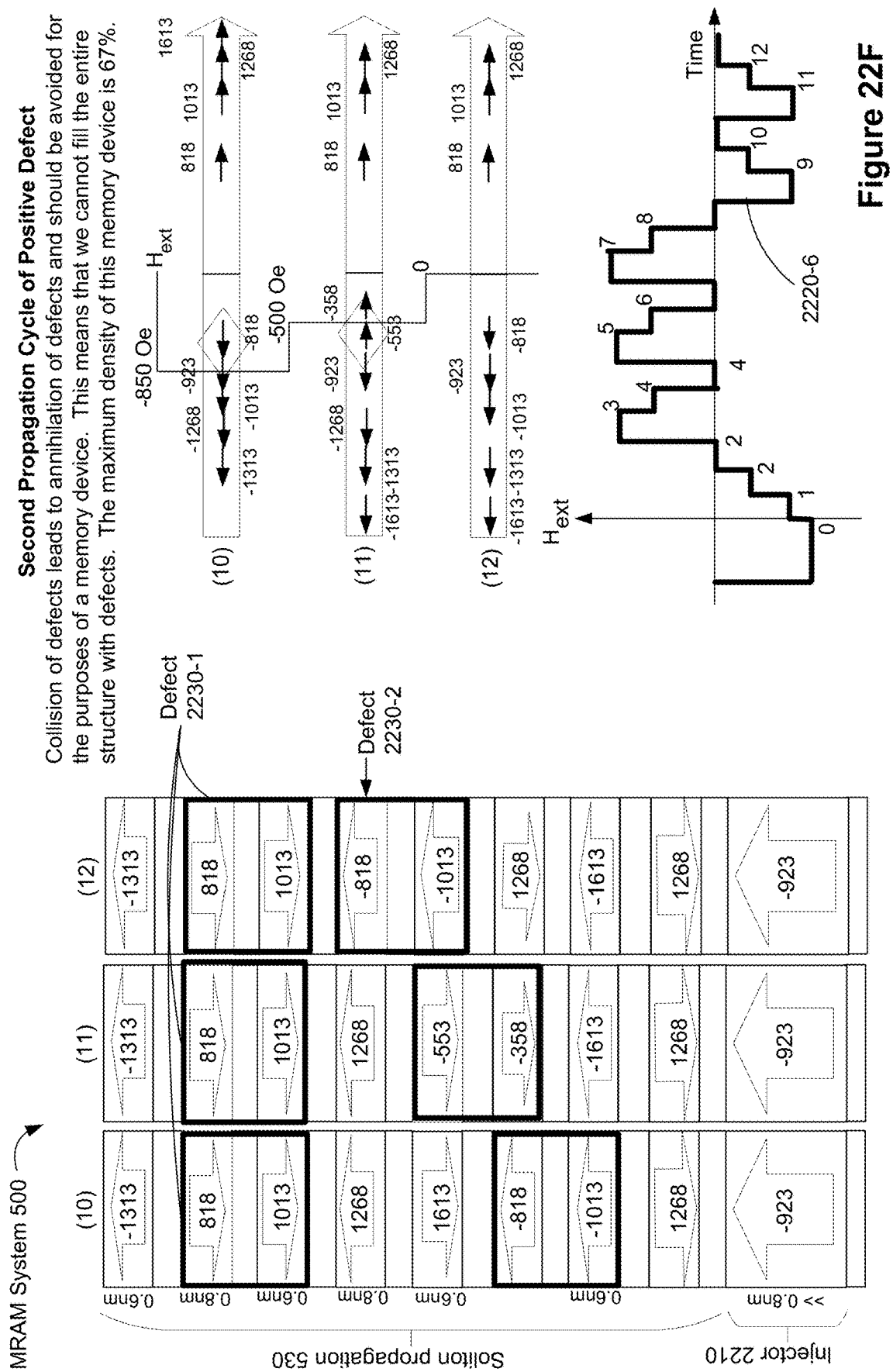

FIG. 22F illustrates the second propagation cycle of the positive defect 2230-2, in accordance with some implementations. In some implementations, the second propagation cycle of the positive defect 2230-2 is similar to the first propagation cycle of the positive defect 2230-2 that is described in FIG. 22E.

In some instances, and as illustrated in step (12) of FIG. 22F, the second defect 2230-2 is adjacent to the first defect 2230-1 in the stack 530 and thus subsequent propagation of the second defect 2230-2 will cause the second defect 2230-1 to collide with the first defect 2230-1. Collision of defects leads to annihilation of defects and should be avoided for the purposes of a memory device. In some implementations, to avoid the collision of defects, one cannot fill the entire MRAM structure 500 with defects. Accordingly, in some implementations, the maximum density of the MRAM device 500 is 67%.

In some implementations, the applied field $H_{ext}$ is a first magnetic pulse train (or magnetic pulse wave) whose shape (e.g., applied field waveform) is represented by the plot 2220 in FIGS. 22A to 22F. That is, the first magnetic pulse train includes, for each of the steps (0) to (12), an applied field of a respective magnitude and an instantaneous magnetic field transition between consecutive steps.

Figure 23A:
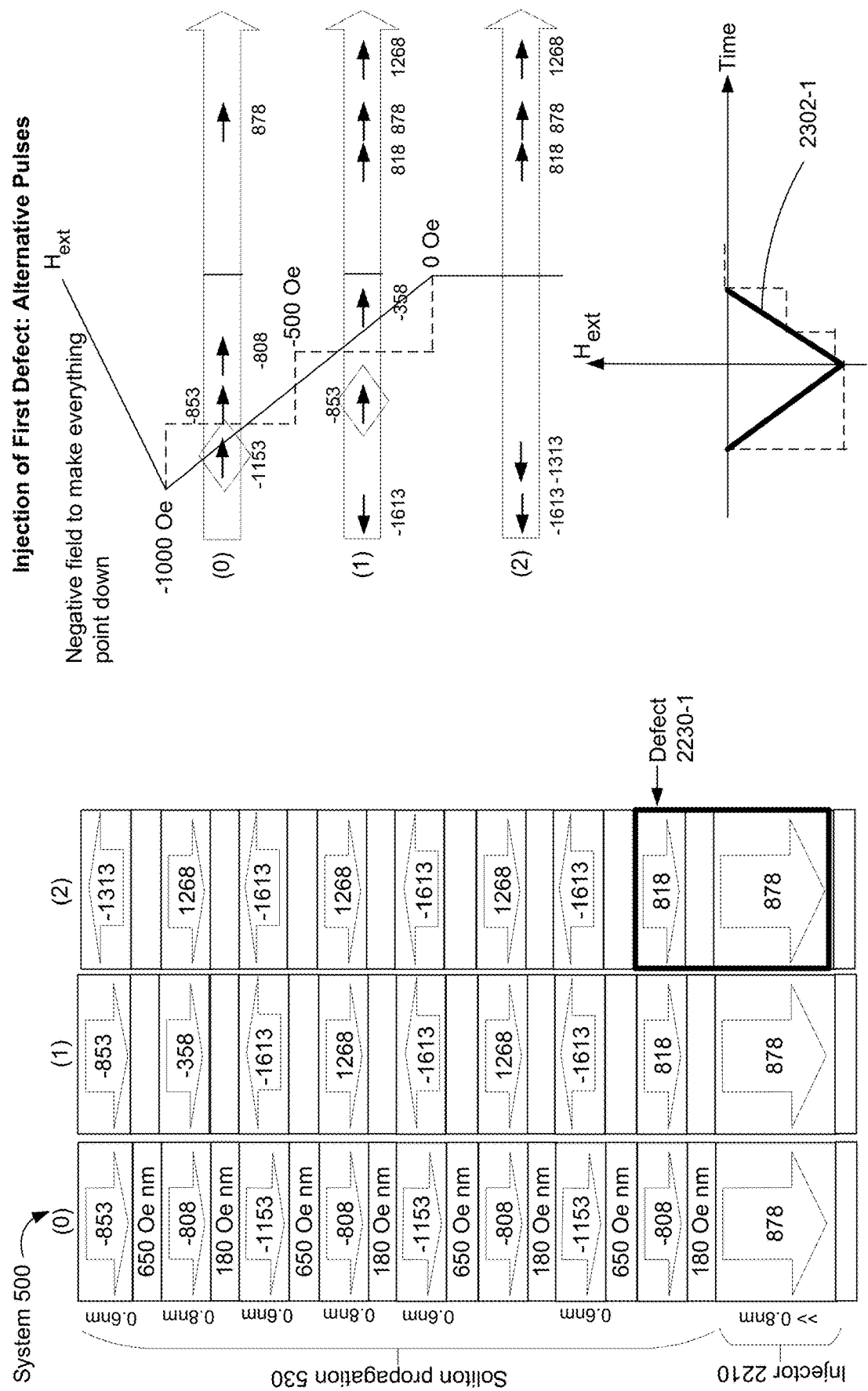

FIGS. 23A and 23B illustrate injection and propagation of defects in a MRAM system using alternative pulses, in accordance with some implementations. FIG. 23A shows the injection (e.g., creation) of the first defect 2230-1 using alternative magnetic pulses to those described in FIG. 22. In some implementations, the defect injection in FIG. 23A is similar the process described in FIG. 22A albeit using a different magnetic pulse train (e.g., waveform). In some implementations, the applied field $H_{ext}$ is a second magnetic pulse train (or magnetic pulse wave) that takes the shape of plot 2302 in FIGS. 23A and 23B. That is, the second magnetic pulse train includes a series of triangular pulses, each triangular pulse having a leading edge and a trailing edge.

In some implementations, the pulses (e.g., magnetic pulses) do not need to have a flat-top shape and/or be piecewise linear. In some implementations, the pulses need to cross specific thresholds (e.g., magnetic field magnitudes) to cause a switch in the magnetization direction of a magnetic layer.

Having described the injection and propagation of magnetic instabilities (e.g., defects) in the MRAM system 500 that includes magnetic layers 504 with perpendicular magnetizations directions, we now turn to specific implementations for the injection and propagation of magnetic instabilities (e.g., defects) for a cylindrical MRAM device (e.g., the MRAM device 600 in FIG. 6).

FIGS. 24A to 24F illustrate the cylindrical MRAM device 2400 that is configured to inject (e.g., create) and propagate one or more magnetic instabilities (e.g., defects) using the Spin Hall Effect (SHE), and the process of injecting and propagating the one or more magnetic instabilities via the SHE, in accordance with some implementations.

In some implementations, the cylindrical MRAM device 2400 is the MRAM device 600 with the addition of an injector 2402 that is configured to inject (e.g., create) one or more magnetic instabilities. The injector 2402 comprises one or more ferromagnetic materials each having a vortex magnetization (e.g., a vortex magnetic ground state) and an associated magnetization direction (e.g., clockwise or counterclockwise).

The MRAM device 2400 includes a non-magnetic and electrically conductive cylindrical core 602 (FIG. 6) that is configured to receive a current. As described above and illustrated in FIG. 24A, the MRAM device 2400 is the MRAM device 600 with the addition of the injector 2402 (or an injector layer). The injector 2402 surrounds the core 602 and is configured to introduce (e.g., create or inject) one or more magnetic instabilities (e.g., defects) into the stack 630. The stack 630 is adjacent to (e.g., contiguous, having a common surface) to the injector 2402. The injector 2402 and the stack 630 are arranged so as to form a vertical structure. As described earlier, the stack 630 also surrounds the cylindrical core 602 and is configured to store information based on a respective position of the one or more magnetic instabilities within the magnetic layers 604. The information is stored in the form of magnetic bits. Magnetic bits can take a '0' or '1' state depending on the magnetization direction of adjacent magnetic layers.

The stack 630 (see also FIG. 6) comprises a plurality of magnetic layers 604 and a plurality of non-magnetic layers 606. Respective magnetic layers of the plurality of magnetic layers 604 are separated by respective non-magnetic layers of the plurality of non-magnetic layers 606. Each of the plurality of magnetic layers 604 has an associated magnetization (e.g., magnetic state) and a respective magnetization direction.

In some implementations, the stack 630 is also referred to as a propagation stack and/or the propagation layer. In some implementations, the stack 630 is also referred to as a ratchet structure as it allows the defect to propagate in only one direction (e.g., is unidirectional).

In some implementations, each of the one or more magnetic instabilities (e.g., defects) is associated with two adjacent magnetic layers having a same (e.g., vortex) magnetization direction.

In some implementations, the MRAM device 2400 further comprises an input terminal coupled to a first end of the cylindrical core 604 (e.g., the input terminal 622, see FIG. 6) and a current source (e.g., the current source 624) coupled to the input terminal. The current source is configured to supply current to the cylindrical core 604 by imparting a Spin Hall Effect (SHE) around the circumference of the cylindrical core 604. The SHE imparted around the circumference of the core 604 contributes to the magnetization of the injector 2402 and the stack 630.

In some implementations, the injector 2402 comprises a single magnetic layer.

In some implementations, the single magnetic layer of the injector 2402 has a height (e.g., thickness) that is larger than respective heights of each of the plurality of magnetic layers 604 in the stack 630.

In some implementations, the injector 2402 comprises a plurality (e.g., two or more) of magnetic layers (not shown). In some implementations, the injector 2402 further includes a plurality of non-magnetic layers, and respective magnetic layers of the plurality of magnetic layers in the injector 2402 are separated by respective non-magnetic layers of the plurality of non-magnetic layers in the injector 2402.

In some implementations, the injector 2402 has a larger magnetic coercivity than each of the plurality of magnetic layers 504 in the stack 630.

In some implementations, the injector 2402 and the stack 630 are annular in shape (e.g., ring-shaped).

In some implementations, the current source of the MRAM device 2400 supplies electrical current (or electrical current pulses) to the MRAM device 2400 to inject and/or propagate one or more magnetic instabilities in the device. Specifically, the supplied/applied currents (or current pulses) 2404 causes switching of magnetization direction in respective magnetic layer(s) of the MRAM device 2400. In some implementations and described later, the current is introduced as a train of current pulses with amplitudes/durations such as to provide sufficient Spin-Hall current to exceed some predetermined current thresholds and enable successive switching of the magnetization of specific layers. In some implementations, typical durations for each pulse in the pulse train are between 1 ns and 100 ns (e.g., on the order of 10 ns). The current amplitudes are expected to be of the order of several 100 µA.

Figure 24A:
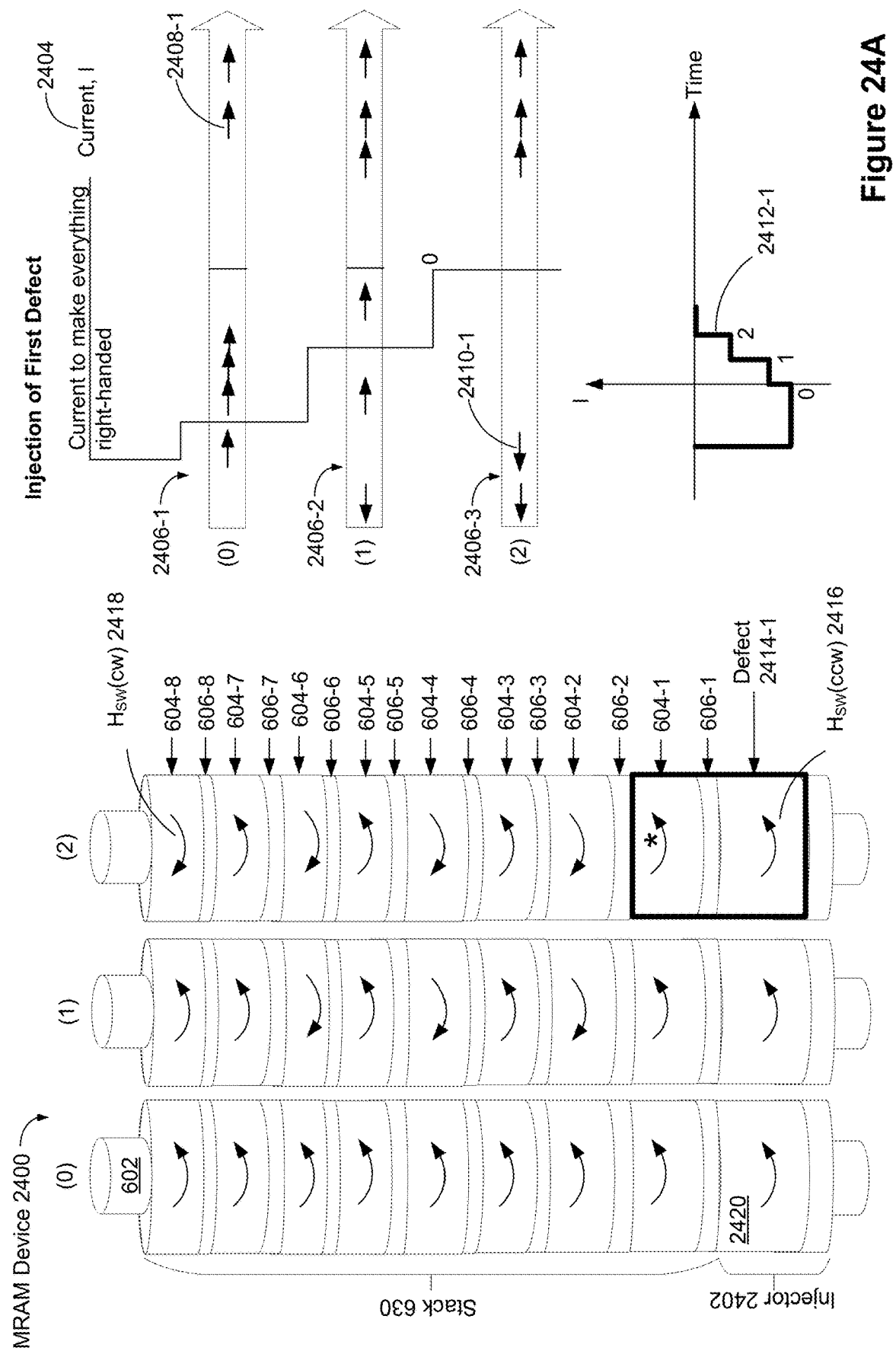

In some implementations and as illustrated in FIGS. 6 and 24A, the injector 2402 has a vortex magnetization (e.g., magnetic ground state) with a counterclockwise (e.g., right-handed) switching field magnetization $H_{SW}(ccw)$ 2416. Each of the plurality of magnetic layers 604 in the stack 630 also has vortex magnetization (e.g., a vortex magnetic state). The plurality of magnetic layers 604 has either the $H_{SW}(ccw)$ 2416 switching field magnetization or a clockwise (e.g., left-handed) switching field magnetization $H_{SW}(cw)$ 2418. It is noted here FIG. 6 shows the actual magnetization directions of the respective magnetic layers 604 in the MRAM device whereas FIG. 24 shows the switching field magnetization direction. That is to say, the actual magnetization directions of the respective magnetic layers 604 in FIG. 24 are in fact opposite to the respective switching field magnetizations (e.g., $H_{SW}(ccw)$ 2416 and $H_{SW}(cw)$ 2418) depicted in FIG. 24.

In accordance with some implementations and referring to FIGS. 24A-24F and 6, a method of operating a magnetic memory is performed at the MRAM device 2400 which includes the cylindrical core 602, the injector 2402, and the stack 630. The injector 2402 includes a first injector magnetic layer 2420 having a first (e.g., vortex) magnetization in a first direction. In the example of FIG. 24A, the first injector magnetic layer 2420 has the counterclockwise switching field $H_{SW}$(ccw) 2416 and accordingly in this instance the first direction is the clockwise direction, since the actual magnetization direction of the injector 2402 is opposite to the switching field direction, as discussed above. In this example the assignment of direction to the magnetic layers is purely arbitrarily, and in other implementations, the first direction may be the counterclockwise direction (i.e., having the clockwise switching field $H_{SW}$(cw) 2418).

The stack 630 includes a first stack magnetic layer 604-1 that is separated from the first injector magnetic layer 2420 by a non-magnetic layer 606-1. In other words, the first stack magnetic layer 604-1 is the magnetic layer in the stack 630 that is closest to the first injector magnetic layer 2420.

In this example, the stack 630 initially includes a first subset of the magnetic layers 604 with the first (e.g., vortex) magnetization in the first direction (e.g., clockwise 610 in FIG. 6) and a second subset of the magnetic layers 604 with the second magnetization in a second direction (e.g., counterclockwise 608 in FIG. 6) opposite to the first direction. Stated another way, the first subset of the magnetic layers 604 has the counterclockwise switching field $H_{SW}$(ccw) 2416 and the second subset of the magnetic layers 604 has the clockwise switching field $H_{SW}$(cw) 2418.

The method includes supplying a sequence of currents coupled to the input terminal 622. The input terminal 622 is in turn coupled to the first end of the cylindrical core 602. The sequence of currents includes a first current (e.g., the current supplied at step (0) of FIG. 24A) and a second current (e.g., the current supplied at step (1) of FIG. 24A) after the first current.

The first current causes switching (e.g., changing) of magnetization direction of the second subset from the second direction (e.g., counterclockwise) to the first direction (e.g., clockwise). Accordingly, the first current causes each of the plurality of the magnetic layers 604 to have the first magnetization direction (e.g., clockwise). Stated another way, the first current causes each of the plurality of the magnetic layers 604 to have the counterclockwise switching field direction $H_{SW}$(ccw) 2416, as illustrated in the schematic of step (0) on the left of FIG. 30.

The second current (supplied at step (1) of FIG. 24A) causes switching of magnetization direction of respective layers of the plurality of magnetic layers 604 the even-numbered magnetic layers 604 in this instance) in such that the stack has an antiferromagnetic configuration, with the first stack magnetic layer 604-1 having the first magnetization direction (e.g., clockwise). Thus, the first injector magnetic layer 2420 and the first stack magnetic layer 604-1 are both magnetized in the first (e.g., clockwise) direction. In other words, the first injector magnetic layer 2420 and the first stack magnetic layer 604-1 both have a counterclockwise switching field $H_{SW}$(ccw) 2416, as illustrated in the schematic of step (2) on the left of FIG. 24A. Thus, the initial (e.g., first) defect 2414-1 is created at the first injector magnetic layer 2420 and the first stack magnetic layer 604-1 which are adjacent magnetic layers. The operation described in steps (1) and (2) should not impact the magnetization direction of the injector 2402.

In some implementations, the first current and the second current have a same polarity. As illustrated in FIG. 24A, the first current and the second current have a negative polarity.

In some implementations, the first current has a larger magnitude than the second current.

In some implementations, each of the first magnetization and the second magnetization is a vortex magnetization (e.g., a vortex magnetic ground state). The first direction is a first rotational direction of the vortex magnetization. The second direction is a second rotational direction of the vortex magnetization opposite to the first rotational direction. In some implementations, the first rotational direction is a clockwise direction and the second rotational direction is a counterclockwise direction. In other implementations, the first rotational direction is a counterclockwise direction and the second rotational direction is a clockwise direction.

In some implementations, the first current imparts a first SHE around the circumference of the cylindrical core 602. The second current imparts a second SHE around the circumference of the cylindrical core 602. Switching of the magnetization direction of the second subset is based at least in part on the first SHE. Switching of the magnetization direction of respective layers of the plurality of magnetic layers 604 is based at least in part on the second SHE.

Here, the key idea is that the Spin Hall electrons must provide sufficient spin torque over a long enough time to overcome the stabilizing effect of the coupling fields and the coercivity of the individual layer. The duration and amplitude of the current pulse are determined from the specific requirements of the MRAM device. In some implementations, the critical switching current (roughly equal to the 1/2 probability switching at the characteristic time-scale of the device) can be estimated using $I_{co}=4e\alpha M_s VH_{SW}/(2\hbar\Theta_{sh})$, where e is the charge of the electron, $\alpha$ is the damping factor, $H_{SW}$ is the switching field calculated above, and $\Theta_{sh}$ is the spin hall angle (amount of spin current generated per electron in the non-magnetic core 602).

Figure 24B:
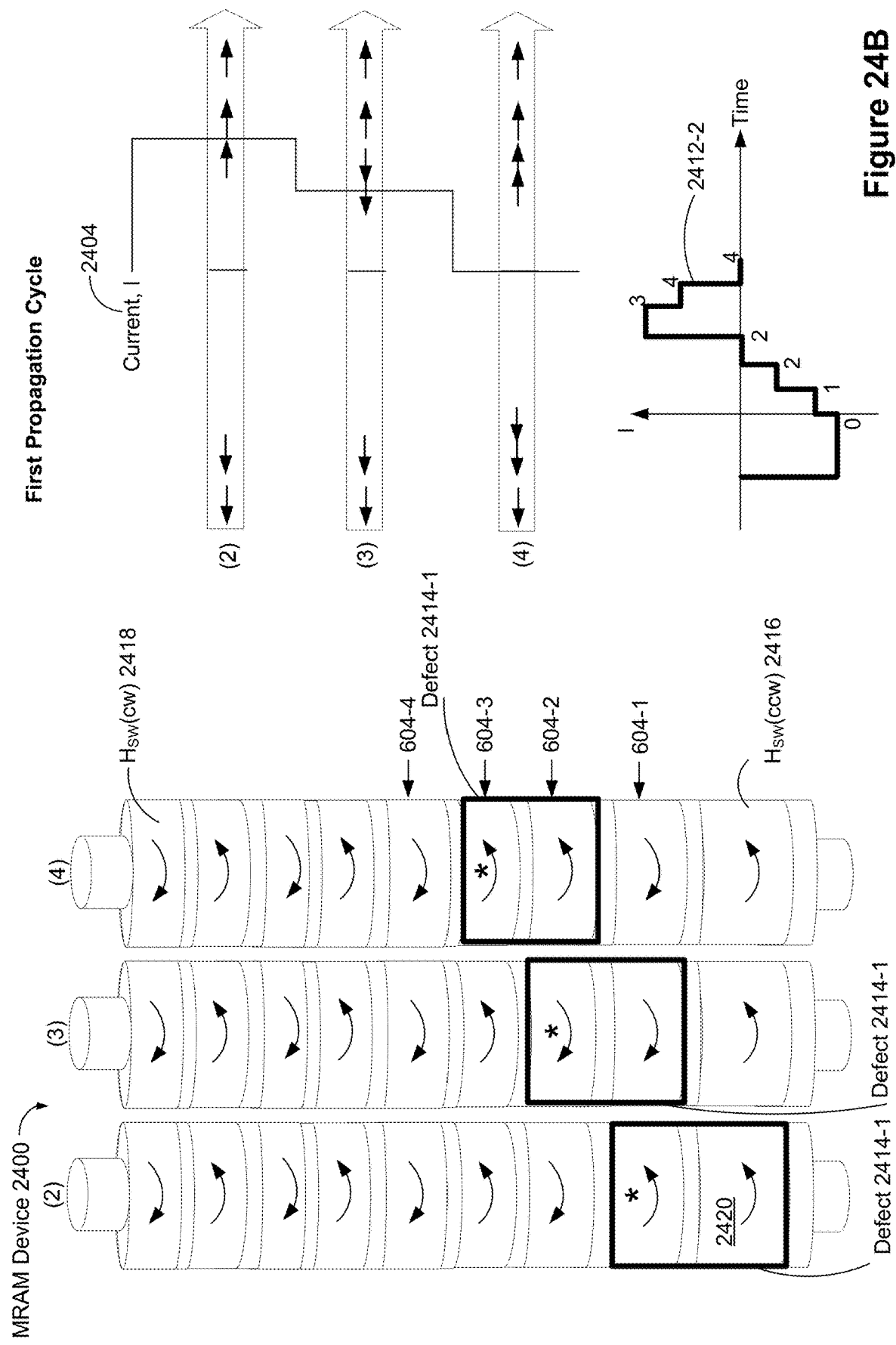

In some implementations and referring to the schematic of step (2) in FIGS. 24A and 24B, the plurality of magnetic layers in the stack 630 includes a second stack magnetic layer 604-2 located between the first stack magnetic layer 604-1 and a third stack magnetic layer 604-3. The first, second, and third stack magnetic layers 604-1, 604-2, and 604-3 are arranged in the antiferromagnetic configuration. Supplying the sequence of currents further comprises supplying a third current (e.g., the current supplied at step (2) in FIG. 24B) after the second current. As illustrated in the transition from step (2) to step (3) in FIG. 24B, the third current causes switching of magnetization direction of the first stack layer 604-1 from the first direction (e.g., clockwise) to the second direction (e.g., counterclockwise). In order words, the third current causes the switching fields of the first stack layer 604-1 to change from $H_{SW}$(ccw) 2416 to $H_{SW}$(cw) 2418. As further illustrated in step (2) of FIG. 24B, when the third current is supplied, the second stack magnetic layer 604-2 preserves (e.g., maintains) its vortex magnetization in the second (e.g., counterclockwise) direction and the third stack magnetic layer 604-3 preserves (e.g., maintains) its vortex magnetization in the first direction (e.g., clockwise). Accordingly, the (third) current that is supplied is capable of switching the orientation (e.g., sign) of the defect 2414-1 without affecting the other non-defect layers.

In some implementations, supplying the sequence of currents further comprises supplying a fourth current (e.g., the current supplied at step (3) in FIG. 24B) after the third current. The fourth current causes switching of magnetization of the second stack magnetic layer 604-2 from the second direction (e.g., counterclockwise) to the first direction (e.g., clockwise) and the fourth magnetic layer preserves (e.g., maintains) the first magnetization in the first direction when the fourth current is supplied.

In some implementations and instances, the fourth current has a smaller magnitude than the third current. This is illustrated in steps (2) and (3) of FIG. 24B.

In some implementations, the sequence of currents is a sequence (e.g., train) of current pulses that includes one or more waveforms. In some implementations, the one or more waveforms include one or more square waveforms illustrated by the square pulses 2412 (FIG. 30) and/or one or more triangle waveforms as illustrated by the triangle pulse 2502 (FIGS. 25A and 25B). Each of first, second, third, and fourth currents is a current pulse having a respective amplitude and/or duration.

In some implementations and instances, the sequence of currents is a sequence (e.g., train) of current pulses. In FIGS. 24A and 24B, each of the first, second, third, and fourth currents is a current pulse that comprises a stepwise (e.g., square, rectangle) function having a respective constant amplitude over a respective predefined time duration. The sequence of current pulses is also depicted in pulses (e.g., plots) 2412 on the bottom right of FIGS. 24A and 24B FIGS. 25A and 25B illustrate injection and propagation of defects in a cylindrical MRAM device using alternative pulses, in accordance with some implementations. In some implementations, the pulses 2412 may not have a flat-top shape, or to be piecewise linear. In some implementations, the pulses 2412 may be designed to cross specific current thresholds that will in turn cause switching of respective magnetization directions in the magnetic layers.

In some implementations and referring to FIGS. 25A and 25B, the third current and the fourth current are part of a current pulse having a leading edge and a trailing edge (e.g., a triangular pulse 2502 in FIGS. 25A and 25B). In some implementations, the third current corresponds to the peak value of the leading edge and the fourth current corresponds to a predefined value of the trailing edge.

In some implementations, the peak value causes the stack 630 to exhibit an unstable state and the predefined value relaxes the stack 630 to a stable state.

In some implementations, each of the amplitudes and/or durations of the current provides a respective Spin Hall current. Each Spin Hall current exceeds a respective predetermined current threshold and enables switching of magnetization of a specific magnetic layer of the plurality of magnetic layers.

In some implementations, the MRAM device 2400 can be generalized as having N magnetic layers, the N magnetic layers including one injector magnetic layer. In other words, the MRAM device 300 includes one injector magnetic layer and (N−1) stack magnetic layers. The method includes, for an $i^{th}$ current in the sequence of currents, causing switching of magnetization of the $(i-2)^{th}$ magnetic layer of the N magnetic layers, wherein i is a positive integer from 3 to (N+2). In some implementations, provided there is only one defect of this kind that we are trying to propagate, the $i^{th}$ current in the sequence of currents causing switching of magnetization of the $(i-2)^{th}$ magnetic layer of the N magnetic layers while preserving (e.g., maintaining) magnetizations in the respective directions for other magnetic layers of the N magnetic layers.

Figure 24C:
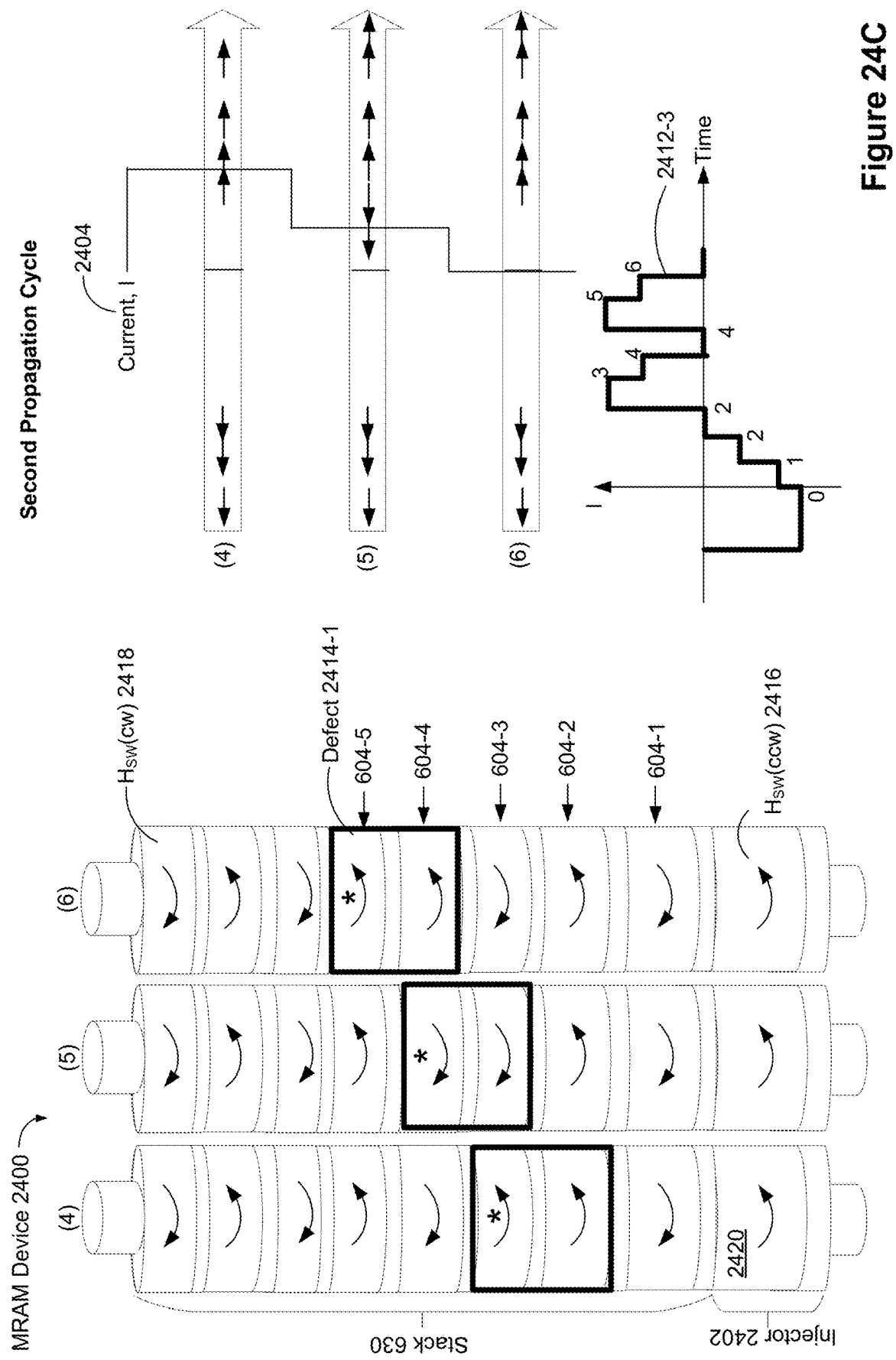

FIG. 24C illustrates the MRAM device 2400 with one defect (e.g., the first defect 2414-1) already present in the stack 630. In other words, the plurality of magnetic layers 604 in the stack 630 is arranged in an antiferromagnetic configuration except for a first pair of adjacent magnetic layers of the plurality of magnetic layers 604. In this instance, the first pair of adjacent magnetic layers is formed by the second stack magnetic layer 604-2 and the third stack magnetic layer 604-3. The first pair has magnetization in the first (e.g., clockwise) direction.

In accordance with some implementations, and as illustrated in FIG. 24C, a method of propagating information in a magnetic memory comprises supplying a sequence of currents to the input terminal 622 at the first end of the cylindrical core 602. The sequence of currents includes a current (e.g., a current with having a magnitude) that is supplied at step (4) and another current that is supplied at step (5) (e.g., a current with having another magnitude). The current at step (4) causes a first member (e.g., the third stack magnetic layer 604-3) in the first pair to switch from the first direction (e.g., clockwise) to a second direction (e.g., counterclockwise) opposite to the first direction, as illustrated in the transition from (4) to (5), thereby resulting in a second pair of adjacent stack magnetic layers of the plurality of magnetic layers having magnetization in the second (e.g., counterclockwise) direction. In this instance, the second pair of adjacent stack magnetic layers is the third stack magnetic layer 604-3 and the fourth stack magnetic layer 604-4. The second pair includes the first member of the first pair (e.g., the third stack magnetic layer 604-3).

The current that is supplied in step (5) causes a first member in the second pair (in this instance the fourth stack magnetic layer 604-4) to switch from the second direction (e.g., counterclockwise) to the first direction (e.g., clockwise), thereby resulting in a third pair of adjacent magnetic layers 604-4 and 604-5 of the plurality of magnetic layers having magnetization in the first direction (e.g., clockwise). In this instance, the third pair of adjacent magnetic layers is the fourth stack magnetic layer 604-4 and the fifth stack magnetic layer 604-5. The third pair includes the first member of the second pair (e.g., the fourth stack magnetic layer 604-4). The first member of the first pair (e.g., 604-3) is distinct from the first member of the second pair (e.g., 604-4).

Figure 24D:
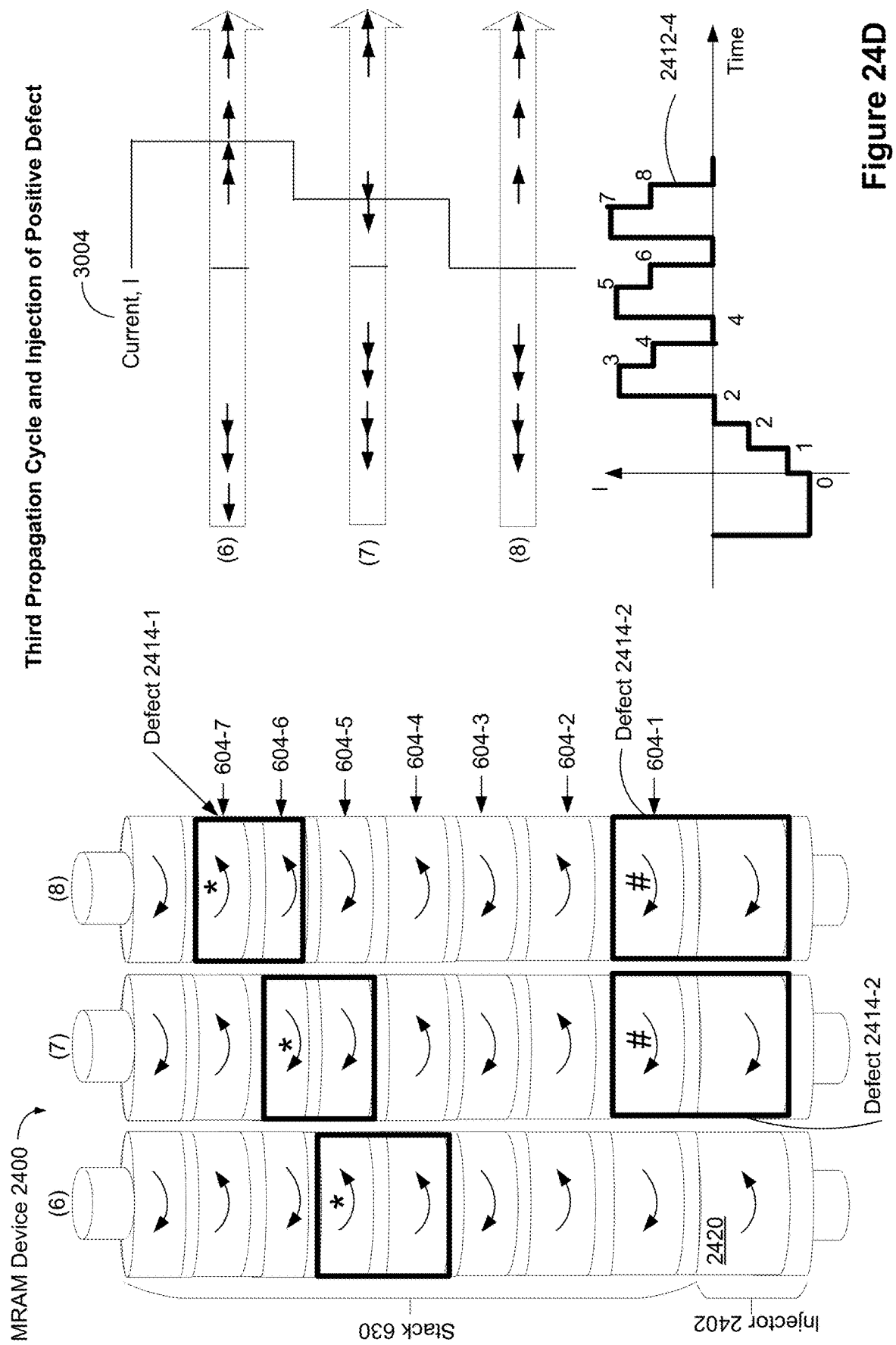

In some implementations, the injector 2402 is configured to introduce multiple defects (e.g., magnetic instabilities) to the structure (e.g., stack 630). In some implementations, there are two distinct types of defects depending on the magnetization direction (or the switching field direction) of the injector 2402 at the time of the injection. In some implementations, these defects are identified has a positive ("+") defect or a negative ("−") defect. In some implementations, defects in the structure alternate between the "+" and "−" signs so we can refer to them as "defects" since the sign of each be deduced from the previous one In some implementations, a new defect (e.g., a second defect 2414-2) may be introduced into the MRAM device 2400 while the first defect is already present in the stack 630. As depicted in FIG. 24D, the new defect 2414-2 is injected by supplying a fifth current (at step (6) in FIG. 24D) after the fourth current (at step (5)) in the sequence of currents. The fifth current causes switching of magnetization direction of the first injector magnetic layer 2420 from the first (e.g., clockwise) direction to the second (e.g., counterclockwise) direction, as illustrated in the transition from (6) to (7) in FIG. 24D. Thus, both the first injector magnetic layer 2420 and the first stack magnetic layer 604-1 are now magnetized in the second (e.g., counterclockwise) direction. In other words, the first injector magnetic layer 2420 and the first stack magnetic layer 604-1 both have the clockwise switching fields $H_{SW}(cw)$ 2418. In some implementations, the second defect 2412-1 that is introduced has a sign (or polarity) that is opposite to the sign of the first defect 2412-1 when the first defect 2412-1 was introduced.

In accordance with some implementations, defects with different signs (e.g., "+" and "−") can be propagated in the stack 630. In some implementations, the first current and the second current, at steps (0) and (1) in FIG. 24A, are part of a first current pulse having a first polarity (e.g., a negative polarity). The magnetic layers further comprise a fourth pair of adjacent magnetic layers having magnetization in the second (e.g., counterclockwise) direction. The method further comprises supplying a second current pulse having a second polarity (e.g., a positive polarity) opposite to the first polarity. The second current pulse includes a third current. The third current causes a first member in the fourth pair of adjacent magnetic layers to switch from the second direction to the first direction, thereby resulting in a fifth pair of adjacent magnetic layers of the plurality of magnetic layers having magnetization in the first direction, wherein the fifth pair includes the first member of the fourth pair; and the fourth current causes a first member in the fifth pair of adjacent magnetic layers to switch from the first direction to the second direction, thereby resulting in a fifth pair of adjacent magnetic layers of the plurality of magnetic layers having magnetization in the second direction. The fifth pair includes the first member of the fourth pair, and the first member of the fourth pair is distinct from the first member of the fifth pair.

In some implementations, the stack 630 includes more than one pair of adjacent magnetic layers having the first sign and more than one pair of adjacent magnetic layers having the second sign. In other words, the first pair is one of a plurality of first pairs and the fourth pair is one of a plurality of fourth pairs. In some implementations, the method further comprises: responsive to the first current, causing each of the first members in the plurality of first pairs of adjacent magnetic layers to switch from the first direction to the second direction; responsive to the second current, causing each of the first members in the second pairs of adjacent magnetic layers to switch from the second direction to the first direction opposite to the first direction; responsive to the third current, causing each of the first members in the plurality of fourth pairs of adjacent magnetic layers to switch from the second direction to the first direction; and responsive to the fourth current, causing each of the first members in the plurality of fifth pairs of adjacent magnetic layers to switch from the second direction to the first direction.

Although some of various drawings illustrate a number of logical stages in a particular order, stages that are not order-dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first MRAM device could be termed a second MRAM device, and, similarly, a second MRAM device could be termed a first MRAM device, without departing from the scope of the various described implementations. The first MRAM device and the second electronic device are both MRAM devices, but they are not the same type of MRAM device.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A magnetic memory device comprising:
   a non-magnetic cylindrical core configured to receive a current;
   a first portion surrounding the cylindrical core, the first portion configured to introduce one or more magnetic instabilities into a second portion, the second portion adjacent to the first portion and arranged in a stack with respect to the first portion; and
   the second portion also surrounding the cylindrical core and configured to store information based on a respective position of the one or more magnetic instabilities, wherein:
   the second portion comprises a first plurality of magnetic layers and a first plurality of non-magnetic layers; and
   respective magnetic layers of the first plurality of magnetic layers are separated by respective non-magnetic layers of the first plurality of non-magnetic layers.

2. The device of claim 1, wherein each of the one or more magnetic instabilities is associated with two adjacent magnetic layers having a same magnetization direction.

3. The device of claim 1, further comprising:
   an input terminal coupled to a first end of the cylindrical core; and a current source, coupled to the input terminal, the current source configured to supply current to the cylindrical core by imparting a Spin Hall Effect (SHE) around a circumference of the cylindrical core, wherein the SHE imparted around a circumference of the cylindrical core contributes to magnetization of the first portion and the second portion.

4. The device of claim 3, further comprising an output terminal coupled to a second end of the cylindrical core opposite to the first end, the output terminal being configured to provide a current readout to a third portion of the magnetic memory device.

5. The device of claim 4, wherein the third portion is coaxial with the cylindrical core and surrounds a region of the second portion, and wherein the third portion includes:
a concentric spacer layer that surrounds at least one magnetic layer of the first plurality of magnetic layers;
a ferromagnetic layer surrounding the concentric spacer layer; and
a third terminal connected to the ferromagnetic layer and configured to close a readout circuit with the output terminal.

6. The device of claim 4, wherein the third portion is a first one of a plurality of third portions, each of the plurality of third portions surrounding a respective region of the second portion.

7. The device of claim 5, wherein the spacer layer is composed of a dielectric material.

8. The device of claim 1, wherein the first portion comprises a single magnetic layer.

9. The device of claim 1, wherein the first portion comprises a second plurality of magnetic layers.

10. The device of claim 9, wherein the first portion further includes a second plurality of non-magnetic layers; and respective magnetic layers of the second plurality of magnetic layers are separated by respective non-magnetic layers of the second plurality of non-magnetic layers.

11. A method of operating a magnetic memory, comprising:
at a magnetic memory device including:
a cylindrical core;
a first portion surrounding the cylindrical core, the first portion including a first magnetic layer having a first magnetization in a first direction; and
a second portion adjacent to the first portion and arranged in a stack with respect to the first portion, wherein:
the second portion includes a plurality of magnetic layers and a plurality of non-magnetic layers;
the plurality of magnetic layers includes a second magnetic layer that is separated from the first magnetic layer by a non-magnetic layer;
the plurality of magnetic layers includes a first subset having the first magnetization in the first direction and a second subset having a second magnetization in a second direction opposite to the first direction; and
respective magnetic layers of the plurality of magnetic layers are separated by respective non-magnetic layers of the plurality of non-magnetic layers; and
the method including:
supplying a sequence of currents to an input terminal at a first end of the cylindrical core, the sequence of currents including a first current and a second current after the first current, wherein:
the first current causes switching of magnetization direction of the second subset from the second direction to the first direction; and
the second current causes switching of magnetization direction of respective layers of the plurality of magnetic layers such that the second portion has an antiferromagnetic configuration with the second magnetic layer having the first direction.

12. The method of claim 11, wherein the first current has a larger magnitude than the second current.

13. The method of claim 11, wherein:
each of the first magnetization and the second magnetization is a vortex magnetization;
the first direction is a first rotational direction of the vortex magnetization; and
the second direction is a second rotational direction of the vortex magnetization opposite to the first rotational direction.

14. The method of claim 11, wherein:
the first current imparts a first Spin Hall Effect (SHE) around a circumference of the cylindrical core;
the second current imparts a second SHE around the circumference of the cylindrical core;
switching of the magnetization direction of the second subset is based at least in part on the first SHE; and
switching of the magnetization direction of the respective layers of the plurality of magnetic layers is based at least in part on the second SHE.

15. The method of claim 11, wherein:
the plurality of magnetic layers includes a third magnetic layer between the second magnetic layer and a fourth magnetic layer;
the second, third, and fourth magnetic layers are arranged in the antiferromagnetic configuration; and
supplying the sequence of currents further comprises supplying a third current after the second current, wherein:
the third current causes switching of magnetization direction of the second magnetic layer from the first direction to the second direction;
the third magnetic layer preserves the second magnetization in the second direction when the third current is supplied; and
the fourth magnetic layer preserves the first magnetization in the first direction when the third current is supplied.

16. The method of claim 15, wherein supplying the sequence of currents further comprises supplying a fourth current after the third current, wherein the fourth current causes switching of magnetization of the third magnetic layer from the second direction to the first direction and the fourth magnetic layer preserves the first magnetization in the first direction when the fourth current is supplied.

17. The method of claim 16, wherein the sequence of currents is a sequence of current pulses; each of the first, second, third, and fourth currents is a current pulse having a respective amplitude and/or duration.

18. The method of claim 17, wherein:
each of the amplitudes and/or durations provides a respective Spin Hall current;
each Spin Hall current exceeds a respective predetermined current threshold and enables switching of magnetization of a specific magnetic layer of the plurality of magnetic layers.

19. The method of claim 16, wherein supplying the sequence of currents further comprises supplying a fifth current after the fourth current, wherein the fifth current causes switching of magnetization direction of the first magnetic layer from the first direction to the second direction, thereby resulting in both the first magnetic layer and the second magnetic layer to be magnetized in the second direction.

20. The method of claim 16, wherein the third current and the fourth current are part of a current pulse having a leading edge and a trailing edge, the third current corresponds to a peak value of the leading edge and the fourth current corresponds to a predefined value of the trailing edge.

* * * * *